United States Patent [19]

Mitchell

[11] 4,355,306
[45] Oct. 19, 1982

[54] DYNAMIC STACK DATA COMPRESSION AND DECOMPRESSION SYSTEM

[75] Inventor: Joan L. Mitchell, Ossining, N.Y.

[73] Assignee: International Business Machines Corporation, Armonk, N.Y.

[21] Appl. No.: 230,224

[22] Filed: Jan. 30, 1981

[51] Int. Cl.³ .......................................... H03K 13/24
[52] U.S. Cl. ............................. 340/347 DD; 358/260; 364/900; 364/515
[58] Field of Search .................. 364/200, 900, 515; 340/347 DD; 235/310, 311; 358/260, 261

[56] References Cited

U.S. PATENT DOCUMENTS

| | | | |
|---|---|---|---|
| T985,005 | 8/1979 | Goertzel | 364/200 |
| 3,694,813 | 9/1972 | Loh | 364/200 |
| 3,701,108 | 10/1972 | Loh | 340/347 DD |
| 3,828,319 | 8/1972 | Owen et al. | 340/172.5 |
| 3,833,900 | 9/1974 | Bahl | 340/347 DD |
| 3,878,513 | 2/1972 | Werner | 340/172.5 |
| 3,916,385 | 12/1973 | Parmar et al. | 340/172.5 |
| 3,958,228 | 3/1975 | Coombes et al. | 340/172.5 |
| 3,967,247 | 11/1974 | Andersen et al. | 340/172.5 |
| 4,029,947 | 5/1973 | Evans et al. | 235/151 |
| 4,121,258 | 11/1976 | Nakagome et al. | 358/260 |
| 4,258,392 | 3/1981 | Yamazahi | 358/260 |

OTHER PUBLICATIONS

Felt, "Data Compression Techniques Using Adaptive Translation—Permutation Codes", Doctor of Philosophy Thesis at Washington State University, 1974.

*Primary Examiner*—Charles D. Miller
*Attorney, Agent, or Firm*—Victor Siber; George E. Clark

[57] ABSTRACT

A system for encoding images by assigning variable-length code words to fixed positions in a dynamic stack. Each position in the dynamic stack is occupied by a representation of an encodable image feature, such as a run-length or a vertical correlation. These codes are arranged in order of their respective frequencies of occurrence. The order in which these features are stacked is varied dynamically by the system, in accordance with their respective frequencies of occurrence and a predetermined scheme. Thus, the system can adapt to different types of documents being scanned, or to changes of scanning resolution. A relationship exists between the code words and the stack positions, which are not permanently assigned to specific image features. This arrangement ensures that the lengths of code words will be inversely related to their frequencies of occurrence under all conditions.

11 Claims, 44 Drawing Figures

ENCODER

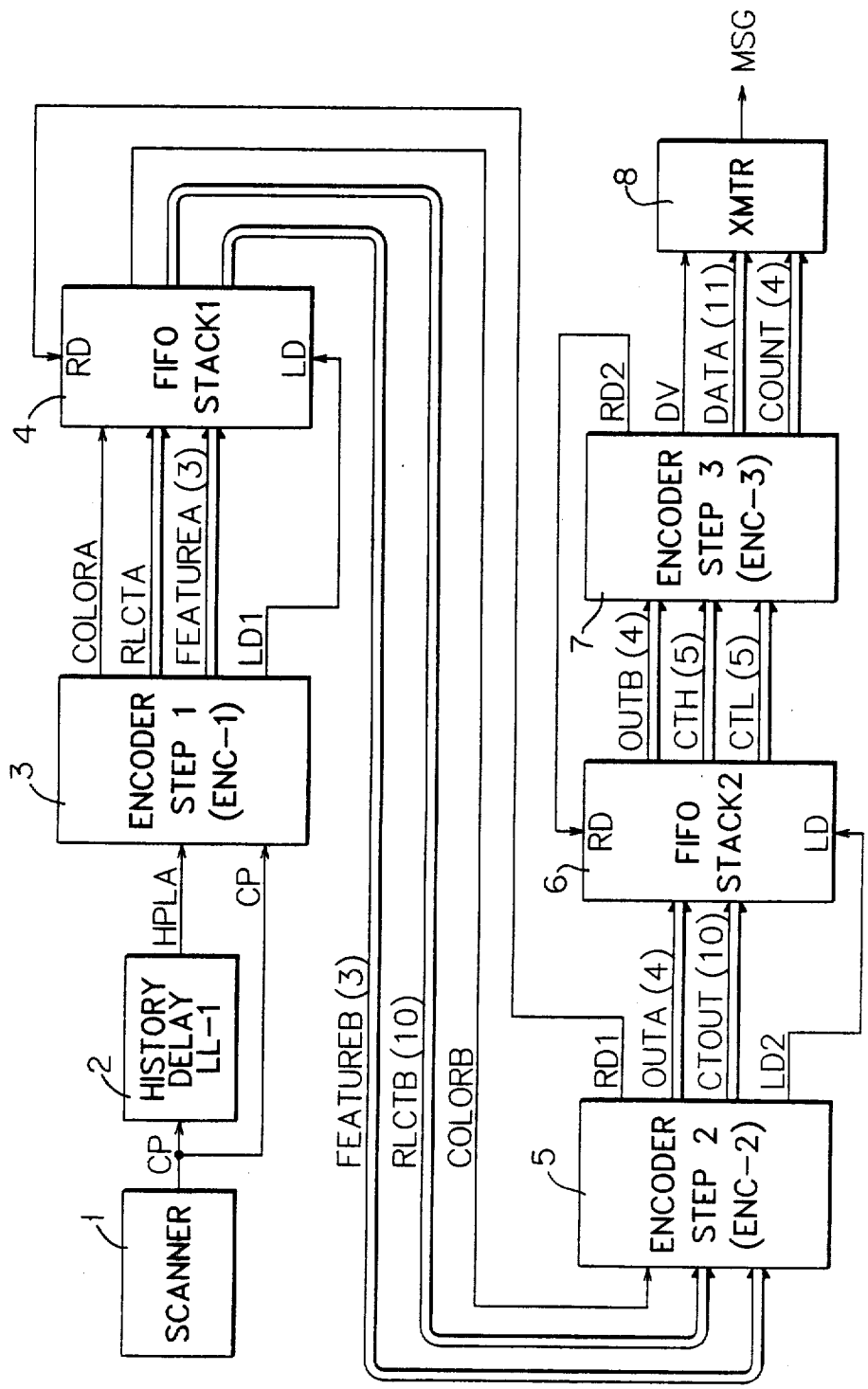
FIG. 1  ENCODER

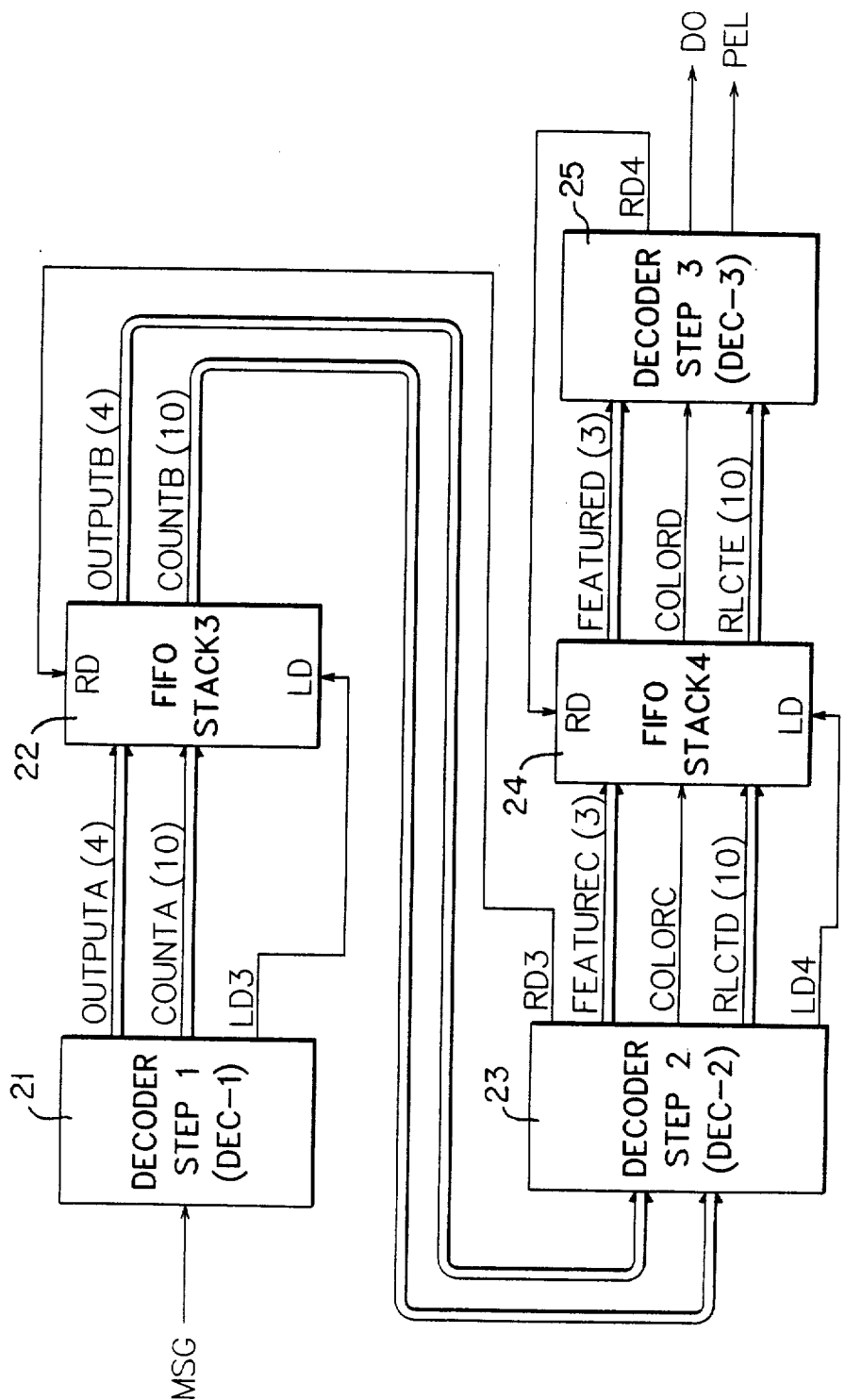
FIG. 2 DECODER

FIG. 3.1 Four lines of five pels each.

FIG. 3.2 Continuous pel stream.

INPUTS TO ENCODER STEP 1

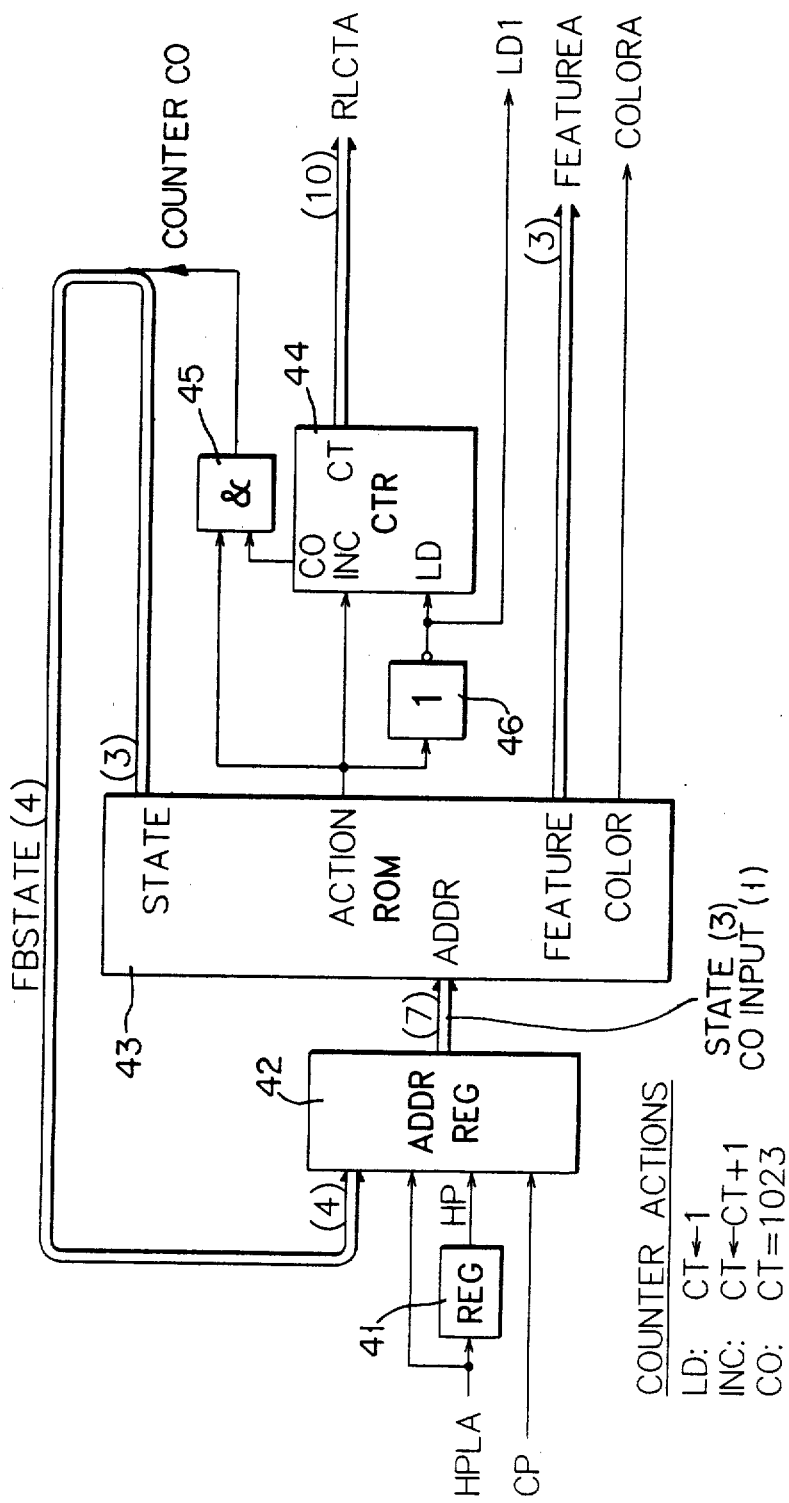
FIG. 4 ENCODER STEP 1

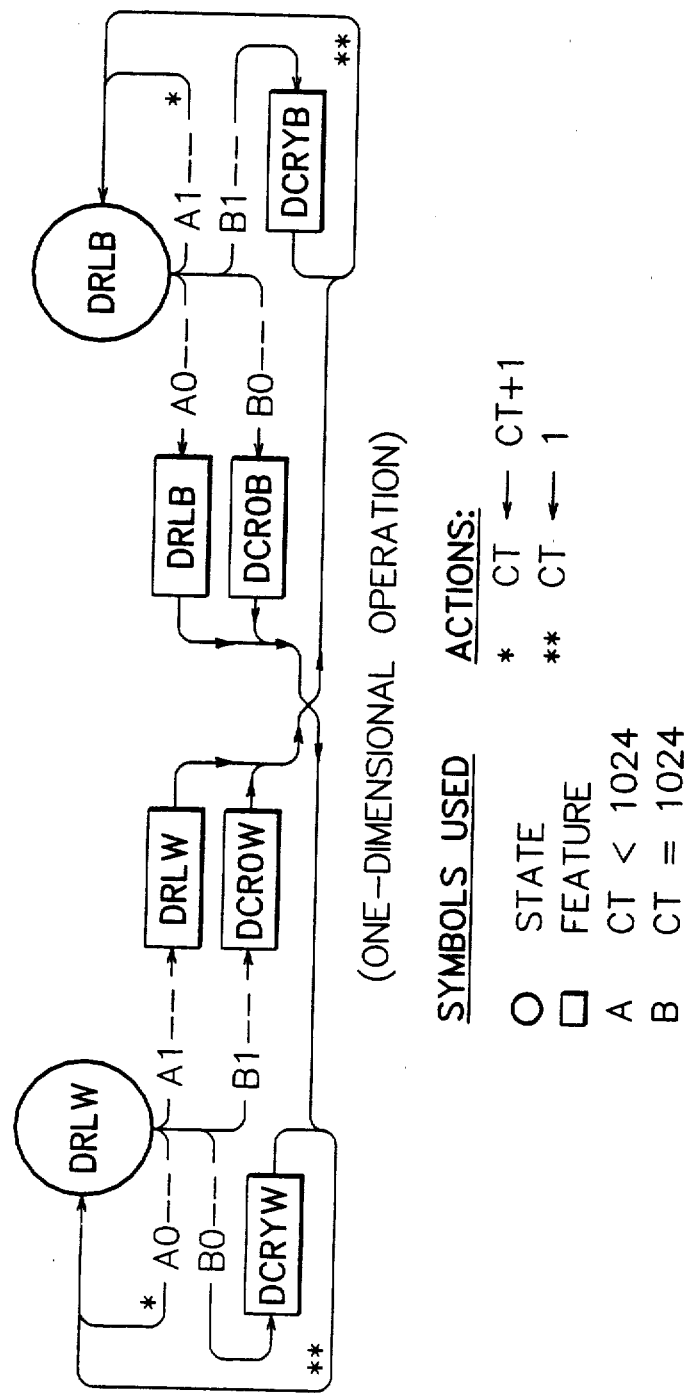
FIG. 5.1 STATE DIAGRAM FOR ENCODER STEP 1

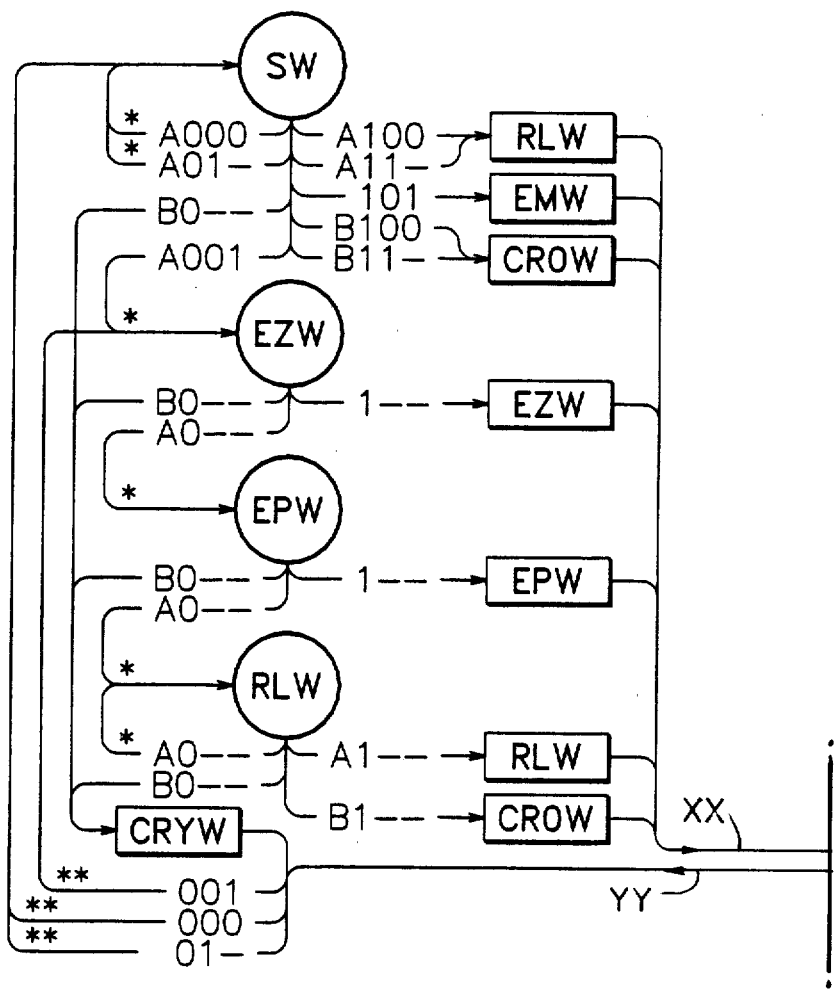
FIG. 5.2  (TWO-DIMENSIONAL OPERATION)
STATE DIAGRAM FOR ENCODER STEP 1

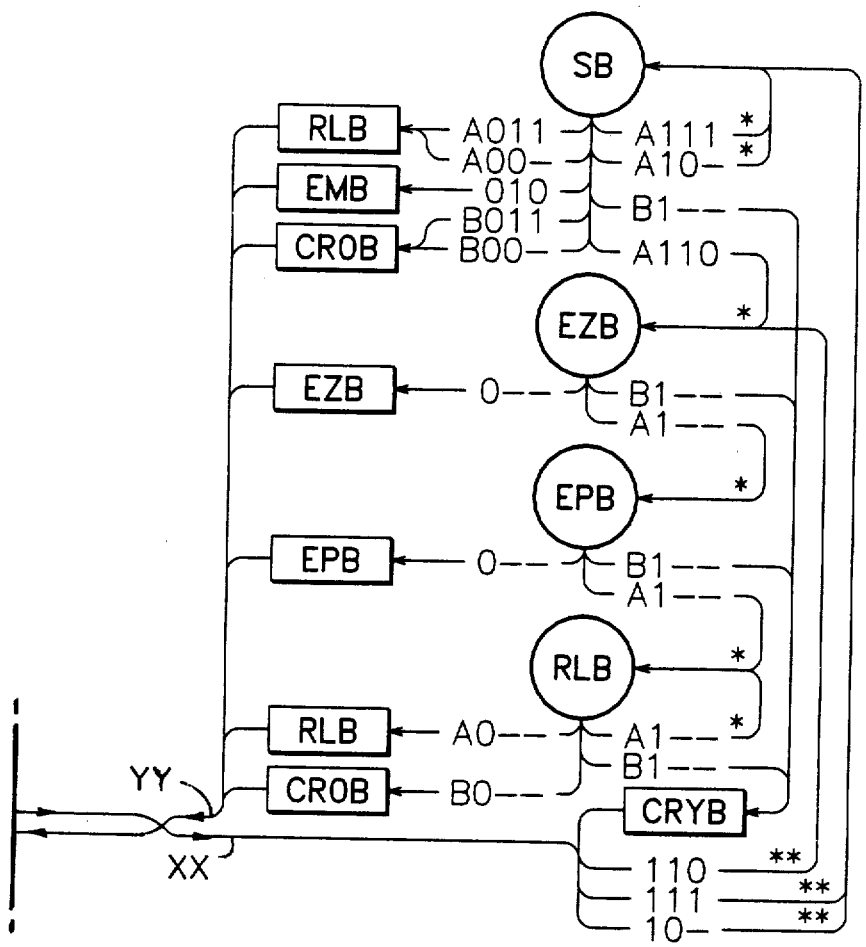
FIG. 5.3 (TWO-DIMENSIONAL OPERATION)
STATE DIAGRAM FOR ENCODER STEP 1

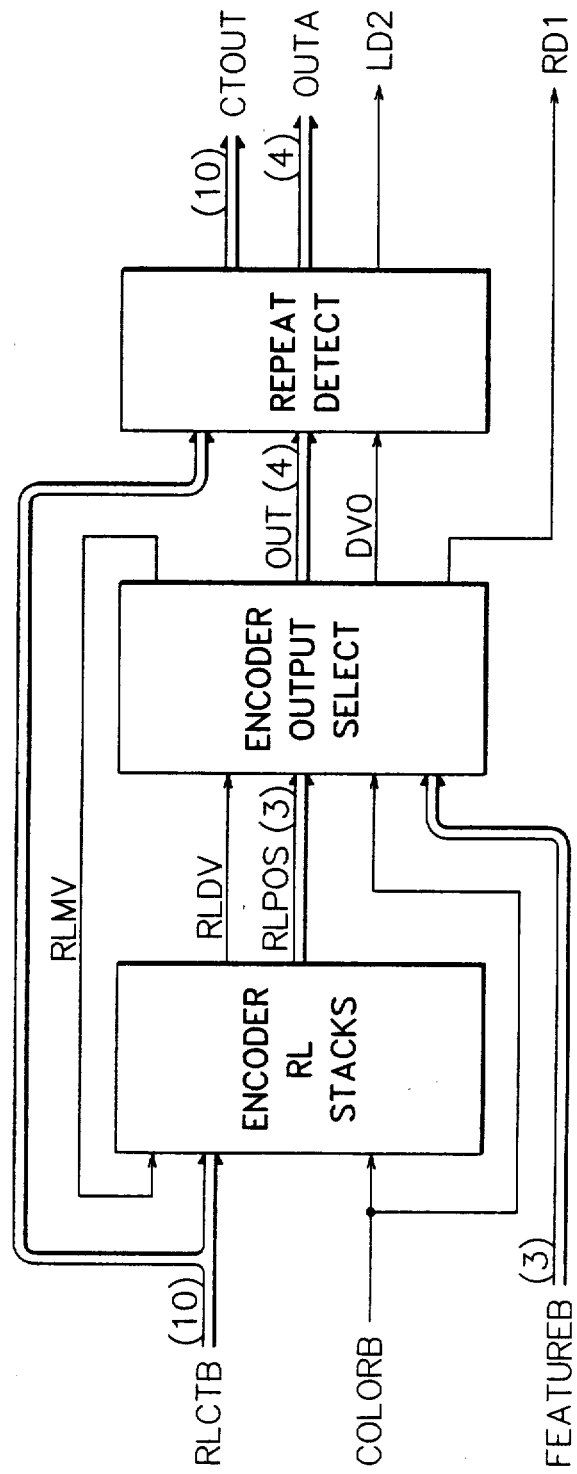
FIG. 6  ENCODER STEP 2

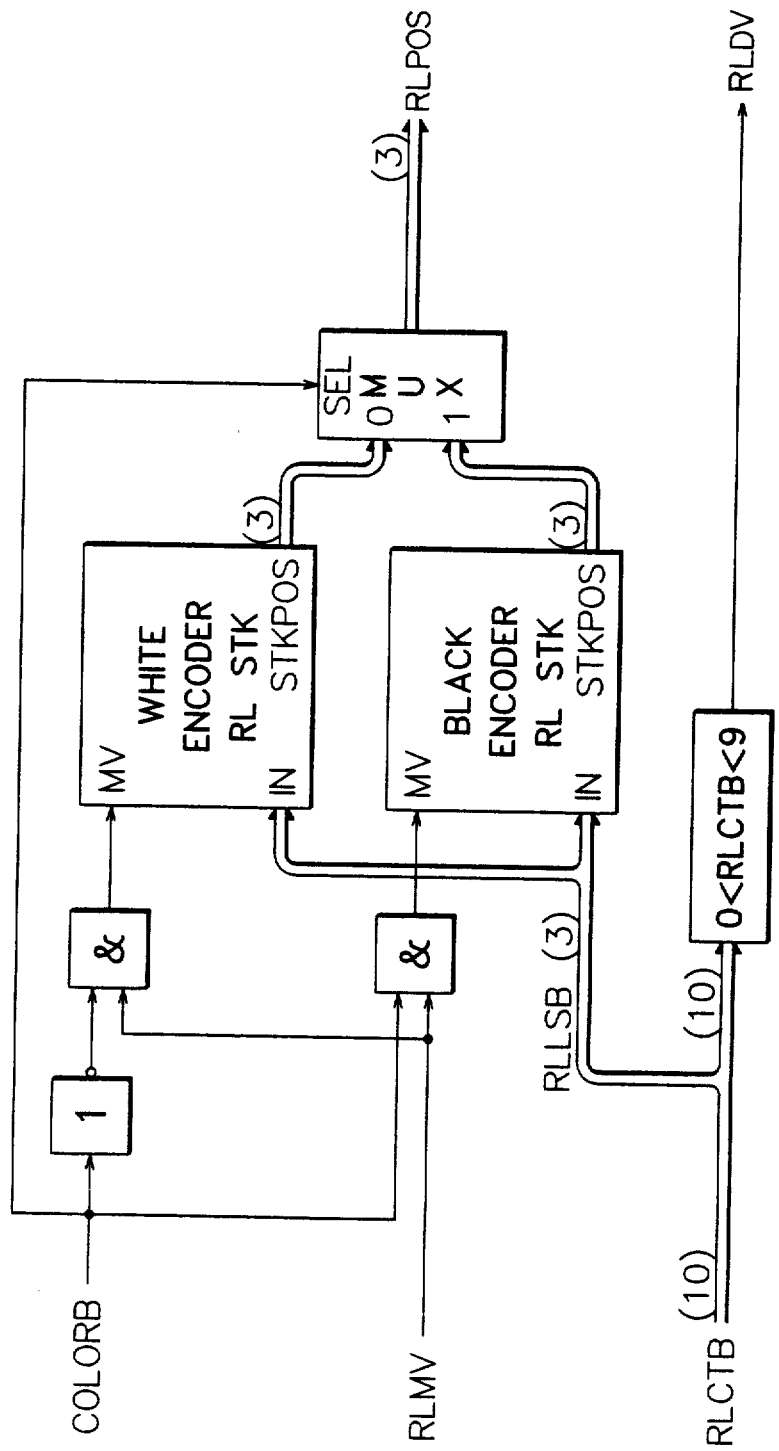
FIG. 7  ENCODER RL STACKS

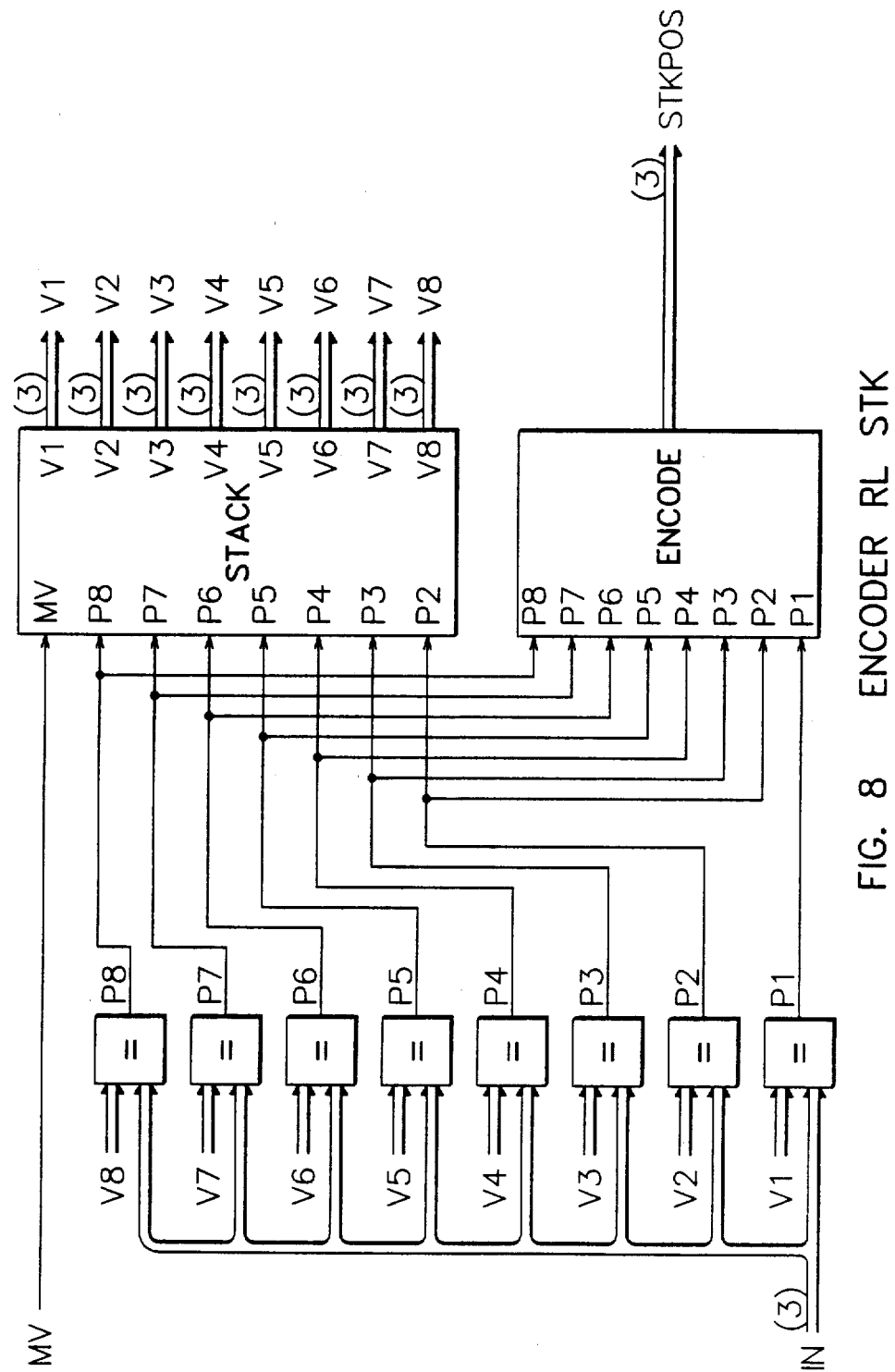
FIG. 8 ENCODER RL STK

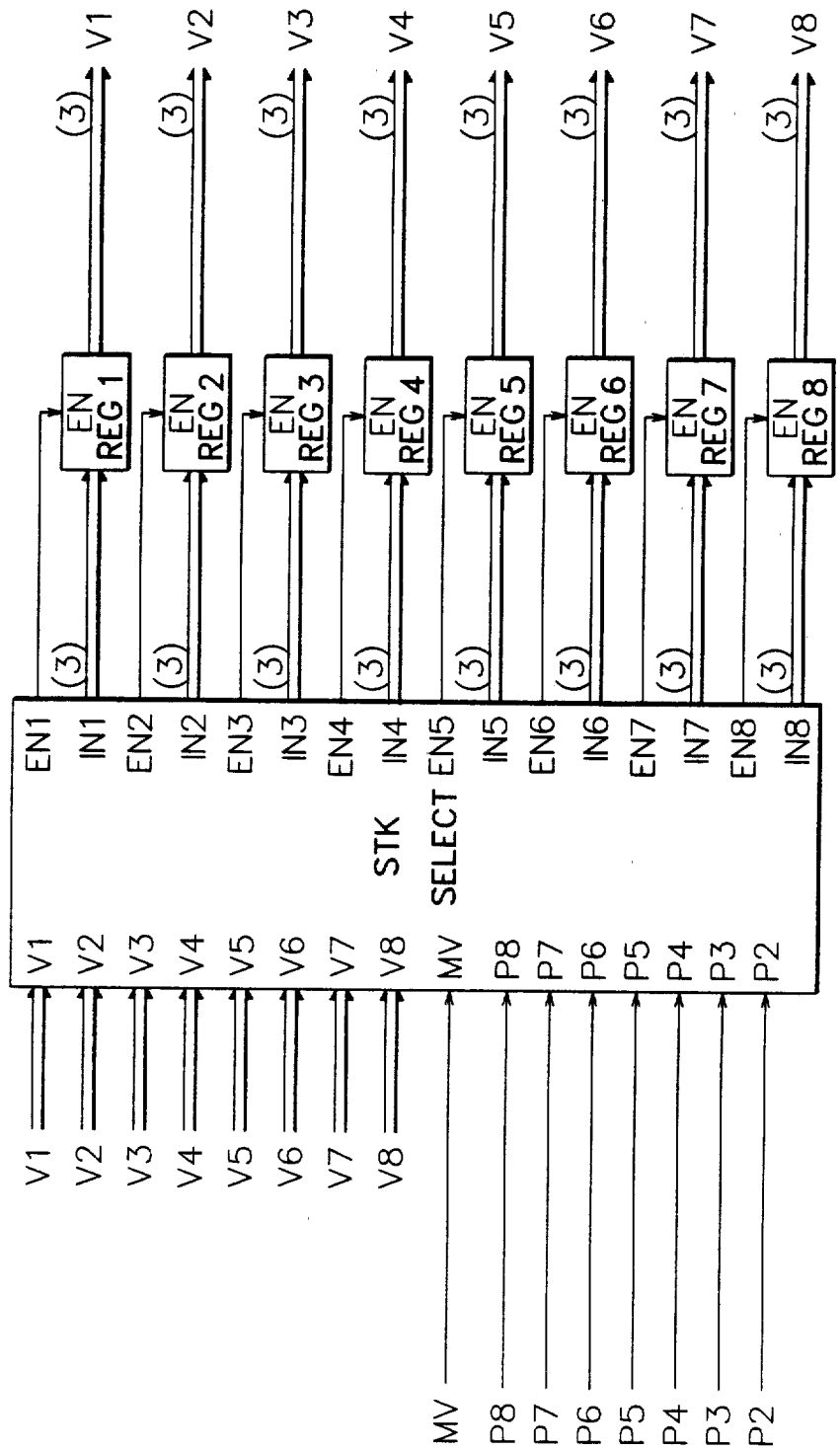
FIG. 9 STACK

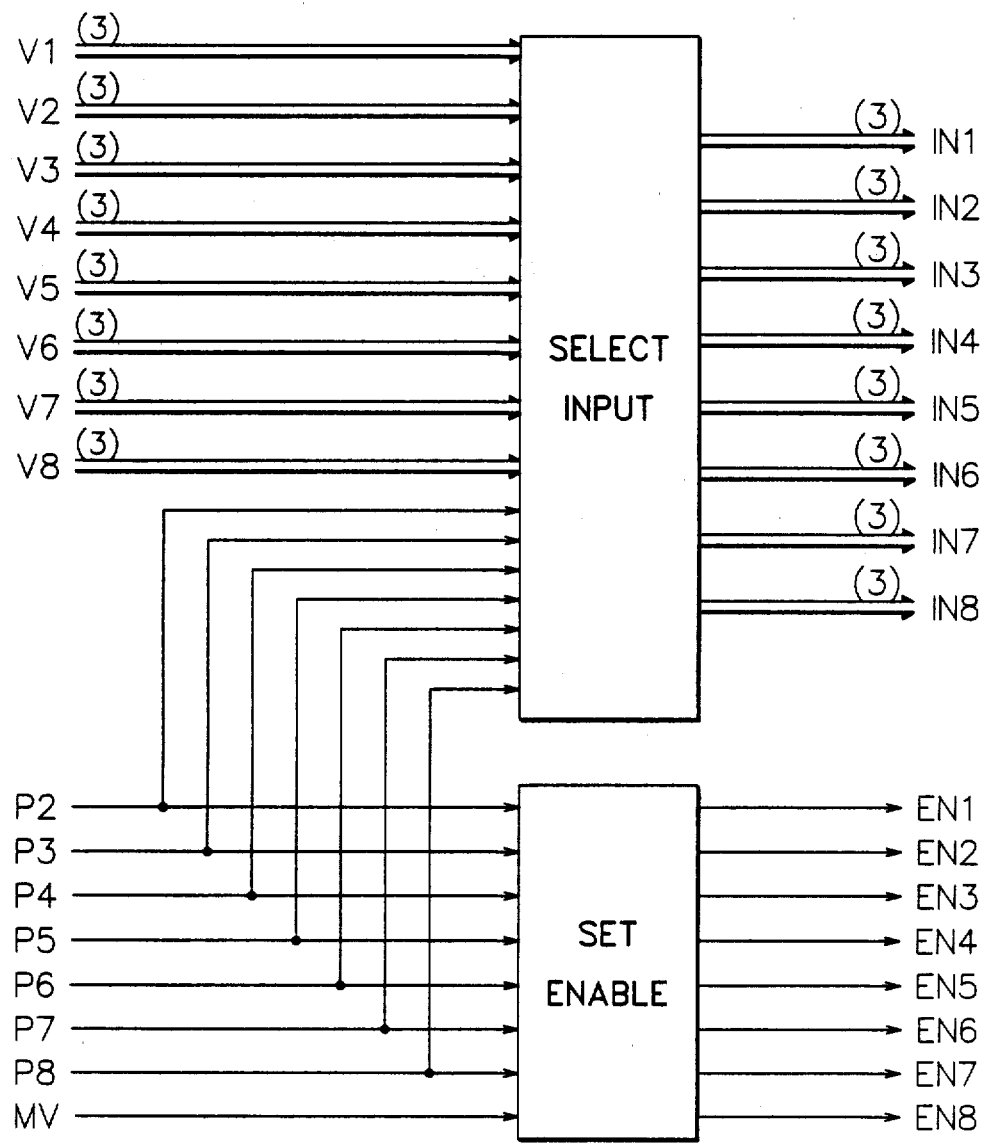
FIG. 10  STK SELECT

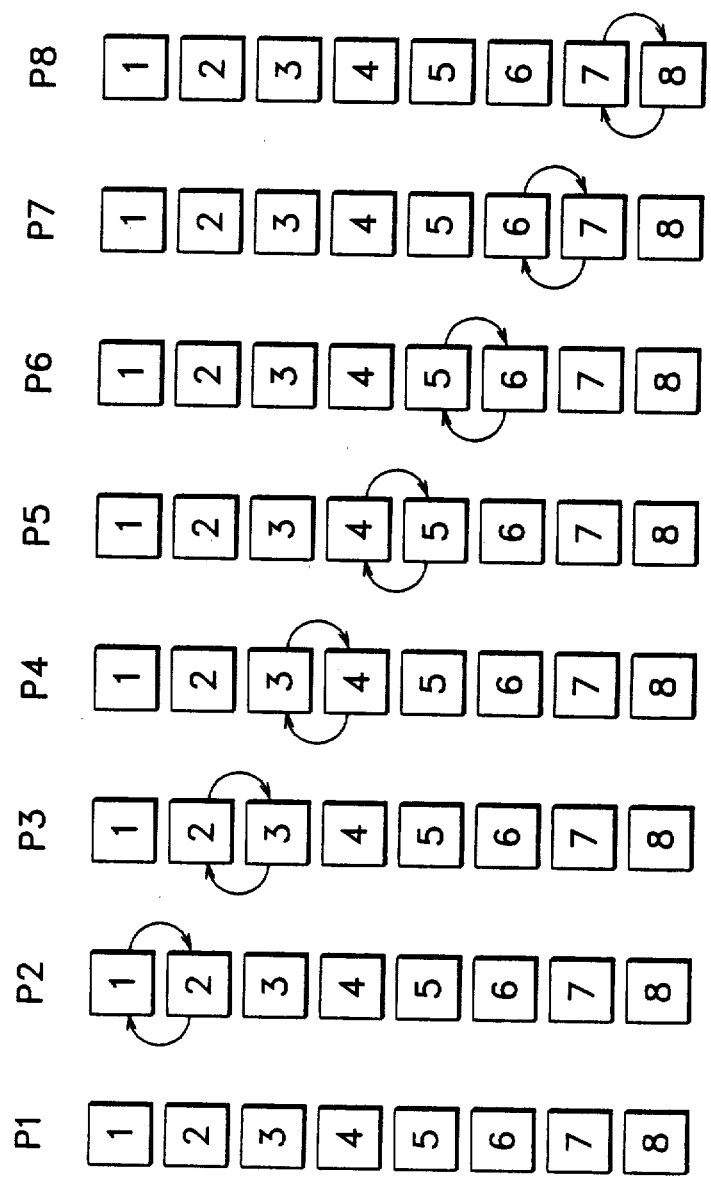
FIG. 11  MOVE UP ONE

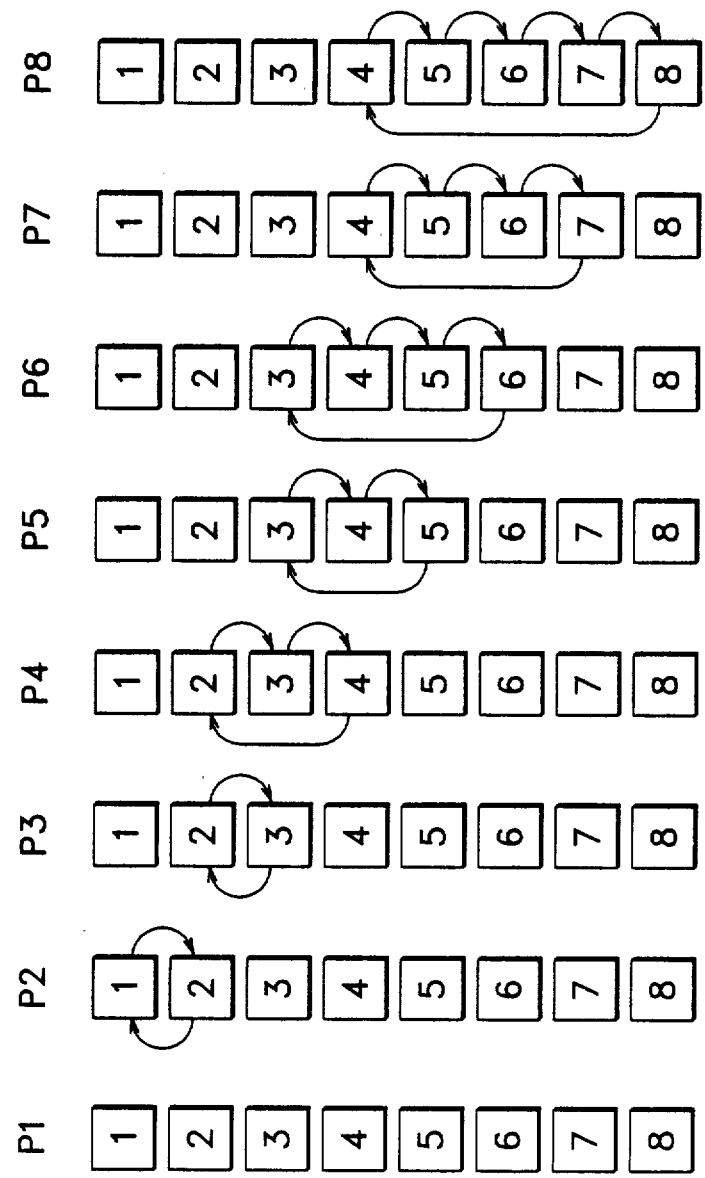
FIG. 12  MOVE UP HALF WAY

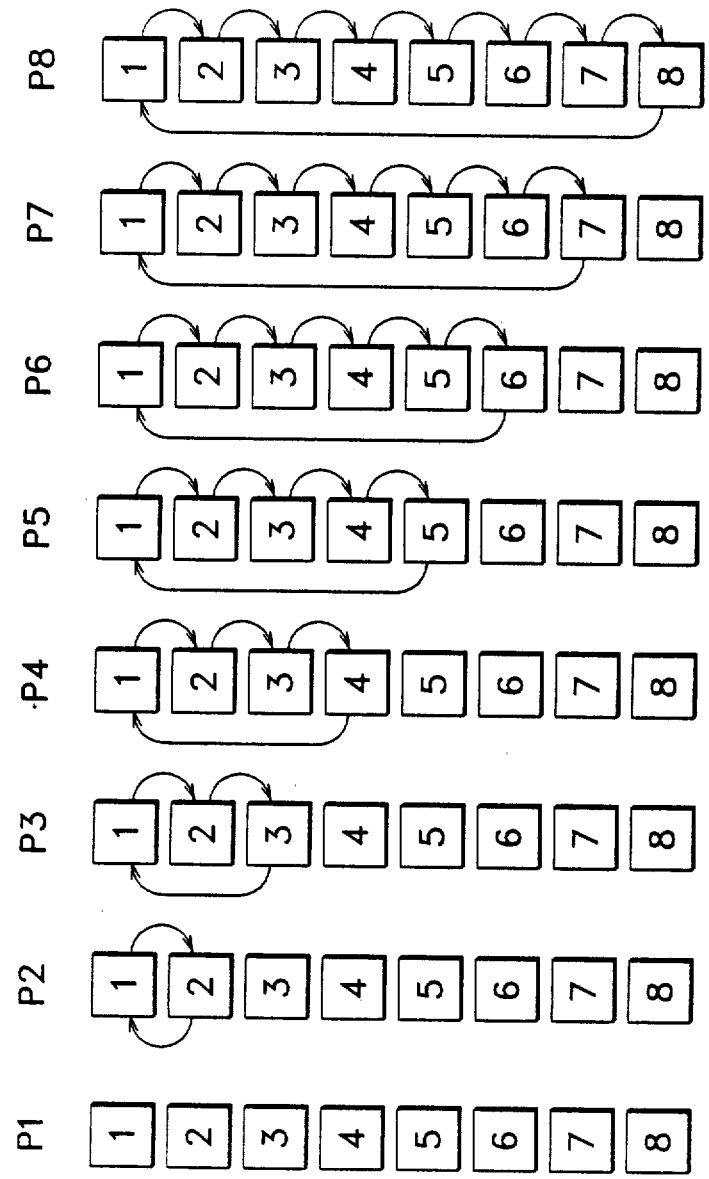
FIG. 13 MOVE TO TOP

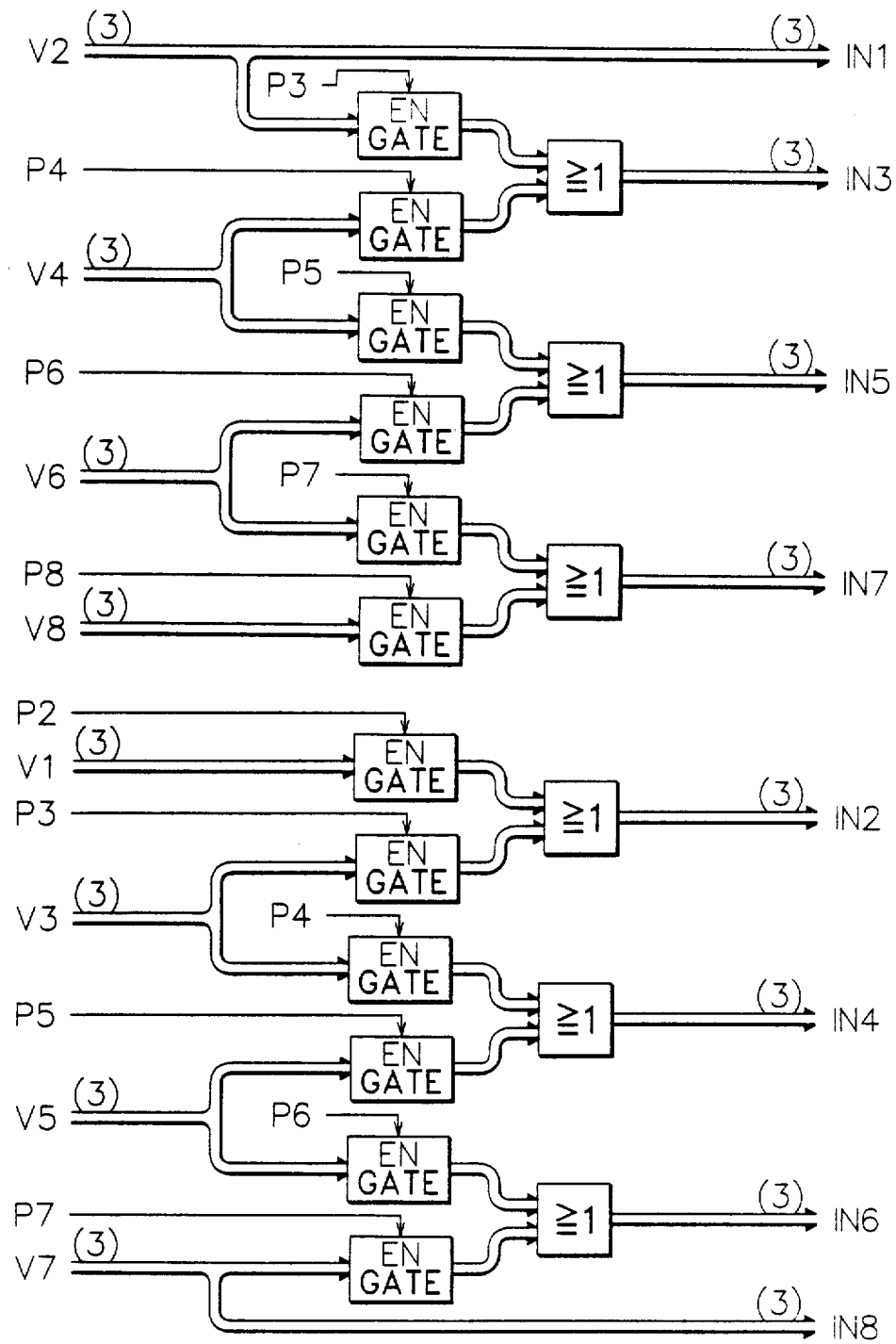
FIG. 14  MOVE UP ONE SELECT INPUT

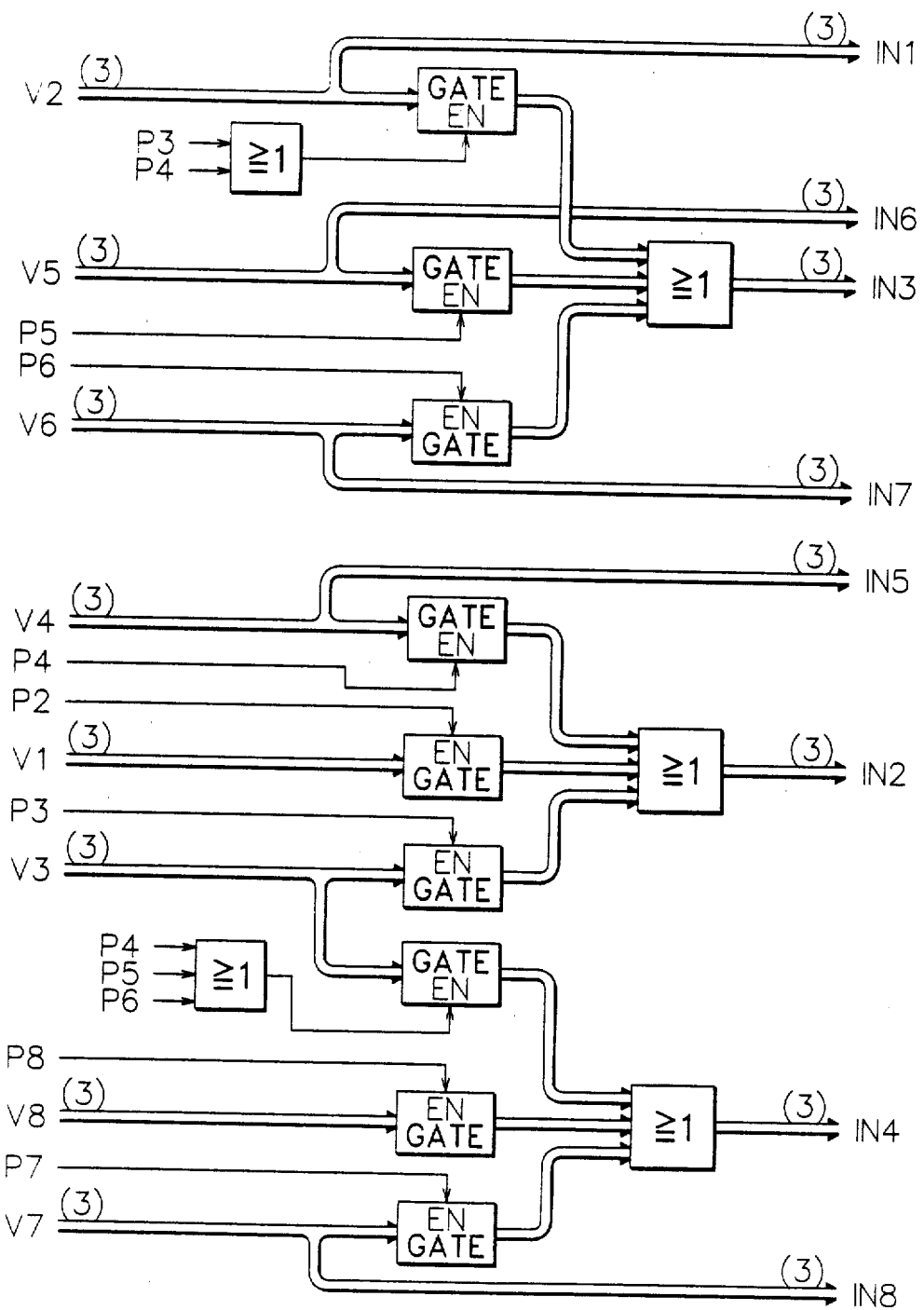
FIG. 15    MOVE UP HALF WAY SELECT INPUT

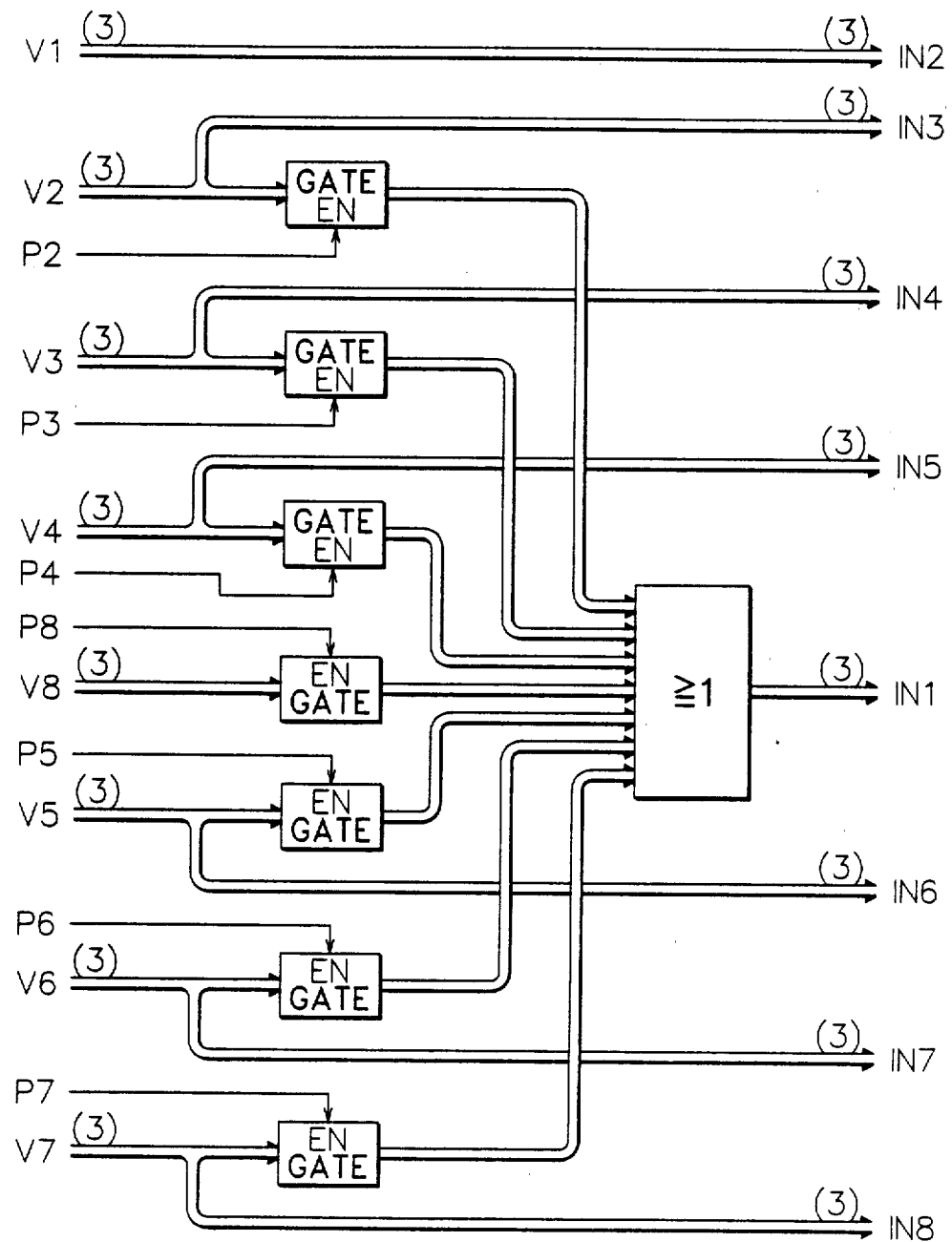
FIG. 16  MOVE TO TOP SELECT INPUT

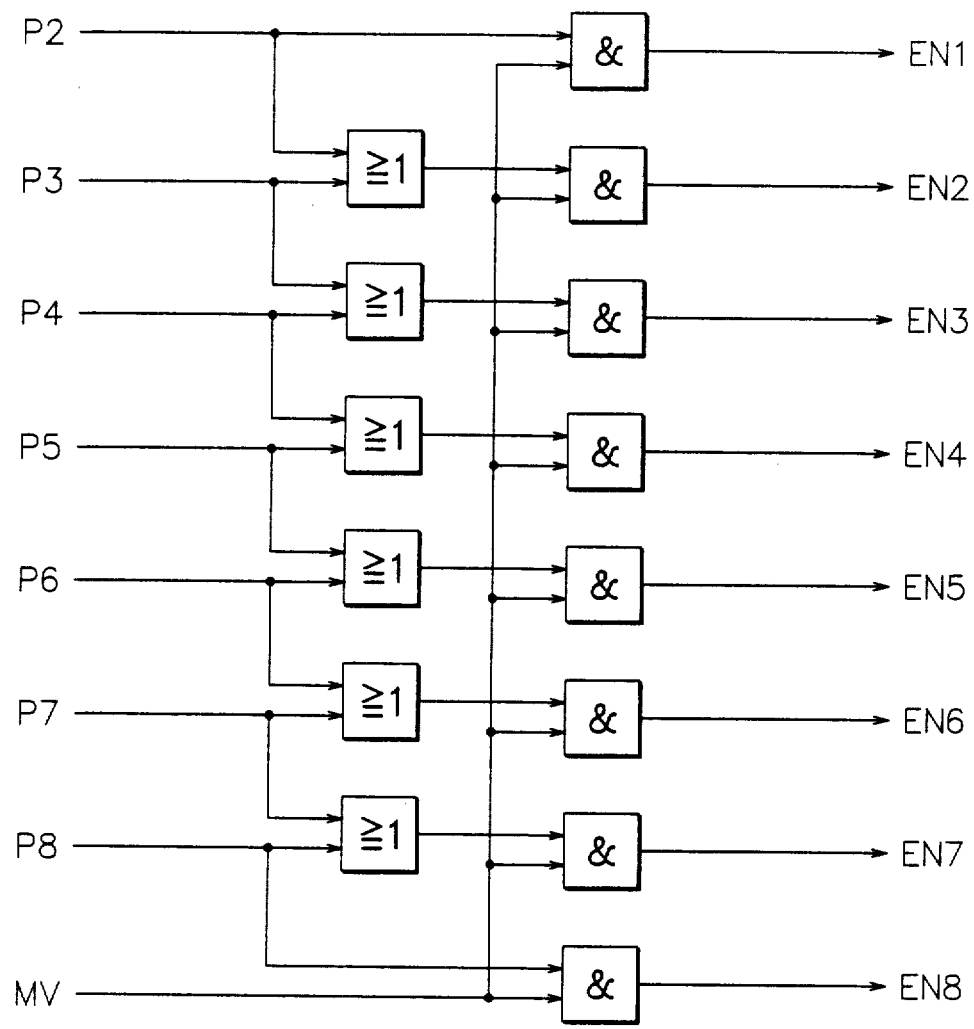
FIG. 17  MOVE UP ONE SET ENABLE

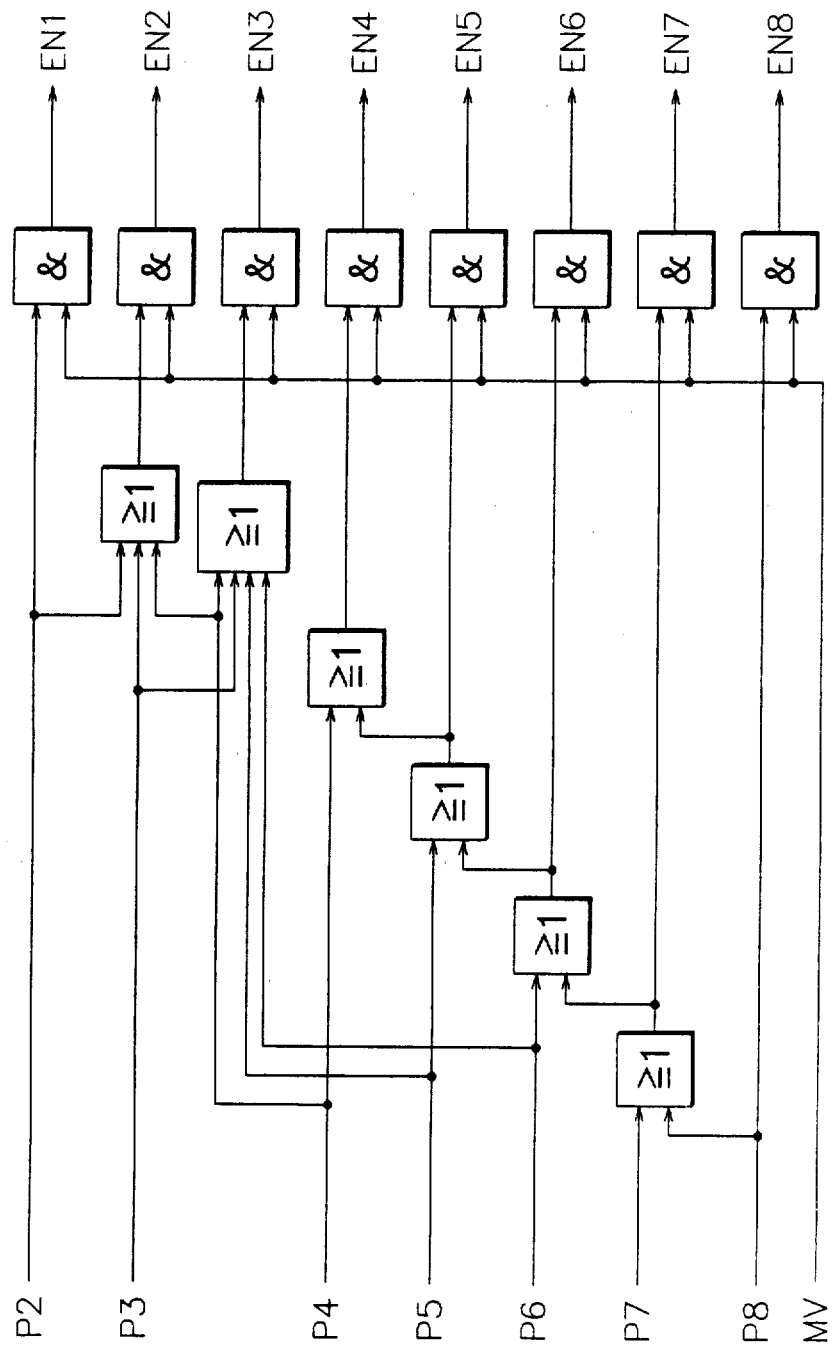
FIG. 18  MOVE UP HALF WAY SET ENABLE

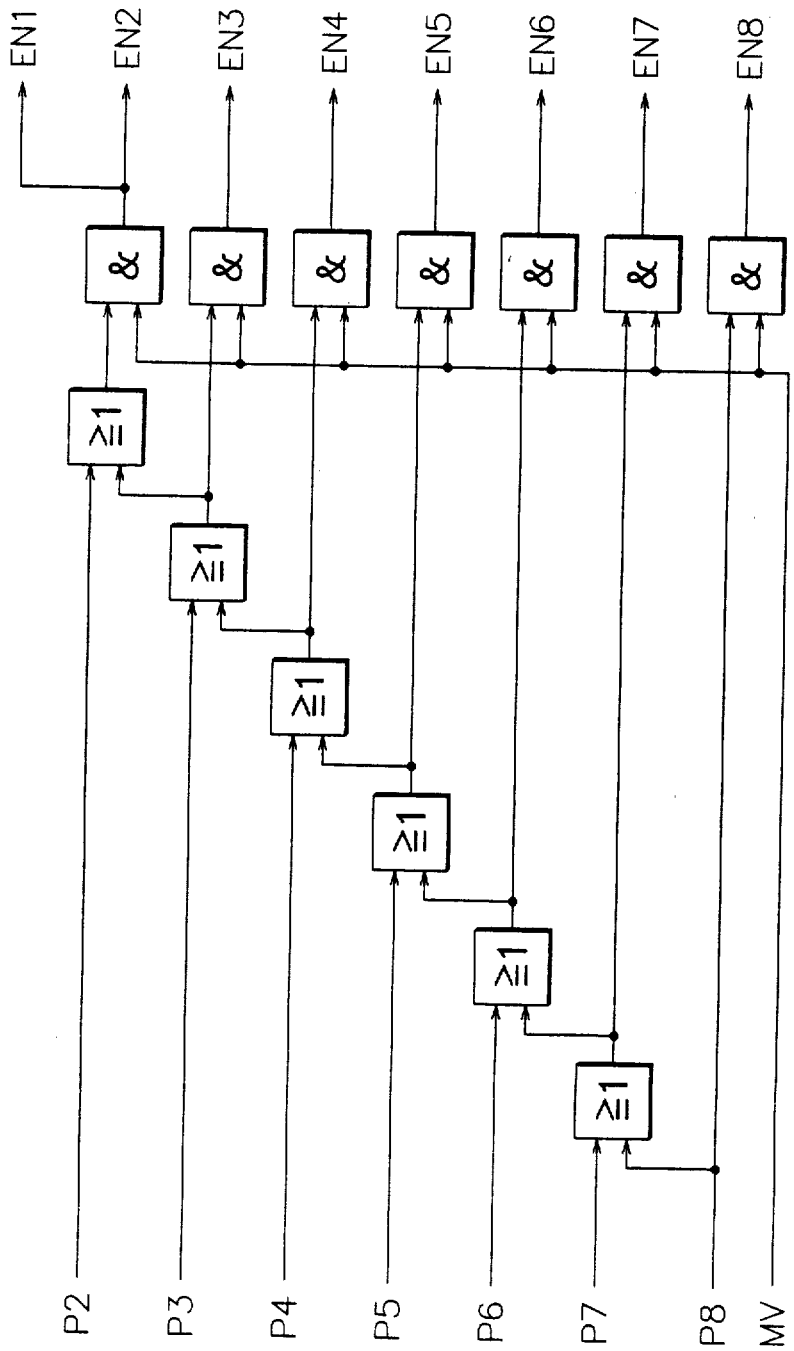
FIG. 19 MOVE TO TOP SET ENABLE

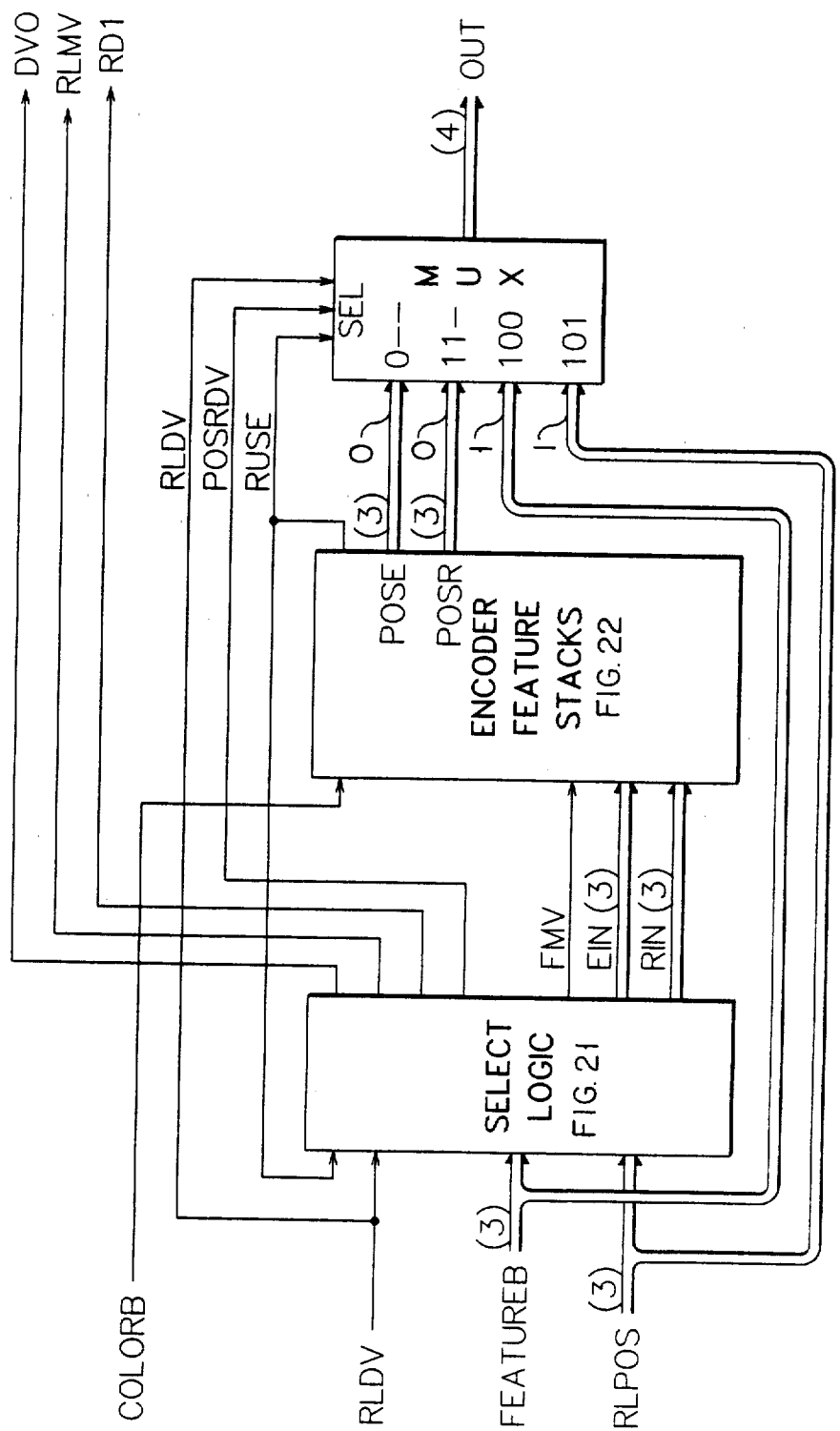
FIG. 20 ENCODER OUTPUT SELECT

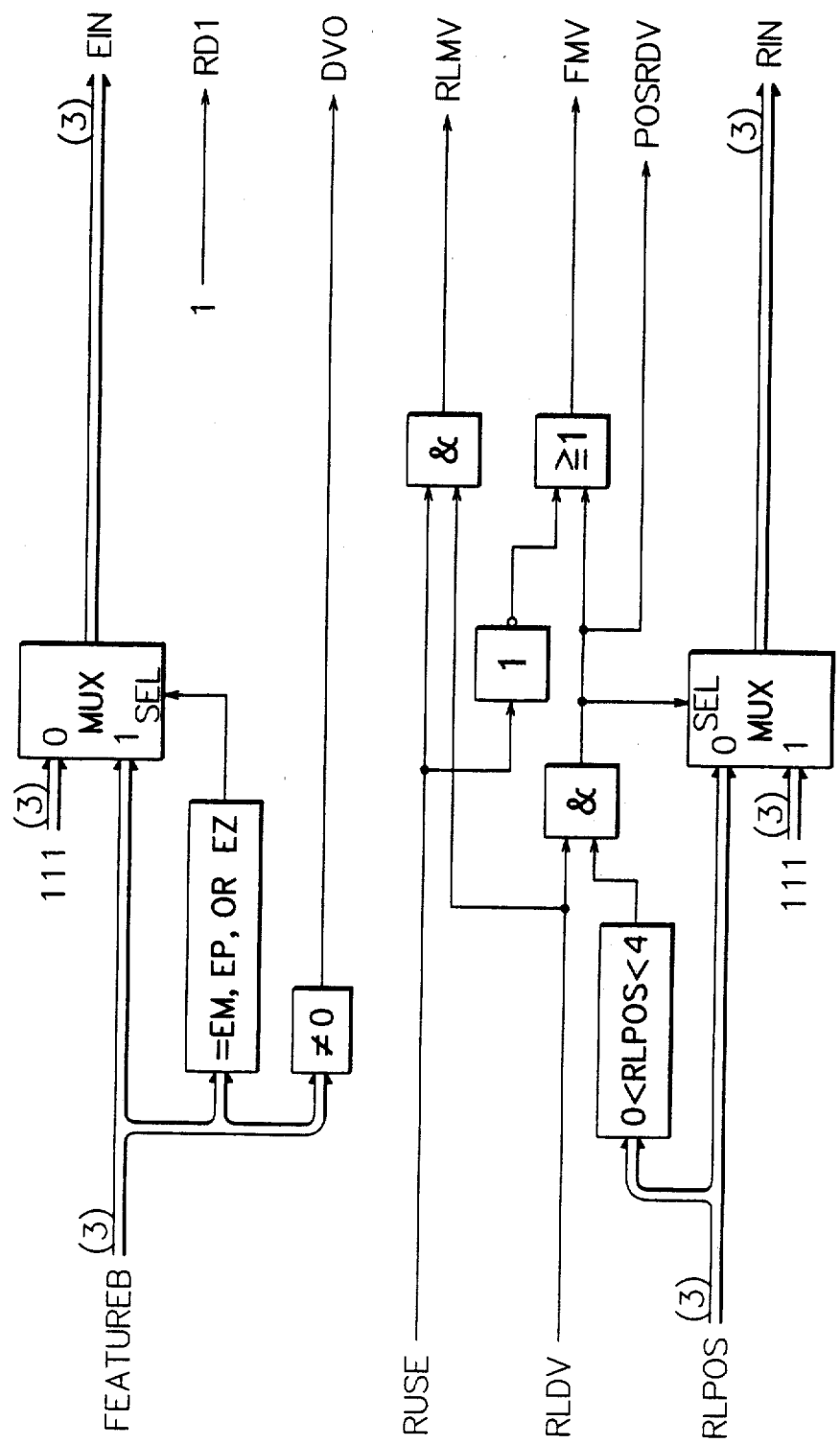
FIG. 21 ENCODER SELECT LOGIC

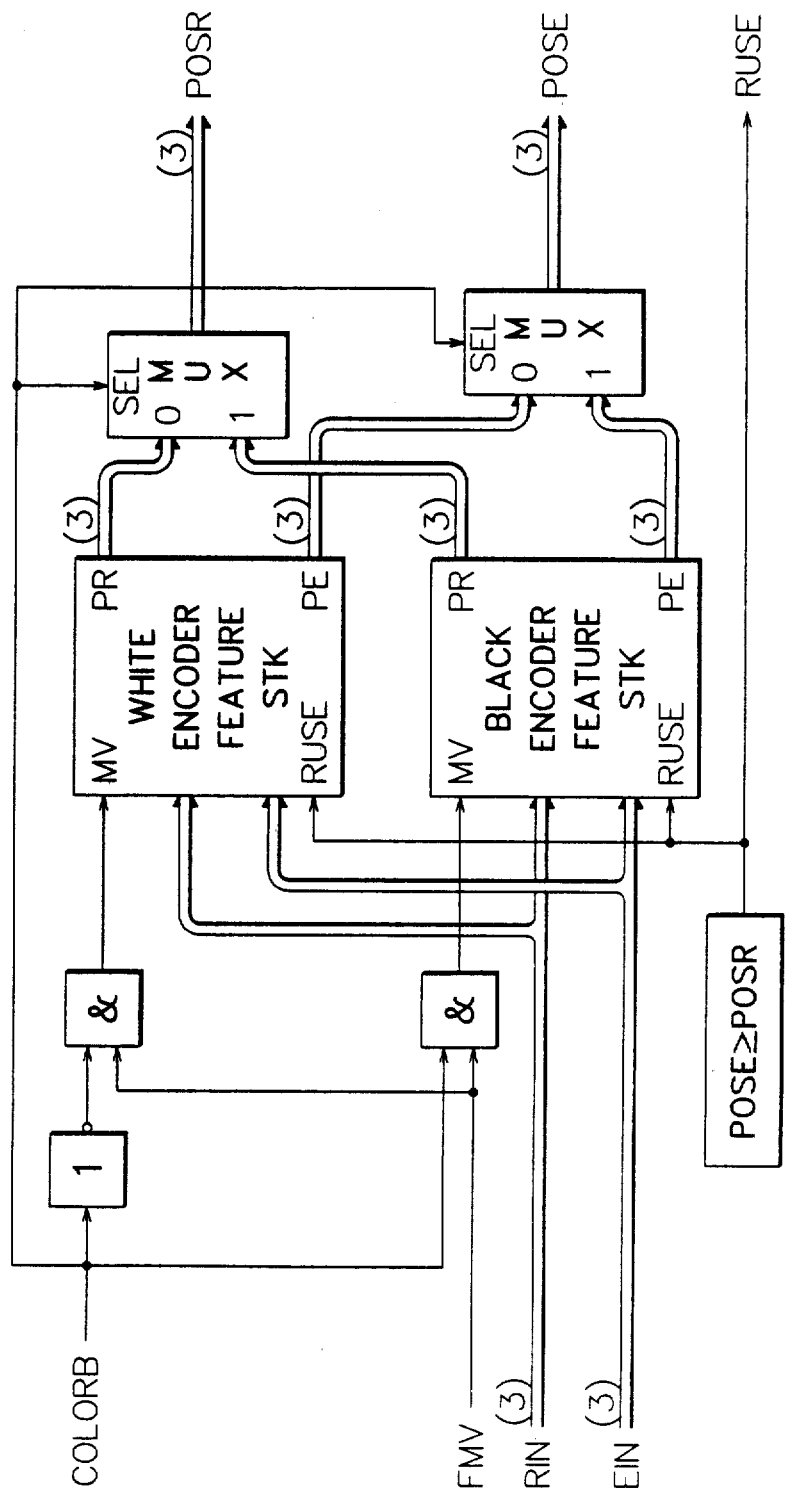
FIG. 22 ENCODER FEATURE STACKS

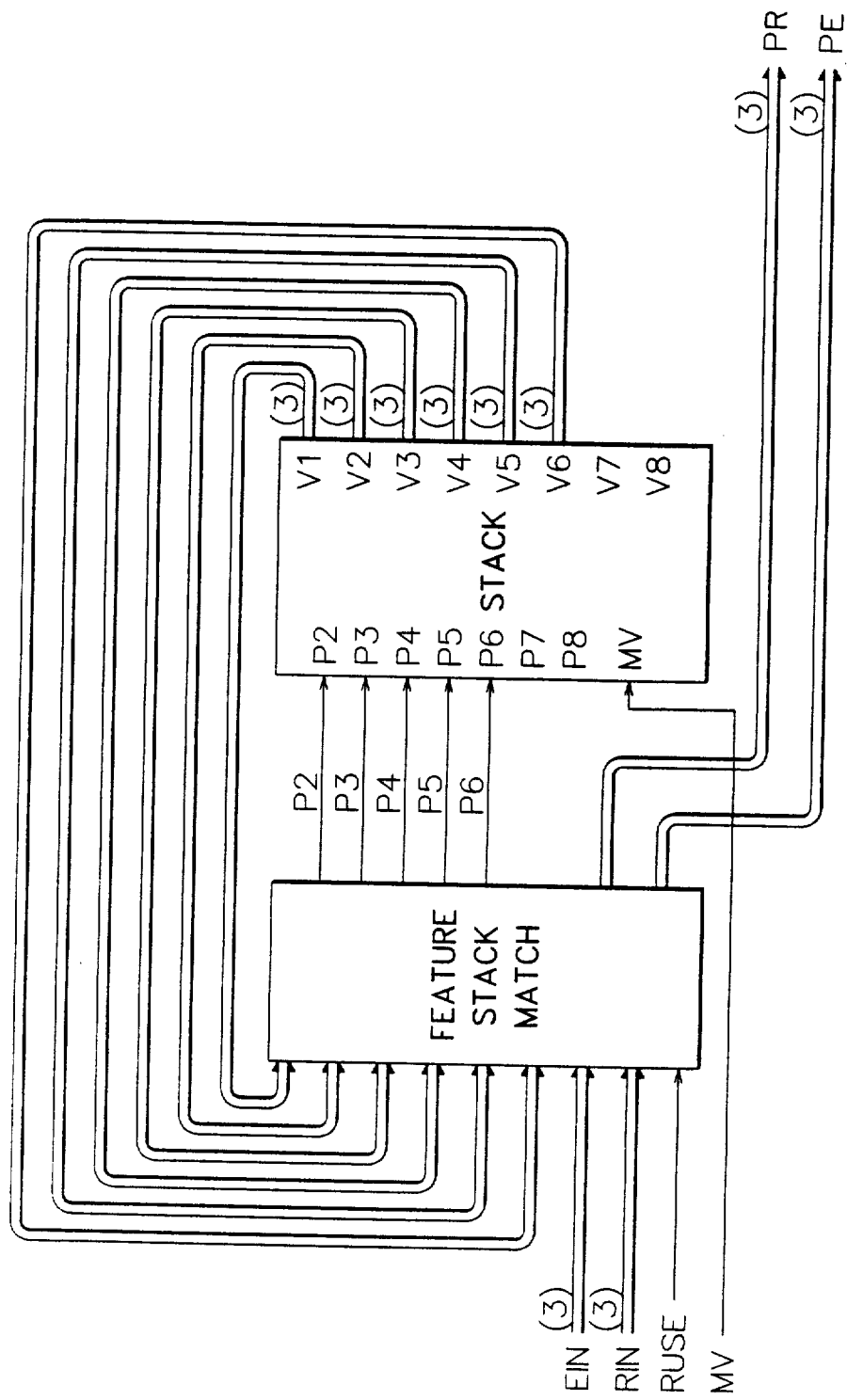
FIG. 23 ENCODER FEATURE STK

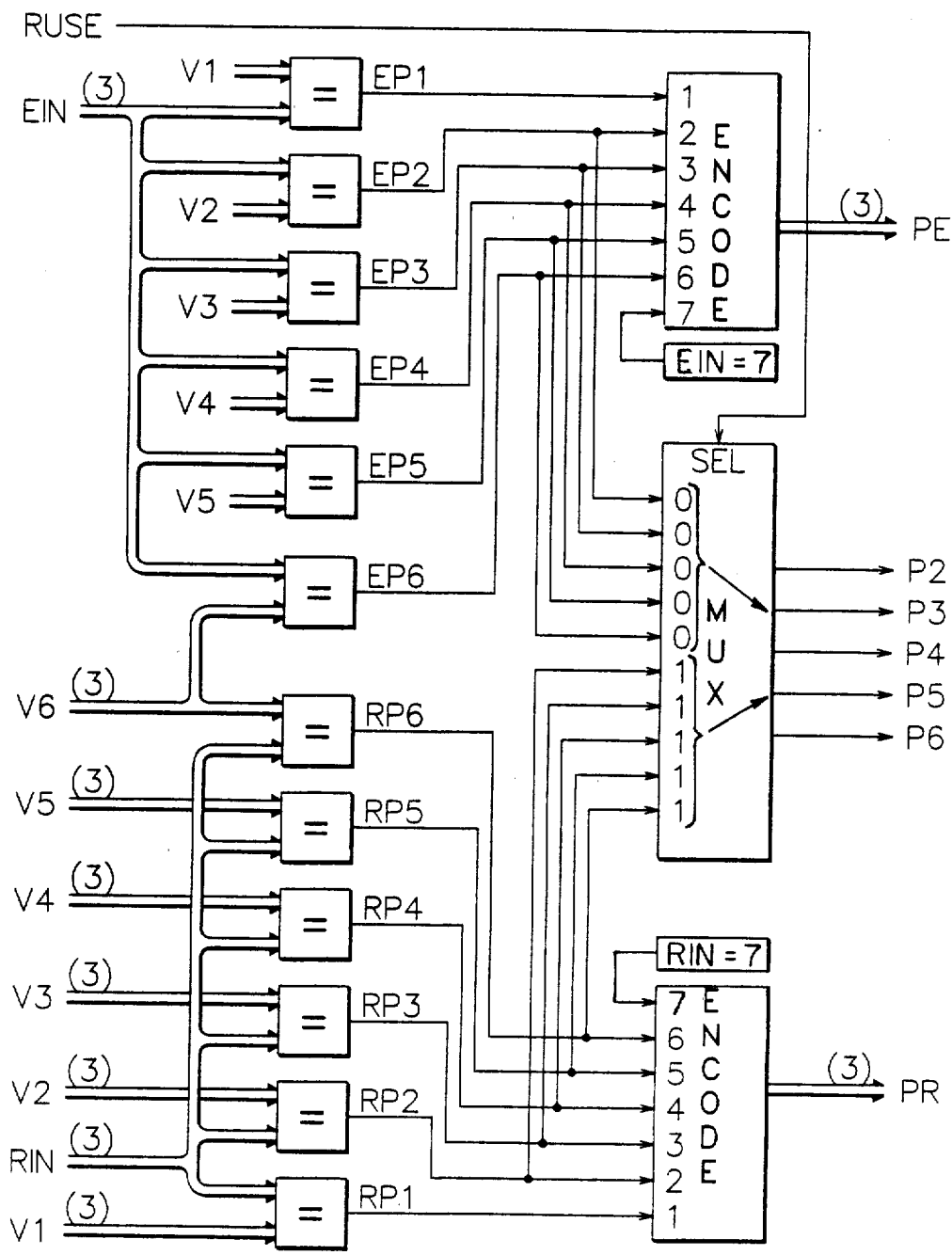
FIG. 24 ENCODER FEATURE STACK MATCH

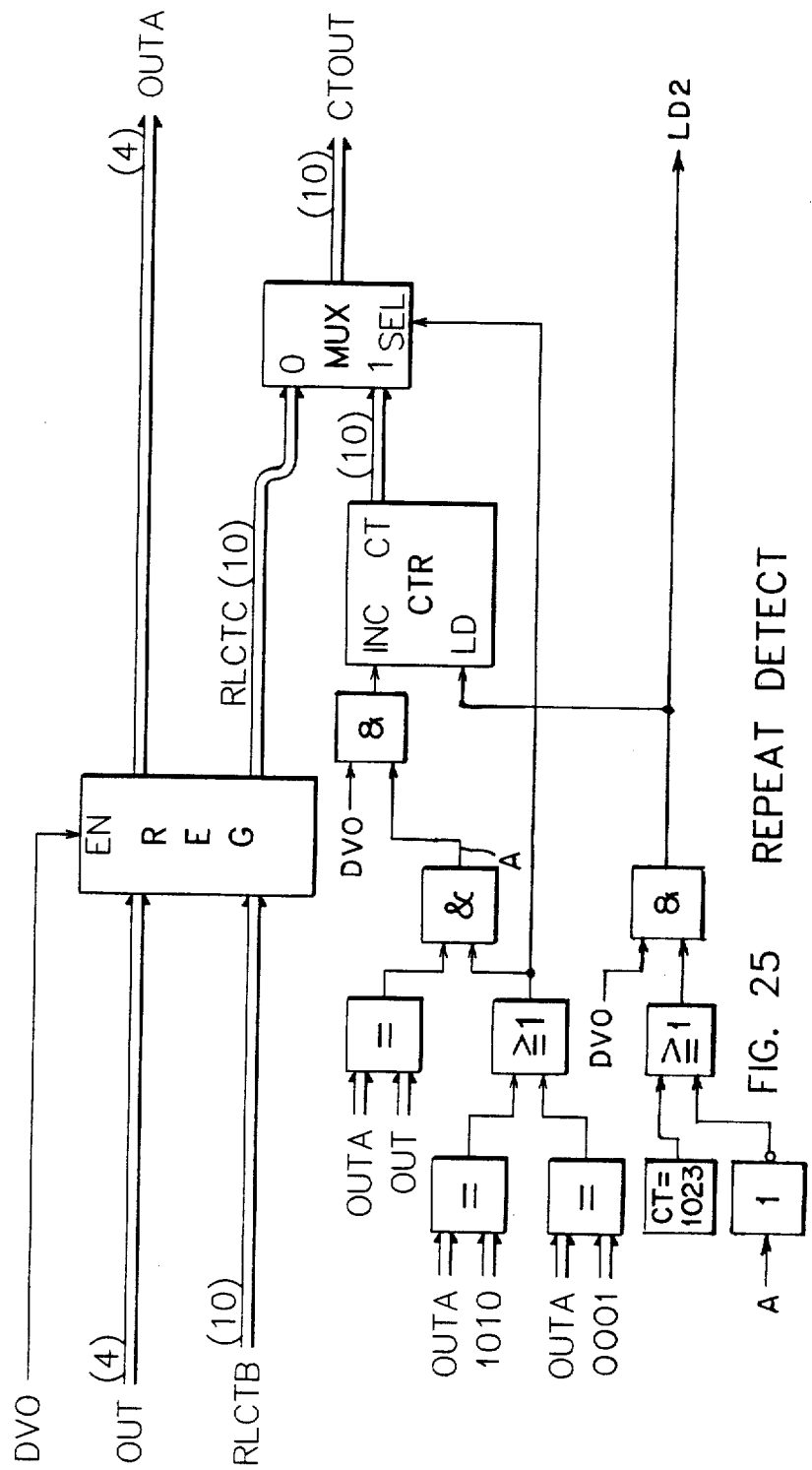
FIG. 25 REPEAT DETECT

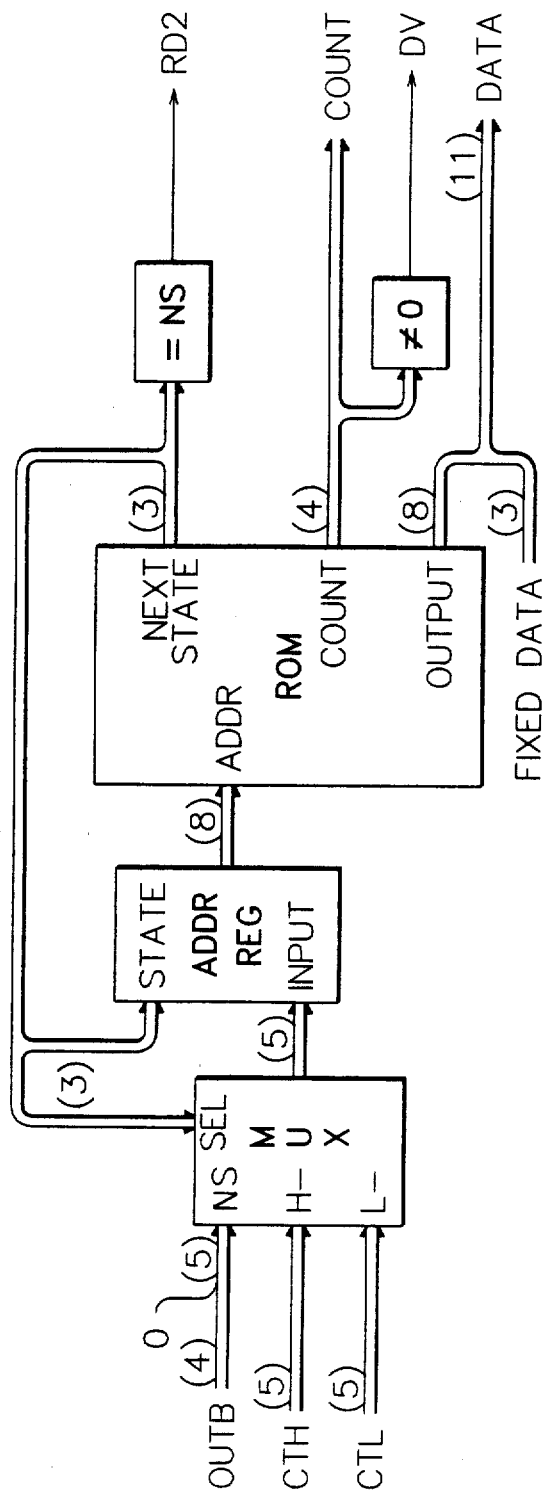
FIG. 26  ENCODER STEP 3

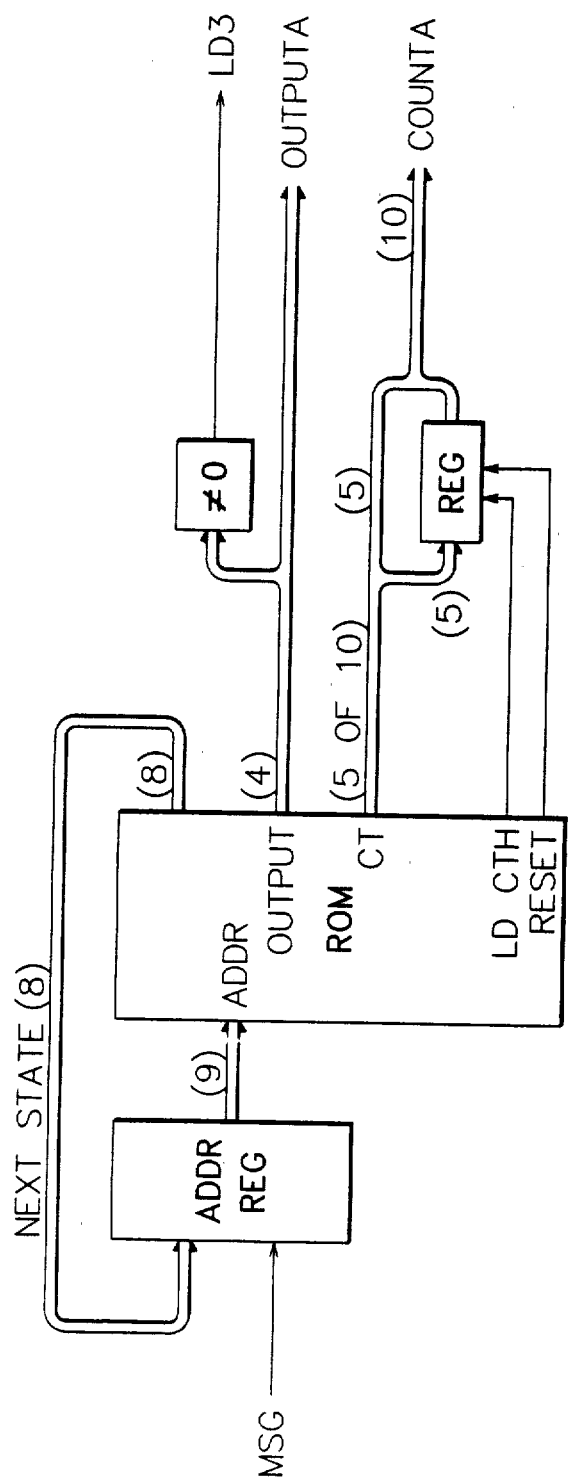
FIG. 27    DECODER STEP 1

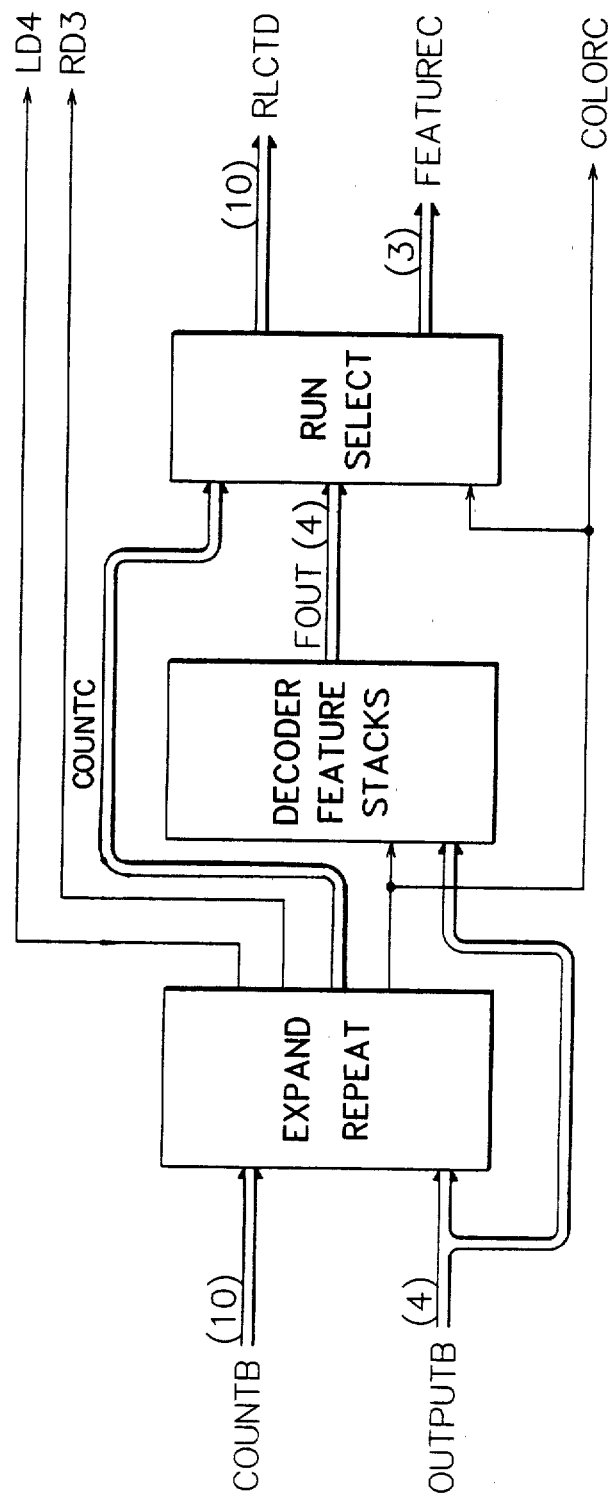
FIG. 28 DECODER STEP 2

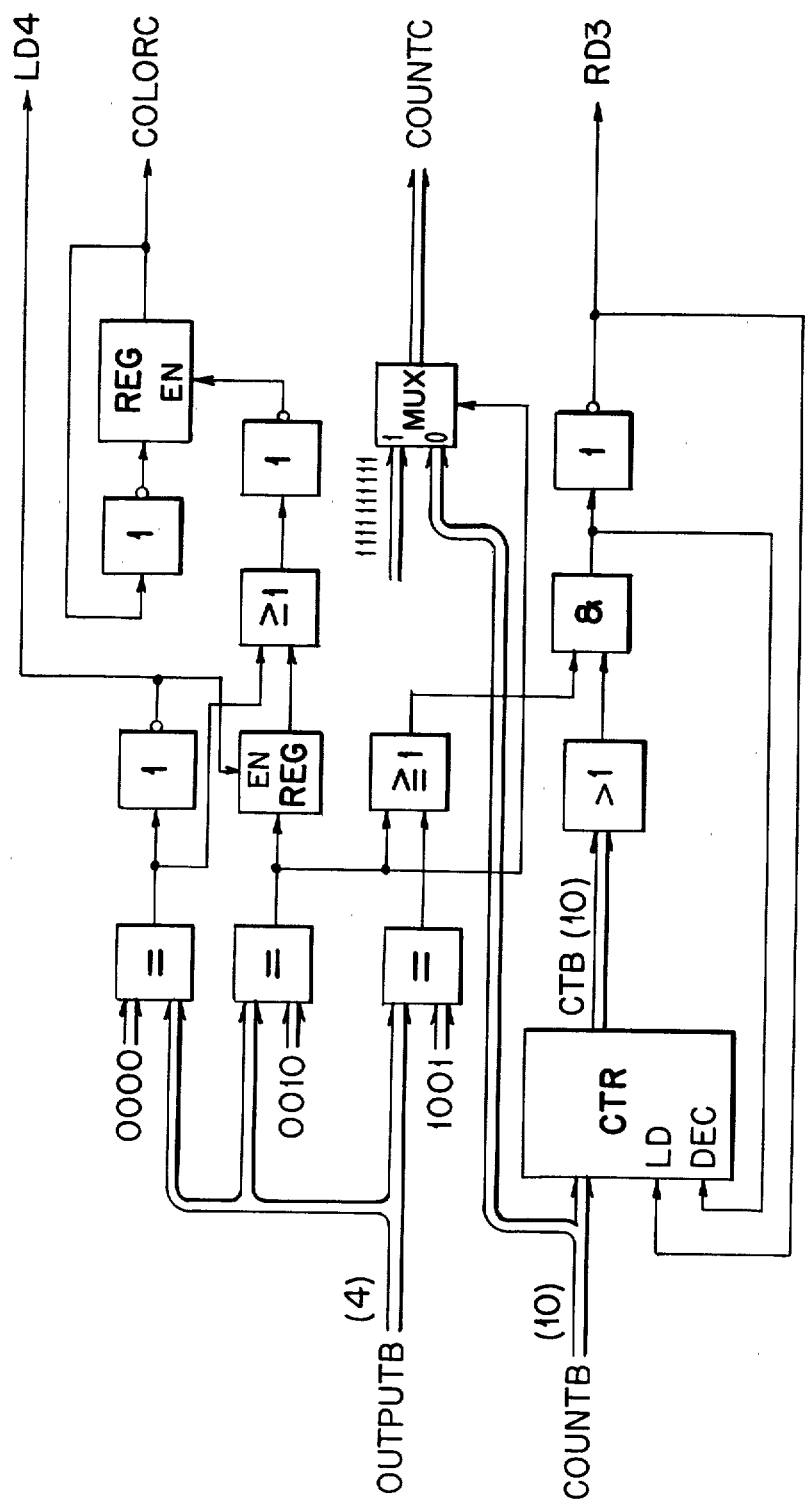
FIG. 29    EXPAND REPEAT

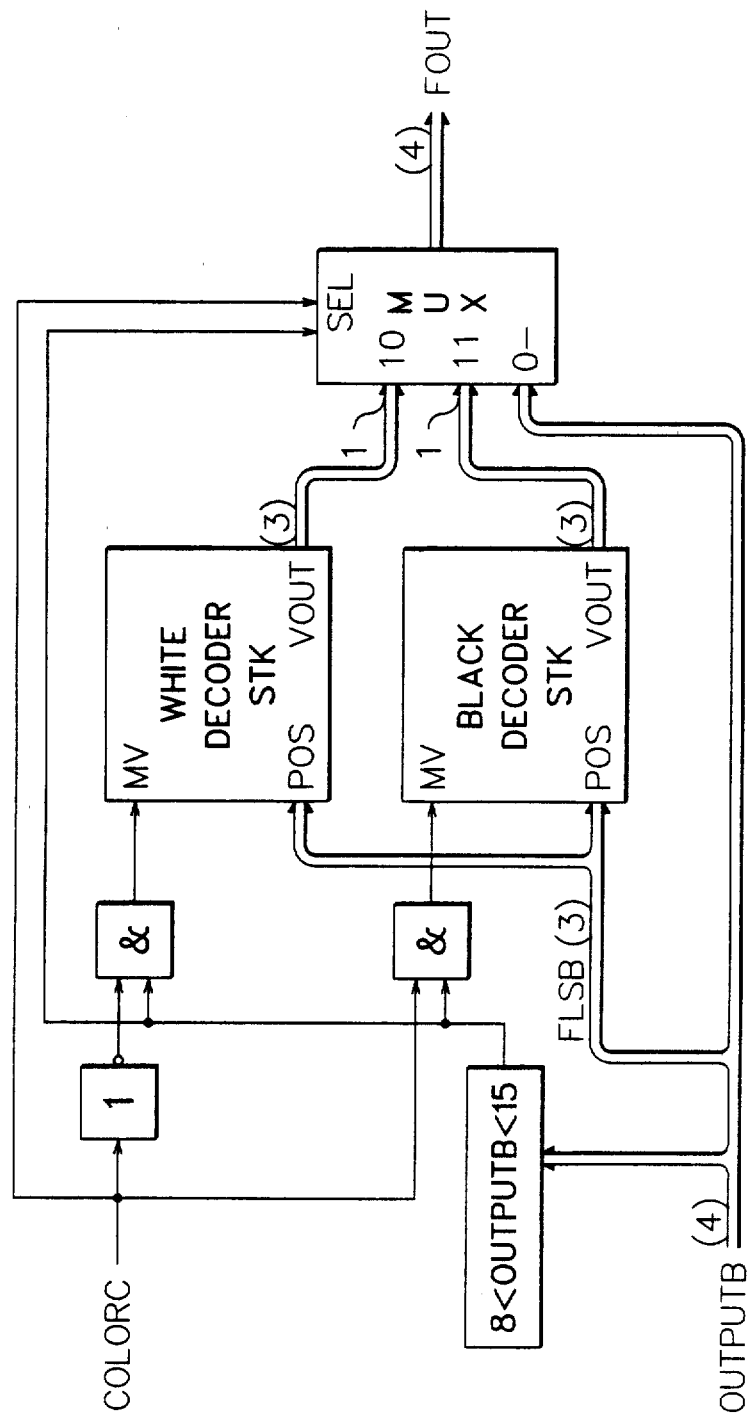
FIG. 30   DECODER FEATURE STACKS

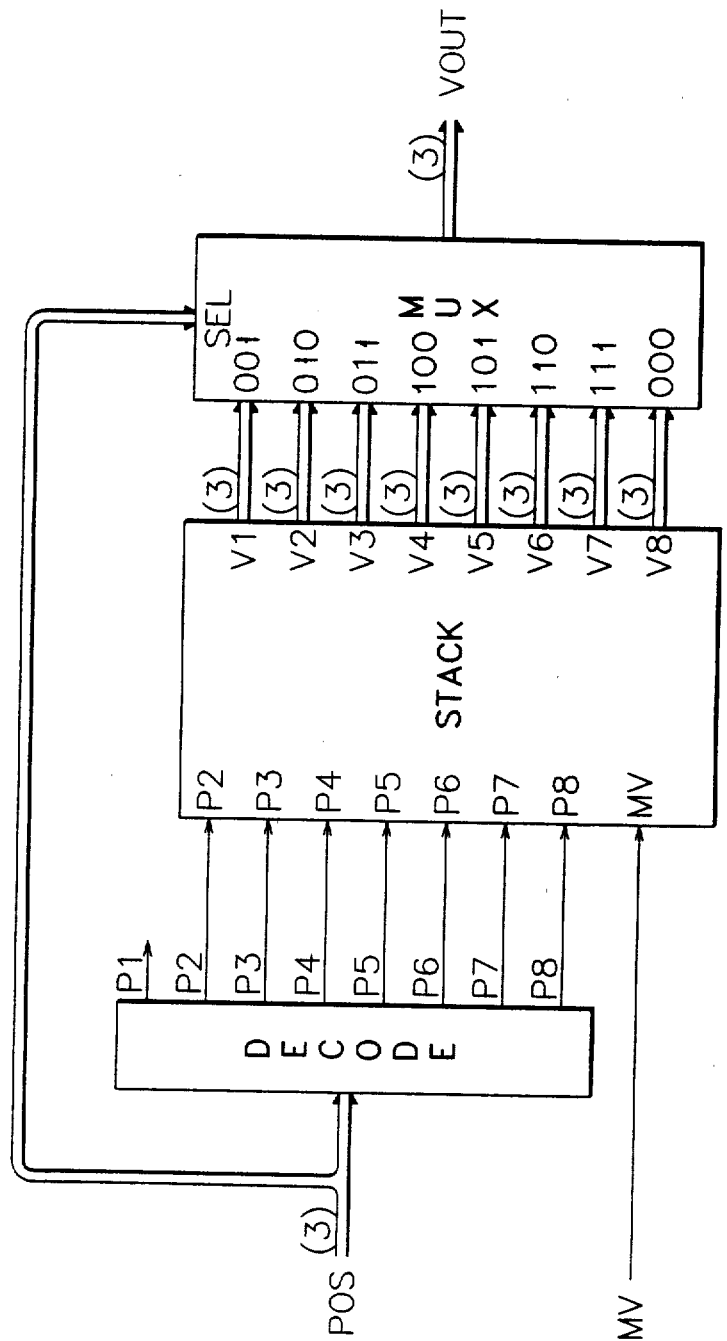
FIG. 31  DECODER STK

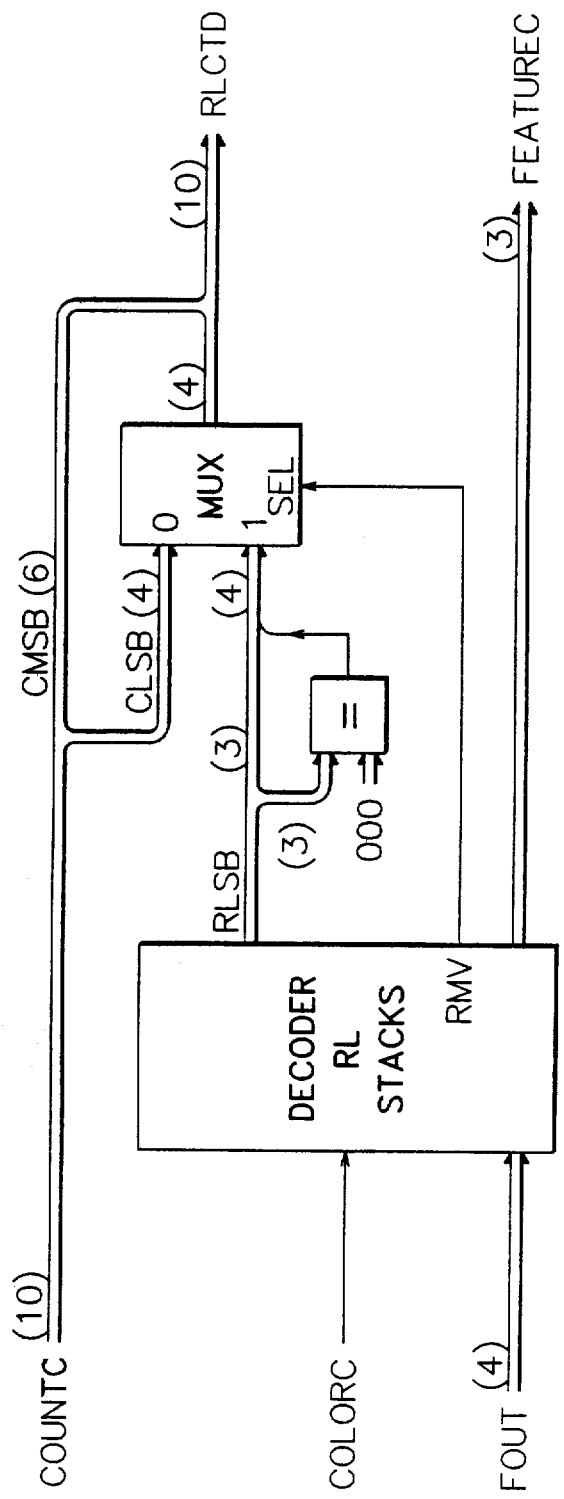
FIG. 32 RUN SELECT

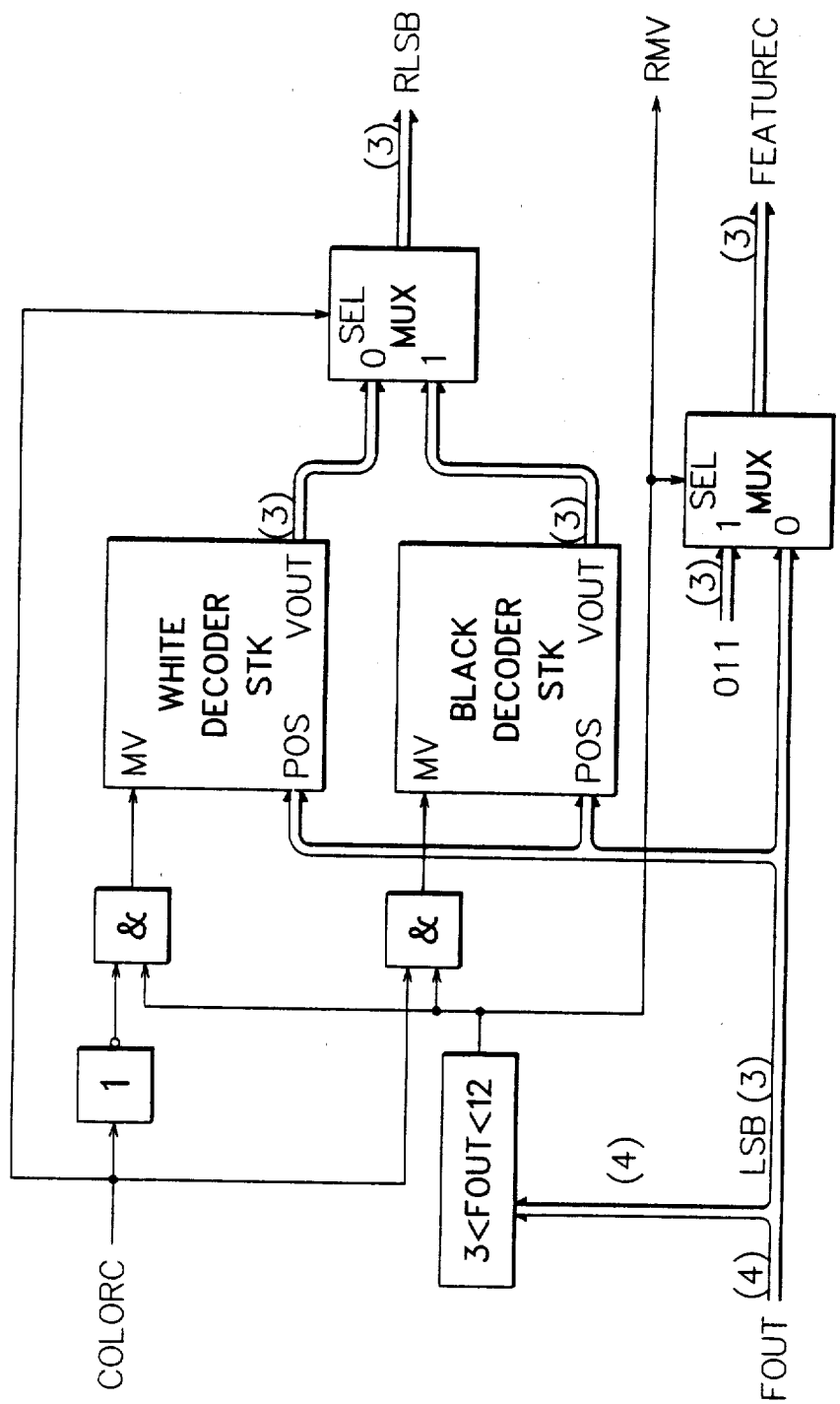
FIG. 33 DECODER RL STACKS

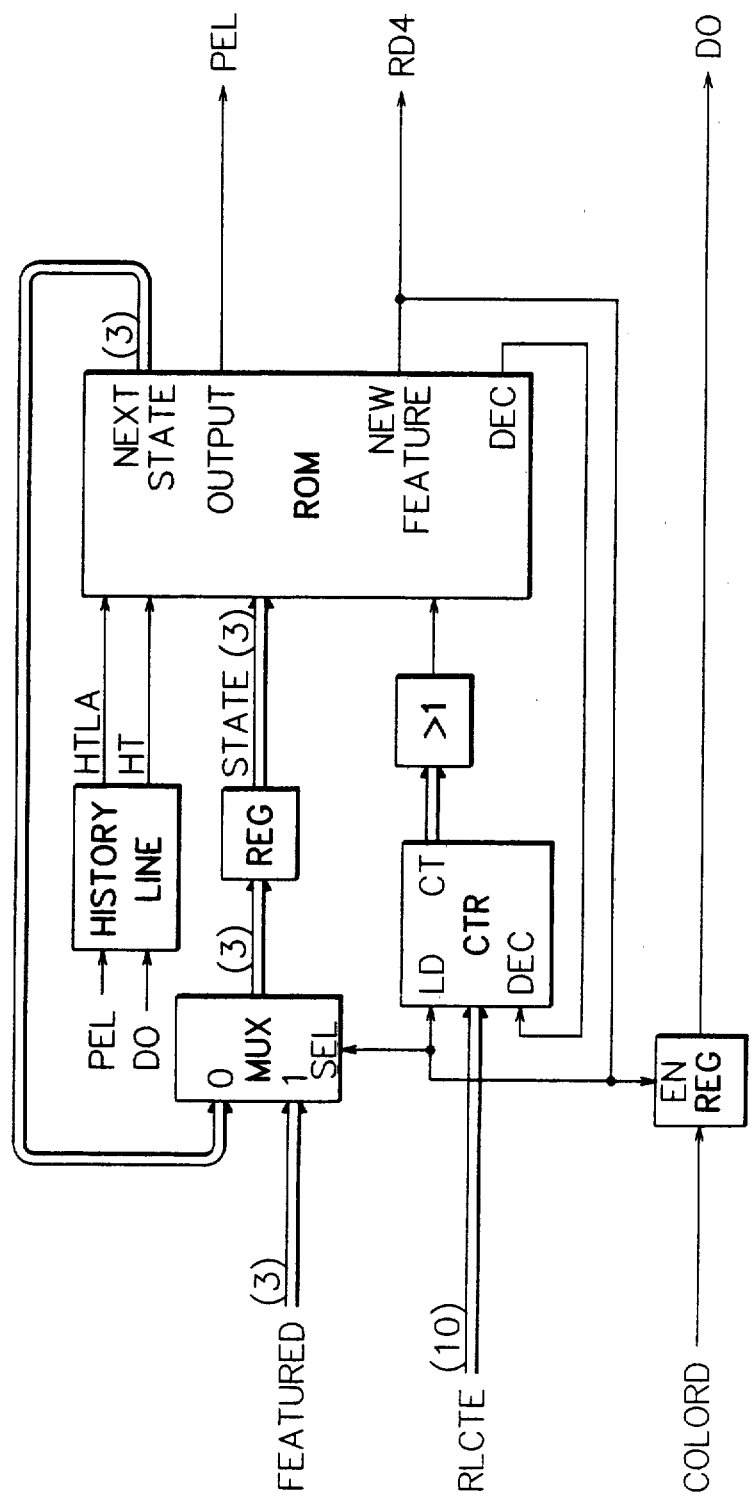
FIG. 34 DECODER STEP 3

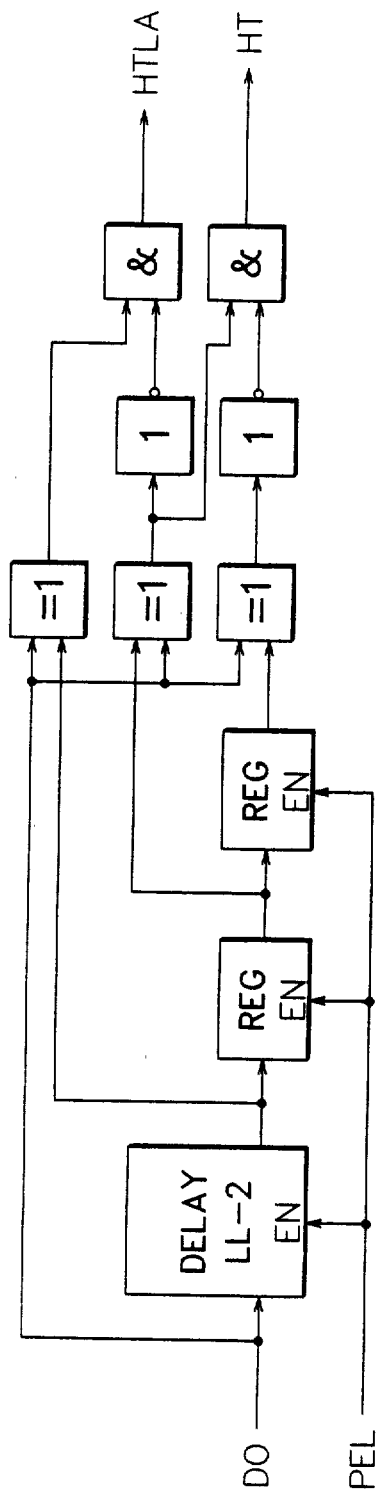
FIG. 35  DECODER HISTORY LINE STORE

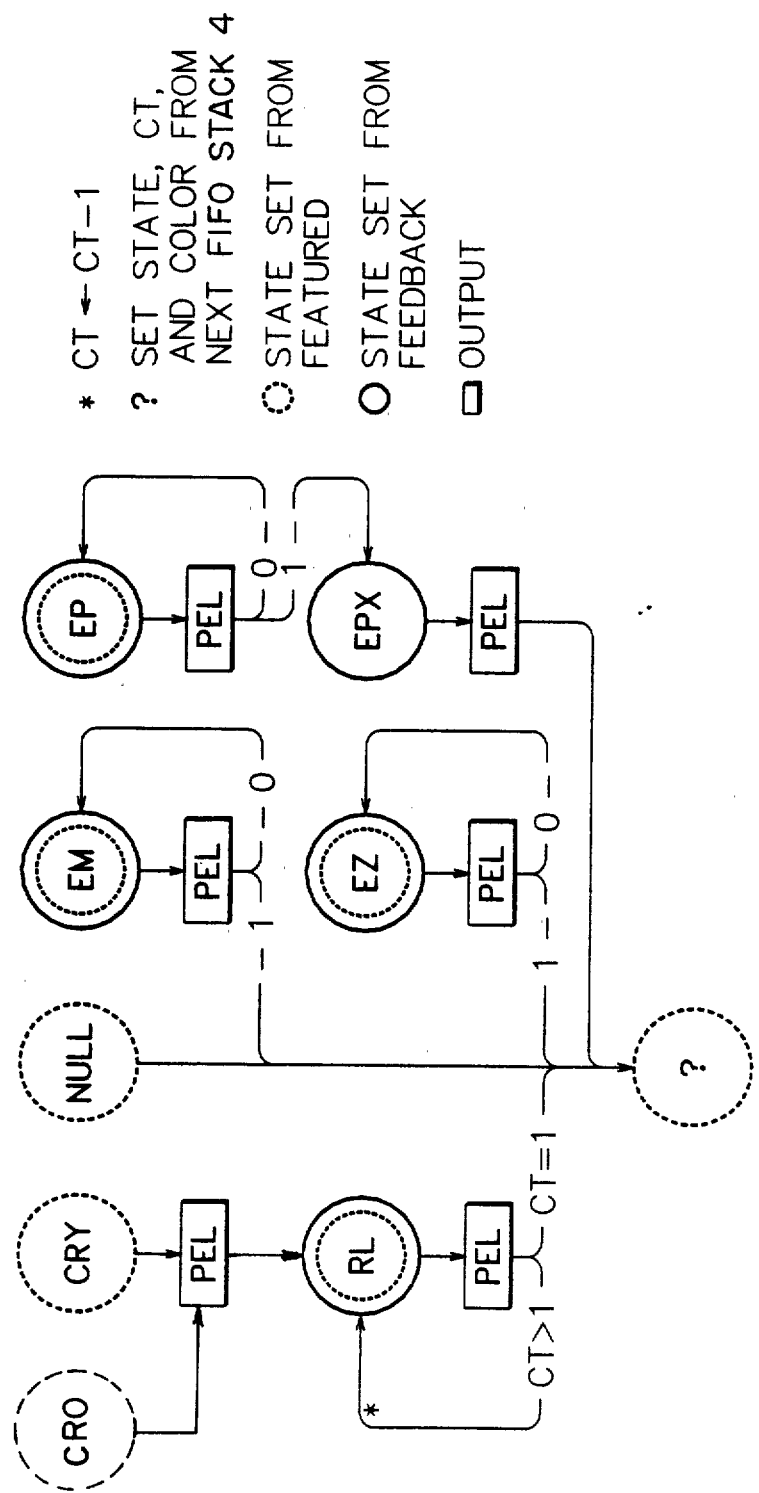
FIG. 36 STATE DIAGRAM FOR DECODER STEP 3

DYNAMIC STACK DATA COMPRESSION AND DECOMPRESSION SYSTEM

DESCRIPTION

1. Technical Field

This invention relates to image data processing systems such as facsimile systems of the kind which utilize vertical reference coding and run-length coding to achieve compression of the binary data representing an image or picture.

2. Background Art

Sophisticated techniques have been developed for compressing the digital data representing the picture elements (pels) in facsimile or other image data handling systems. One such technique is "run-length coding", which causes each unbroken run of black or white pels to be represented by a unique code word that designates the number of pels in that run, such code words generally having fewer bits than the number of pels in the runs which they represent. These codes words are of variable lengths, with the shorter code words being assigned to the more frequently occurring run-lengths, thereby enhancing the compressive effect. In 1952, D. A. Huffman described in his paper "A Method For The Construction of Minimum-Redundancy Codes" how to generate optimum variable length codes. A coding scheme of this type, known as the "Modified Huffman Code", has been accepted as a one-dimensional coding standard by the International Telegraph and Telephone Consultative Committee (CCITT), an international body organized to study, evaluate and establish technical standards for the communications industry.

In the use of run-length coding it has also been recognized that sub-optimal codes could be created in simple ways. Various examples exist in the prior art of techniques which take advantage of the bit pattern in the run-length count in making the code assignments. An example of such a system may be found in an article by Y. Yamazaki, Y. Wakahara, and H. Teramura, "Digital Facsimile Equipment 'Quick-FAX' Using A New Redundancy Reduction Technique," NTC 1976, 6.2-1 (1976). Most of the bits for the run-length codes have been extracted directly from the run-length counter.

Two-dimensional coding utilizes the information contained in a plurality of scan lines including the currently scanned line and at least one previously scanned line to determine the choice of code words. In one form of two-dimensional coding known as "vertical reference" or "vertical correlation" coding, white-to-black and black-to-white color changes or transitions in the current scan line are related to corresponding color changes or transitions in the preceding scan line. This type of coding is most useful in those situations where the current and previous color changes are aligned or very nearly aligned vertically with each other. If, for example, the position of a color change in the current line is vertically aligned with the position of a corresponding color change in the preceding line, or is displaced horizontally therefrom by only a very small amount, then the current color change position is coded with reference to the position of the corresponding color change in the preceding line.

One may combine the two types of data compression discussed above (namely, one-dimensional run-length coding and two-dimensional vertical reference coding) into a single coding scheme which automatically selects in each particular instance the type of coding which will yield the greater compression under the circumstances. Such a coding procedure often is referred to as "vertical reference/run-length" coding. For convenience, however, the expressions "vertical reference/run-length" coding and "two-dimensional" (2D) coding will be treated hereinafter as being synonymous for the purpose of this description. An early reference to 2D coding appears in Laemmel, A.E., "Coding Processes For Bandwidth Reduction in Picture Transmission", Report R-248-51, PIB-187, Polytechnic Institute of Brooklyn, N.Y., 29 (1951).

Many images, notably text and line drawings, show strong vertical correlation from line-to-line, arising from the continuity of edges. Some techniques which have been used to take advantage of this vertical correlation are described in various articles of a book entitled "Picture Bandwidth Compression", edited by T. S. Huang and O. J. Tretiak, Gordon and Breach Science Publishers, New York 1972. Another example of a system that utilizes vertical correlation is found in U.S. Pat. No. 3,833,900 entitled "An Image Compaction System".

A recent system which utilizes two-dimensional coding for facsimile images is described in United States Defensive Publication T985,005 published Aug. 7, 1979, as well as an article entitled "Two-Dimensional Facsimile Coding Scheme" by Joan L. Mitchell and Gerald Goertzel published in the ICC 1979 Proceedings of the IEEE Conference Record 8.7.1 (1979).

SUMMARY OF THE INVENTION

It is an object of the present invention to code image data in a compressed form by means of a combination of vertical reference and run-length coding in such a manner that the length of the code that represents segments of an image is inversely related to the frequency of its use.

It is a further object of the present invention to compress image information by assigning the shortest code words to the most frequently appearing vertical reference and/or run-length codes.

It is a further object of the present invention to provide a facsimile data compression system that is adaptive to changes in the image data.

As used herein, the term "TRANSITION" refers to a picture element (pel) located at the boundary of a run (sequence of pels of the same color). In the disclosed embodiment, a TRANSITION is the final element of a run. In most cases, a TRANSITION is accompanied by a color change. The term "HISTORY LINE" refers to the line of pels immediately preceding the line which contains the pels currently being encoded or decoded, as the case may be.

The coding scheme of the present invention utilizes the very short code words to represent conditions of vertical alignment or near alignment, frequently used run-lengths, carries, and repetitions of previous codes.

Vertical reference words are herein designated as "E" codes, where E signifies vertical reference error. The perfect vertical alignment between a transition in the current line and a corresponding transition in the history line is represented by an "error zero" code, herein designated alternatively as "EZ". If the transition currently under consideration is only one pel removed from the perfect vertical alignment with a corresponding transition in the history line, depending on the sense of the misalignment, it will be designated by an "error minus-one" or "error plus-one" code, the former being alternatively designated as "EM", and the latter being alternatively designated "EP". If the extent of vertical misalignment between the corresponding current and history transition has an absolute value exceeding one pel, then (according to the presently disclosed coding scheme) an "E" code will not be used to represent the position of the current transition.

It should be understood, of course, that this coding scheme is subject to variation within the purview of the invention. If desired, vertical misalignments up to several pels and magnitudes may be represented by vertical reference error (E) codes of differing magnitudes However, experience has indicated that in most situations, optimal coding efficiency can be achieved if for short run-lengths, run-length codes rather than E codes are used to designate transition points which are vertically misaligned by more than one pel from their corresponding transition point in the history line. Longer run-lengths are more efficiently coded by allowing codes of vertical errors that are greater than one.

For short run-lengths, the position of the current transition point is represented by a code that designates the position of the particular run-length within one of two stacks of most frequently appearing run-lengths. These stacks are referred to as BLACK or WHITE RL STACKS. Or if the specific run-length is not found within the stack, it is coded by a specific code representing the actual run-length. The code that provides the information regarding the location of the run-length within a stack or table identifies to the decoder where to find the actual run-length size. The run-length designates the horizontal displacement of the current transition from the position of the immediately preceding transition, that is to say, the length of the run that has just been terminated by the current transition. Three different prefixes are used to precede codes for "RL", carries or repeats, respectively.

In general, for commonly occurring documents, it is found that certain run-lengths appear very frequently. For example, run-lengths of black approximately of the size of the width of the character stroke would be very common. In fact, it is not unusual to find that the frequency of occurrence of these run-lengths is the same range as the frequency of occurrence of vertical reference codes. In addition, it is found that some of the frequently occurring runs and vertical references repeat themselves sequentially or almost sequentially. In the invention described herein, these frequently occurring situations are stored within a second pair of dynamic tables or stacks, depending on color, which may be rearranged for each run to be encoded. These are called FEATURE STACKS to distinguish them from the previously described RL STACKS. Once having created the dynamic stacks, it is no longer necessary to code a specific run or a specific vertical reference condition but rather to code the position of that code within the dynamic stacks. Furthermore, if it appears that the condition being coded is near the top of a stack because of its high frequency of use, then that particular condition would receive a short code word.

In the event that the condition to be coded is repeatedly at the top of the FEATURE STACK, then the need to transmit a code word for each transition is eliminated by recognizing a repeat situation. It is sufficient to this case to transmit a value which represents the number of times that the top stack position is successively selected.

For those situations that are not frequently occurring such as long runs that exceed a predetermined number of pels of a particular color, then the information that is transmitted is an indication of the number of repetitions of this fixed size run (the carry), followed by the remainder which is less than the predetermined maximum.

The dynamic stacks which are referred to herein as FEATURE STACKS contain six positions each, in which there is found at any particular time the three most frequently used run-lengths between runs of one through eight for each color and the three possible vertical reference conditions. Specifically, the image to be encoded or compressed has a significant amount of redundancy which translates into the existence of repetitiveness of vertical reference conditions as well as the repetitiveness of certain short run-lengths. These frequently occurring conditions will be represented by the information contained in the feature stack. Since the positions in the feature stack will be represented by the shortest possible code words, this assures a high degree of compression. Particularly, since successive repetitions of the top of the stacks are indicated by a single code word.

BRIEF DESCRIPTION OF THE DRAWINGS

FIG. 1 is a general block diagram of an ENCODER embodying the principles of the invention.

FIG. 2 is a general block diagram of a DECODER embodying the principles of the invention.

FIGS. 3.1 through 3.7 are a series of charts which symbolically depict the arrangement and processing of the picture elements in illustrative images.

FIG. 4 is a block diagram of ENCODER STEP 1 (ENC-1), one of the components of the ENCODER shown in FIG. 1.

FIGS. 5.1 through 5.3 are STATE diagrams functionally depicting the various operations of ENCODER STEP 1.

FIG. 6 is a block diagram of ENCODER STEP 2 (ENC-2), one of the components of the ENCODER shown in FIG. 1.

FIG. 7 is a block diagram of the ENCODER RL STACKS, one of the units in FIG. 6.

FIG. 8 is a block diagram representation of the ENCODER RL STK which is shown twice in FIG. 7.

FIG. 9 is a block diagram representation of a typical STACK which is utilized in various portions of the invention.

FIG. 10 is a block diagram representation of the STK SELECT unit, one of the elements in FIG. 9.

FIG. 11 is a symbolic representation of a "MOVE UP ONE" scheme for the STK SELECT unit.

FIG 12 is a symbolic representation of a "MOVE UP HALF WAY" scheme for the STK SELECT unit.

FIG. 13 is a symbolic representation of a "MOVE TO TOP" scheme for the STK SELECT unit.

FIG. 14 is a logic diagram representation of the SELECT INPUT unit of FIG. 10 for the "MOVE UP ONE" scheme symbolically represented in FIG. 11.

FIG. 15 is a logic diagram representation of the SELECT INPUT unit of FIG. 10 for the "MOVE UP HALF WAY" scheme symbolically represented in FIG. 12.

FIG. 16 is a logic diagram representation of the SELECT INPUT unit of FIG. 10 for the "MOVE TO TOP" scheme symbolically represented in FIG. 13.

FIG. 17 is a logic diagram representation of the SET ENABLE unit of FIG. 10 for the "MOVE UP ONE" scheme.

FIG. 18 is a logic diagram representation for the SET ENABLE unit of FIG. 10 for the "MOVE UP HALF WAY" scheme.

FIG. 19 is a logic diagram representation of the SET ENABLE unit of FIG. 10 for the "MOVE TO TOP" scheme.

FIG. 20 is a block diagram representation of the ENCODER OUTPUT SELECT, one of the components in FIG. 6.

FIG. 21 is a block diagram representation of the ENCODER SELECT LOGIC, one of the units shown in FIG. 20.

FIG. 22 is a block diagram representation of the ENCODER FEATURE STACKS, one of the units shown in FIG. 20.

FIG. 23 is a block diagram representation of the ENCODER FEATURE STK, shown twice in FIG. 22.

FIG. 24 is a logic diagram representation of the ENCODER FEATURE STACK MATCH, one of the units in FIG. 23.

FIG. 25 is a logic diagram representation of the REPEAT DETECT unit, one of the elements shown in FIG. 6.

FIG. 26 is a block diagram representation of the ENCODER STEP 3 (ENC-3), one of the units shown in FIG. 1.

FIG. 27 is a block diagram representation of the DECODER STEP 1 (DEC-1), one of the units shown in FIG. 2.

FIG. 28 is a block diagram representation of the DECODER STEP 2 (DEC-2), one of the units shown in FIG. 2.

FIG. 29 is a logic diagram representation of the EXPAND REPEAT unit of FIG. 28.

FIG. 30 is a block diagram representation of the DECODER FEATURE STACKS unit of FIG. 28.

FIG. 31 is a block diagram representation of the DECODER STK which is shown twice in the DECODER FEATURE STACKS shown in FIG. 30.

FIG. 32 is a block diagram representation of the RUN SELECT unit of FIG. 28.

FIG. 33 is a block diagram representation of the DECODER RL STACKS, one of the units shown in FIG. 32.

FIG. 34 is a block diagram representation of the DECODER STEP 3 (DEC-3), one of the units shown in FIG. 2.

FIG. 35 is a logic diagram representation of the DECODER HISTORY LINE STORE shown in FIG. 34.

FIG. 36 is a STATE DIAGRAM functionally depicting the operation of the DECODER STEP 3.

DESCRIPTION OF THE PREFERRED EMBODIMENT

Before proceeding to a detailed description of the preferred embodiment which is illustrated in the drawings, it will be helpful to consider first a general description of the principles upon which the coding scheme herein disclosed is based. Throughout this description, it is assumed that the scanning direction is from left to right.

As a matter of high statistical probability, a transition (change in color) in the current line will occur in close proximity to a transition in the history line. With the bit pattern of the history line preserved in storage, the pel at a transition point in the line currently being scanned can be compared with the pels in the corresponding and nearby positions in the history line. If the transition currently under consideration is found to occur at a point directly beneath a corresponding transition in the history line, or at a position displaced by only one pel (plus or minus) from that point, then an appropriate "E" code is assigned to the pel at this transition. In establishing the appropriate E code, the vertical reference used is only the first transition of the right kind in the history line. All subsequent transitions in that history line are ignored. Depending upon the particular vertical relationship of the current transition to the reference transition, the code assigned to the pel just mentioned may be EZ (error zero), EM (error minus-one) or EP (error plus-one). In the coding scheme disclosed herein, vertical reference "E" codes are not assigned to transitions in the current line that are misaligned by more than one pel from corresponding transitions in the history line. In theory, however, a wider range of deviation may be permitted. EXAMPLE 1 below shows how E codes may be assigned in various instances. In this and other examples shown herein, "0" represents a white pel and "1" a black pel. The final pel in each run is regarded as a transition or color change element.

EXAMPLE 1

| History line | 0 | 0 | 1 1 0 | 0 0 0 | 0 1 | ... |
|---|---|---|---|---|---|---|
| Current line | 0 | 0 | 1 1 1 | 0 0 0 | 1 1 | ... |
| | | | ↑ | ↑ | ↑ | |
| | | | EZ | EP | EM | |

Since the current line is being encoded in real time, the system needs to determine whether the pel currently being examined is the last element of a run in one color and will be followed by a run of the other color, or whether the run will continue through one or more additional pels of the same color. Hence, even through a transition to the other color had occurred in the history line at a vertical column aligned with the position of the current pel or displaced by not more than one pel from it, this has no significance unless the run stops at the position currently being examined. If, as the scan continues, it is found that the current line does not contain a transition that can be vertically correlated with the first transition in the history line to the right of the position where the current run started, then no further attempt will be made to define the end of the current run by an E code, and a run-length code will be assigned to it.

EXAMPLE 2 below shows what code word would be assigned to each of the pels of a current run to the right of the last transition (in accordance with conventional practice) if the run were to end at that position, assuming an uninterrupted pel count. In this example, the E codes have the meanings explained above. Run-length codes are designated by the color (W or B) and a number representing the pel count at that point in the present run.

EXAMPLE 2

| History line | 1 | 1 | 0 | 0 | 0 | 1 | 1 | 0 | 1 | ... |
|---|---|---|---|---|---|---|---|---|---|---|
| Current line | 1 | 0 | 0 | 0 | 0 | 0 | 0 | 0 | | 1.. |
| | | ↑ | ↑ | ↑ | ↑ | ↑ | ↑ | ↑ | ↑ | |
| Code assigned to end of run | | RL W1 | RL W2 | RL W3 EM | RL W4 EZ | RL W5 EP | RL W6 | RL W7 | RL W8 | |
| Pel count | | 1 | 2 | 3 | 4 | 5 | 6 | 7 | 8 | |

Considering this example in detail, if the first pel in the current white run were to end that run, it would be encoded RLW1. Similarly, if the second white pel were the final one, the run would be encoded RLW2. Neither of these events has occurred. At the third pel in the present run a decision must be made, because in the history line the white run ended at the next succeeding position. If the current white run should end at the present position (where the pel count is 3), then this position could properly be encoded as EM or RLW3. For the greatest coding efficiency, the one with the shortest code should be chosen. In this case, however, the assumption would be incorrect, because the present run does not end at the third pel. The scan then progresses to the next pel. If the pel in this next position were the last white pel of the present run, then it would be proper to assign an EZ code or RLW4 to it, because in the history line the white run likewise ended at that same position. Similarly, an EP code or RLW5 would be assigned to the fifth white pel in the current run if it were the end of the run in this particular example. None of these tentative "E" code assignments can be made in the present example, however, because the current white run continues past the point where any of these E codes could have been validly assigned to the end of the run. The remaining pels of the present white run accordingly are assigned tentative RL codes indicating the numerical pel counts associated with those positions. In this example, where the white run under consideration is eight pels in length, the final pel in this run would be encoded RLW8.

In using the two-dimensional (2D) encoding system of the present invention, the history for the first line of a document is set to all white since no such line exists. On that first line all transitions will be coded as run-length codes since there are no transitions in the history. For subsequent lines the encoding mode is two-dimensional, meaning that the system is free to encode each transition optionally as a vertical reference code or a runlength code, choosing the shortest code to achieve optimum coding efficiency.

The encoding algorithm which is herein disclosed will function normally in such fashion that all encoding will be either one-dimensional, or alternatively two-dimensional. That is, the encoder is capable of operating exclusively in one of two modes of operation depending on the particular read-only memories that are utilized.

Wraparound/Carry and Repeat

U.S. Defensive Publication No. T985,005 published Aug. 7, 1979 describes a technique designated as "Wraparound" for treating a raster scan image as a continuous pel stream for compression and decompression purposes. The rightmost pel on a scan line is not considered a transition element unless the leftmost pel on the next line has a different color. If both pels are the same color, the run is continued or wrapped around to the next line. For purposes of determining the history transitions, the pels on the current scan line are considered to be a continuation of the history line. Thus, the two-dimensional raster image is treated as one continuous stream of pels. For each pel in this stream, there is a history pel which is the pel in the corresponding position on the preceding line.

The wraparound capability makes it possible to generate runs of very great lengths in those instances where many consecutive lines are of uniform color. These long runs can occur only rarely since large segments of the image are encoded with each such run. In the present system, rather than have the run-length table include codes for all run-lengths up to the total pels in an image, a unique "carry" code is generated each time the run count exceeds the maximum allowed run-length size and the run counter is reset as if to start a new run. The final coding for such long runs is not completed until the total number of "carries" is determined. The run is coded as a run-length or repeat count of "carries". The remainder of the pels in the run then are represented by the appropriate code word.

A similar repeat capability provides the function of identifying sequential conditions which appear at the top of the FEATURE STACKS. In this case, all that need be transmitted is the number of times that the condition which is at the top of the FEATURE STACKS reappears consecutively.

These and other advantageous aspects of the disclosed system are pointed out more particularly in the detailed portions of the description which follow.

Encoder

FIG. 1 shows the preferred embodiment of the principal components that comprise a novel encoding apparatus that utilize the invention. Associated with this encoder is an optional SCANNER 1 of conventional type which is capable of supplying a series of signal inputs to the encoder. These signals are binary signals which denote whether the pel (if any) which currently is being sensed by the scanner is (B) or (W). When the SANNER is sensing the picture or image, the pel which currently is being sensed is called the "current pel" or "CP". In the present description, it will be assumed that a black pel is represented by a "1" bit and a white pel (or no pel) by a "0" bit. During periods when the picture is not being scanned, the CP is zero.

It should be noted that the present embodiment operates by means of sequential logic. That is, information is input into the system, from the scanner only after a complete machine cycle. Each stage in the system drives a subsequent stage until all the information ripples through to a final output message MSG. Furthermore, it should be understood by those skilled in the art, that the SCANNER 1 provides sequential binary signals to the encoder at an appropriate time that permits each current pel binary signal to be fully encoded by the encoder before providing the subsequent current pel CP.

The CP signal from the output of the SCANNER is fed into the HISTORY DELAY 2 which may be formed from a conventional delay line. The HISTORY DELAY 2 provides as output a binary signal that represents the "history pel look ahead" "HPLA". The delay is the length of a raster scan line minus one (LL-1). Both the HPLA and CP signals are fed into the ENCODER STEP 1 (ENC-1) which is shown in FIG. 1 as unit 3. For each encoding cycle of the system, the SCANNER 1 provides one CP binary signal. The binary signal CP is then, by means of the HISTORY DELAY 2 and an internal delay in the ENCODER STEP 1, used to create three basic binary signals which are operated on by the ENCODER STEP 1. These three signals are the current pel CP, the history pel HP, and the history pel look ahead HPLA. The history pel is the pel directly above the current pel and the history pel look ahead is the pel directly adjacent to the right of the history pel on the line above the one presently being scanned. The ENCODER STEP 1 is described in further detail hereinafter.

The ENCODER STEP 1 provides four outputs that are fed into the FIFO STACK 1 (First In First Out), shown as unit 4 in FIG. 1. The "COLORA" output line provides a signal to the FIFO STACK 1 indicating whether the previous pel color is black or white. This is the color of the transition pel being coded. The "RLCTA" cable represents ten signal lines that indicate the run-length count associated with the CP. The "FEATUREA" cable provides three lines representing the feature associated with the CP. In addition, the "LD1" line provides a path for a load signal to be input to the FIFO STACK 1 to control its operation.

The FIFO STACK 1, as well as all of the FIFO stacks described in this embodiment, are simple structures that are interjected between successive encoding units for the purpose of buffering the information. Thus, they comprise nothing more than a set of registers that is capable of holding the output information from a preceding encoding stage until such time as the successive encoding stage is capable of accepting that information. In view of the simplicity of the FIFO stacks, no further description is considered to be necessary to explain the operation of this trivial device to those skilled in the art.

It should be noted that the last letter of the output signal names are denoted by the letter "B" as opposed to "A" at the output of the FIFO STACK 1.

Referring back to the ENCODER STEP 1, FEATUREA provides information which designates a specific feature for each run. The features are specified across a three bit cable designated FEATUREA. In conjunction with the features, as part of the information available is the contents of the run-length counter. This information appears in the form of the ten bits across the cable identified by RLCTA. Whenever the LD1 signal appears at the output of ENC-1, the FIFO STACK 1 knows that new data is to be stored in the FIFO STACK 1 to be available to ENCODER STEP 2 (ENC-2), identified as unit 5 in FIG. 1.

The FIFO STACK 1 provides as output two cables, "FEATUREB" (3 bits) and "RLCTB" (10 bits) as well as a line indicating the color, "COLORB". This information forms the input to ENCODER STEP 2 (ENC-2), identified as unit 5 in FIG. 1. ENCODER STEP 2 receives the pertinent feature, run-length, and color information. It controls the run-length and feature stacks as well as identifies repeat conditions. The ENC-2 output provides four bits of information on the "OUTA" cable which is a function of the feature or its stack position as well as the run-length. A count is also provided on cable "CTOUT" as an output to be fed into the FIFO STACK 2, identified as unit 6 in FIG. 1. The FIFO STACK 2 provides proper buffering between ENC-2 and ENC-3 system. The data fed into the FIFO STACK 2 is identical to the data that is output of the FIFO STACK 2. This buffering action permits proper sequential logic operation. The entry and exit of data to and from the FIFO stacks are controlled by bit signals appearing on the "LD" and "RD" lines.

The output of the FIFO STACK 2 is provided on three cables: "OUTB" (4bits), "CTH" (5 bits) and "CTL" (5 bits). This information present on the three cables is essentially the output information obtained from ENCODER STEP 2 properly buffered by the FIFO STACK 2, unit 6. The ENCODER STEP 3 (ENC-3), identified as unit 7 in FIG. 1, takes the count divided in two separate sections, that is, the high count CTH and the low count CTL. The final encoding step ENC-3 provides 17 bits of output. This gives a compressed data form, identified as the 11 bits in cable "DATA", a "COUNT" consisting of 4 bits, and a data valid signal identified as "DV". In conjunction with these 16 bits of information, a "RD2" signal is fed back to the FIFO STACK 2 to signal the next input into ENCODER STEP 3 and which then keeps the sequential logic in operation. The 16 bits of output from ENCODER STEP 3 are loaded into a transmitter "XMTR", identified as unit 8 in FIG. 1. This transmitter is of conventional design and transmits the encoded message MSG onto the appropriate communication line. The 4 bits of COUNT specify how many of the 11 bits of DATA are significant. The MSG actually transmitted under the control of COUNT could vary from zero to eleven.

Decoder

The DECODER shown in FIG. 2 contains three principal decoding steps which are separated by FIFO STACKS that provide the proper buffering between these three sections. In essence, each of the decoder steps are the logical inverse of their respective encoder operations described above. DECODER STEP 1 (DEC-1), shown as unit 21, identifies the code word MSG which is introduced sequentially bit-by-bit. As the point in time in which an entire message has been compiled in DECODER STEP 1, including the run-length where appropriate, the output of DEC-1 is loaded into FIFO STACK 3 identified as unit 22 in FIG. 2. In this manner, DEC-1 receives the message and provides the first level of decoding. The output of the DECODER STEP 1 as buffered by the FIFO STACK 3 presents two groups of information: "OUTPUTB" which consists of 4 bits and "COUNTB" which consists of 10 bits. These two cables OUTPUTB and COUNTB are input into the DECODER STEP 2 (DEC-2) which is identified as unit 23 in FIG. 2. The function of DEC-2 is to decode the information assembled from the message MSG and structure it in terms of the feature, color and run-length count associated with the particular pels that are to be decoded. This information is presented by means of cable "FEATUREC" (3 bits), line "COLORC" and cable "RLCTD" (10 bits), all of which is loaded into FIFO STACK 4 identified as unit 24 in FIG. 2.

DECODER STEP 3 (DEC-3) which is identified as unit 25 in FIG. 2 takes the information from the FIFO STACK 4 and converts it into data suitable for driving a printing device (not shown) that is capable of recording the decoded condition of the pels that are a reconstruction of the pels that were coded by the encoder of FIG. 1. The DEC-3 requests information from the FIFO STACK 4 by means of a RD4 line that provides a control signal bit at the RD input to FIFO STACK 4. It also outputs the pel available "PEL" signal and a data out "DO" signal which specifies whether the pel is "0" or "1".

Before detailing the principal units in the encoder and decoder, FIGS. 3.1-3.7 will be used to clarify how wraparound is used in this system. FIG. 3.1 illustrates a small image of five pels on four scan lines. The pels have been numbered to demonstrate the order in which they are processed as current pels. FIG. 3.2 shows the same pels as a continuous pel stream. The current line is the bottom row of pels. The history line is the top row of pels.

Note how the first five current pels representing the top scan line have W standing for white pels as their history pels. The sixth current pel has the first pel as its history pel. Referring to FIG. 3.1 makes this relationship obvious. FIGS. 3.3-3.7 show the HPLA and CP inputs to ENCODER STEP 1 for an image on sequential cycles.

Having thus described the general structure of both the encoder and decoder that would comprise an entire system that makes use of this invention, further attention will now be given each of the principal units of both the encoder and decoder.

ENCODER STEP 1

Referring now to FIG. 4, there is shown a block diagram of the ENCODER STEP 1 (ENC-1). The ENC-1 receives two input signals, the history pel lookahead, HPLA and the current pel, CP. By means of register 41, which provides one unit of delay for the HPLA, the history pel, HP is generated. HP is then available simultaneously with the HPLA and CP signals. All three signals are input to address register 42 which compiles the 7 bits of information that is used as an address for read-only memory ROM 43. The 7 bit address is used to select the appropriate combinations of bits which are output from the ROM.

The ROM 43 is essentially a table look-up unit that presents a coded form of information representing the state of the encoder as well as information regarding the run length, the feature, and the color of the pel that is to be encoded.

The ACTION output line from the ROM 43 provides input to a counter, CTR, whose output indicates the run-length count as identified by 10 bits of information, RLCTA. As indicated in FIG. 4, for every signal appearing on the ACTION line there are two possible effects for the CTR 44. If the ACTION line has a zero on it, the inverter 45 will create a 1 signal bit thus initializing the counter to 1 at the LD input to CTR 44. For all situations in which the ACTION line presents a 1 bit of information, counter 44 is incremented at the INC input. This will add 1 to the counter 44 until such time that CTR is equal to 1023, causing an output bit on the CO output. This results in AND gate 45 presenting a 1 bit at its output, which is an additional bit of information for the feedback state represented as a 4 bit cable going back to the address register 42.

In order to understand the operation of ENC-1, reference should be made to FIGS. 5.1, 5.2 and 5.3 which show the STATE diagrams represented by the ROM 43. FIG. 5.1 shows the STATE diagram for the one-dimensional operation. The combination of FIGS. 5.2 and 5.3 show the STATE diagram for the two-dimensional operation of the machine.

In the lower portion of FIG. 5.1, there is shown a table of the symbols utilized in the STATE diagrams which should facilitate their understanding. Specifically, the circle designation indicates the state of the machine, the square or rectangle identifies the feature that is being represented and the A and B characters identify whether the counter is less than or equal to its maximum count of 1024. The counter actions CT can either be an initialization to the level 1 or an incrementation by 1 unit for each access to the ROM. A full description of the acronyms used in the STATE diagrams is contained in the following TABLES I and II.

TABLE I

| States of ENC-1 | |
|---|---|
| DRLW | 1D Run-length white |
| DRLB | 1D Run-length black |
| SW | Start white |
| EZW | Error zero white |
| EPW | Error plus-one white |
| RLW | 2D Run-length white |
| SB | Start black |
| EZB | Error zero black |
| EPB | Error plus-one black |
| RLB | 2D Run-length black |

TABLE II

| Features | |
|---|---|
| DRLW | 1D Run-length white |
| DCROW | 1D Carry followed by zero white |
| DCRYW | 1D Carry white |
| DRLB | 1D Run-length black |
| DCROB | 1D Carry followed by zero black |
| DCRYB | 1D Carry black |
| RLW | 2D Run-length white |
| EMW | Error minus-one white |
| CROW | 2D Carry followed by zero white |
| EZW | Error zero white |
| EPW | Error plus-one white |
| RLB | 2D Run-length black |
| EMB | Error minus-one black |
| CROB | 2D Carry followed by zero black |
| EZB | Error zero black |
| EPW | Error plus-one black |

STATE DIAGRAM FOR ENCODER STEP 1

Referring now to FIG. 5.1, there is shown a STATE DIAGRAM for the ENCODER STEP 1 that applies to one-dimensional operation. That is, this is the state diagram that represents the action of the read-only memory 44 when the system is operating only in run-length coding. As was described previously, the apparatus described herein may operate in a one-dimensional mode or a two-dimensional mode.

The ROM 44 is loaded with either a ROM table for a one-dimensional mode of operation or a different ROM table for a two-dimensional mode of operation. The complete ROM table that is used for a one-dimensional mode of operation is shown in TABLE III. In the column headed "Address" there is shown the inputs to the ADDR REG 42 which comprise the search argument for the ROM 44. Thus, the three bits of the feedback state are combined with the counter CO bit plus the three bits of new input (CP, HP and HPLA). The output of the ROM 44 is then indicated in the column "ROM Word" by a combination of those bits that represent the next state, the feature, color, and the action. In order to attain the full bit pattern represented by the ROM word shown in TABLE III, reference should be made to TABLE V which contains the bit assignments for each of the states of the ENC-1.

Referring back again to FIG. 5.1, by designation the ENC-1 begins in the DRLW state which means one-dimensional run-length white. If given the DRLW state and the additional input to the address register 42 indicating that the count is less than 1024 (A) and the current pel is white (zero bit), then the ENC-1 will remain in the DRLW state. If, on the other hand, the counter has reached a value of 1024 (B), then the feature identified is DCRYW which means one-dimensional carry white. The two asterisks on the output of the DCRYW feature box indicate that the counter is reset to 1 and the data path takes the ENC-1 back to the DRLW state.

Considering now a situation where the ENC-1 is in the DRLW state and the CP is a binary one, indicating a change in color. In this situation, the path from the DRLW state would be either to a feature DRLW or DCROW depending on whether the counter was less than or equal to 1024. In any event, the path to be taken is again indicated by two asterisks (resetting the counter) and a change of state for the ENC-1 to state DRLB meaning one-dimensional run-length black.

In a similar manner, it is possible to trace through all of the possible conditions in the state diagram shown in FIG. 5.1. However, since this is a trivial step, no further explanation is considered to be necessary in view of the fact that all of these possible conditions are fully listed in TABLE III.

TABLE III

1D ROM

| Address | | | ROM Word | | |
|---|---|---|---|---|---|
| Fbstate State | CO | New Input | Next State | Feature Color | Action |
| DRLW | 0 | 0-- | DRLW | | INC |
| DRLW | 0 | 1-- | DRLB | DRL W | LD |
| DRLW | 1 | 0-- | DRLW | DRCY W | LD |
| DRLW | 1 | 1-- | DRLB | DCRO W | LD |
| DRLB | 0 | 0-- | DRLW | DRL B | LD |
| DRLB | 0 | 1-- | DRLB | | INC |
| DRLB | 1 | 0-- | DRLW | DRCO B | LD |
| DRLW | 1 | 1-- | DRLB | DCRY B | LD |

Referring now to the combination of FIGS. 5.2 and 5.3, there is shown a state diagram for the ENCODER STEP 1 when it is operating in a two-dimensional mode. As indicated previously, in this mode of operation, ROM 44 would be loaded with a specific table to carry out the logic shown in the state diagram of FIGS. 5.2 and 5.3. The specific ROM table for the two-dimensional mode of operation is completely shown in TABLE IV.

It should be noted that for either 1D or 2D operations, the ENC-1 must first be initialized. This requires that, for 1D, the STATE begins as DRLW and for 2D, as SW. The HISTORY DELAY is set to zero, representing white. Further, it should be understood that all other registers in the system are reset to contain zeroes as part of the initialization process, unless otherwise specified.

TABLE IV

2D ROM

| Address | | | ROM Word | | |
|---|---|---|---|---|---|
| Fbstate State | CO | New Input | Next State | Feature Color | Action |
| SW | 0 | 000 | SW | | INC |
| SW | 0 | 001 | EZW | | INC |
| SW | 0 | 01- | SW | | INC |
| SW | 0 | 100 | SB | RL W | LD |
| SW | 0 | 101 | SB | EM W | LD |
| SW | 0 | 110 | EZB | RL W | LD |
| SW | 0 | 111 | SB | RL W | LD |
| SW | 1 | 000 | SW | CRY W | LD |
| SW | 1 | 001 | EZW | CRY W | LD |
| SW | 1 | 01- | SW | CRY W | LD |
| SW | 1 | 100 | SB | CR0 W | LD |
| SW | 1 | 101 | SB | EM W | LD |
| SW | 1 | 110 | EZB | CR0 W | LD |
| SW | 1 | 111 | SB | CR0 W | LD |
| EZW | 0 | 0-- | EPW | | INC |
| EZW | 0 | 10- | SB | EZ W | LD |
| EZW | 0 | 110 | EZB | EZ W | LD |
| EZW | 0 | 111 | SB | EZ W | LD |
| EZW | 1 | 000 | SW | CRY W | LD |
| EZW | 1 | 001 | EZW | CRY W | LD |
| EZW | 1 | 01- | SW | CRY W | LD |
| EZW | 1 | 10- | SB | EZ W | LD |
| EZW | 1 | 110 | EZB | EZ W | LD |
| EZW | 1 | 111 | SB | EZ W | LD |
| EPW | 0 | 0-- | RLW | | INC |
| EPW | 0 | 10- | SB | EP W | LD |
| EPW | 0 | 110 | EZB | EP W | LD |
| EPW | 0 | 111 | SB | EP W | LD |
| EPW | 1 | 000 | SW | CRY W | LD |
| EPW | 1 | 001 | EZW | CRY W | LD |
| EPW | 1 | 01- | SW | CRY W | LD |
| EPW | 1 | 10- | SB | EP W | LD |
| EPW | 1 | 110 | EZB | EP W | LD |
| EPW | 1 | 111 | SB | EP W | LD |
| RLW | 0 | 0-- | RLW | | INC |
| RLW | 0 | 10- | SB | RL W | LD |
| RLW | 0 | 110 | EZB | RL W | LD |
| RLW | 0 | 111 | SB | RL W | LD |
| RLW | 1 | 000 | SW | CRY W | LD |
| RLW | 1 | 001 | EZW | CRY W | LD |
| RLW | 1 | 01- | SW | CRY W | LD |
| RLW | 1 | 10- | SB | CR0 W | LD |
| RLW | 1 | 110 | EZB | CR0 W | LD |
| RLW | 1 | 111 | SB | CR0 W | LD |
| SB | 0 | 000 | SW | RL B | LD |
| SB | 0 | 001 | EZW | RL B | LD |
| SB | 0 | 010 | SW | EM B | LD |
| SB | 0 | 011 | SW | RL B | LD |
| SB | 0 | 10- | SB | | INC |
| SB | 0 | 110 | EZB | | INC |
| SB | 0 | 111 | SB | | INC |
| SB | 1 | 000 | SW | CR0 B | LD |
| SB | 1 | 001 | EZW | CR0 B | LD |
| SB | 1 | 010 | SW | EM B | LD |
| SB | 1 | 011 | SW | CR0 B | LD |
| SB | 1 | 10- | SB | CRY B | LD |
| SB | 1 | 110 | EZB | CRY B | LD |
| SB | 1 | 111 | SB | CRY B | LD |
| EZB | 0 | 000 | SW | EZ B | LD |
| EZB | 0 | 001 | EZW | EZ B | LD |
| EZB | 0 | 01- | SW | EZ B | LD |
| EZB | 0 | 1-- | EPB | | INC |
| EZB | 1 | 000 | SW | EZ B | LD |
| EZB | 1 | 001 | EZW | EZ B | LD |
| EZB | 1 | 01- | SW | EZ B | LD |
| EZB | 1 | 10- | SB | CRY B | LD |
| EZB | 1 | 110 | EZB | CRY B | LD |
| EZB | 1 | 111 | SB | CRY B | LD |
| EPB | 0 | 000 | SW | EP B | LD |
| EPB | 0 | 001 | EZW | EP B | LD |
| EPB | 0 | 01- | SW | EP B | LD |
| EPB | 0 | 1-- | RLB | | INC |
| EPB | 1 | 000 | SW | EP B | LD |
| EPB | 1 | 001 | EZW | EP B | LD |
| EPB | 1 | 01- | SW | EP B | LD |
| EPB | 1 | 10- | SB | CRY B | LD |
| EPB | 1 | 110 | EZB | CRY B | LD |

TABLE IV-continued

| 2D ROM | | | | | |
|---|---|---|---|---|---|
| Address | | | ROM Word | | |
| Fbstate State | New CO | Next Input | Feature State | Color | Action |
| EPB | 1 | 111 | SB | CRY B | LD |
| RLB | 0 | 000 | SW | RL B | LD |
| RLB | 0 | 001 | EZW | RL B | LD |
| RLB | 0 | 01- | SW | RL B | LD |
| RLB | 0 | 1-- | RLB | | INC |
| RLB | 1 | 000 | SW | CR0 B | LD |
| RLB | 1 | 001 | EZW | CR0 B | LD |
| RLB | 1 | 01- | SW | CR0 B | LD |
| RLB | 1 | 10- | SB | CRY B | LD |
| RLB | 1 | 110 | EZB | CRY B | LD |
| RLB | 1 | 111 | SB | CRY B | LD |

An image or picture is represented in compressed form by encoding the respective positions or "addresses" of various points at which white to black and black to white transitions are encountered during the line-to-line scanning of the original image or picture. During the 2D operation, if it is possible for a transition in the current scanning line to be encoded with reference to a transition of a corresponding type in the immediately preceding scan line, a vertical reference "E" code may be assigned to the transition currently being encoded. Vertical reference encoding may be permitted when the current transition is vertically aligned with or is displaced horizontally by not more than one pel (plus or minus) from vertical alignment with a reference transition in the history line. The code word assigned to the current transition in this instance will be symbolically represented herein as EZ error zero, EM error minus-one, or EP error plus-one as the case may be.

If the encoder is operating in its 2D mode, but the transition whose address currently is being encoded is not located within a range of plus or minus one pel with respect to a corresponding history line transition, then the current transition must be encoded according to the length of the run which is being terminated by this transition. A run-length code word will by symbolically represented herein by the letters RLW and RLB. The symbol "RL" signifies the run-length and the symbol "W" or "B" denotes whether the run is white or black, respectively.

In order to determine whether the pel that currently is being scanned is a transition (i.e., the last element of a run), the binary value of this pel must be compared with the binary value of the next pel to be scanned. If these two adjacent pels have different values, then the pel to the left is a transition; otherwise it is simply another element of the run. If the last pel was a transition, it is then necessary to determine whether or not its address can be represented by one of the E codes (EM, EZ or EP). To do this, the encoder first must determine whether the pel which occupied the corresponding vertically aligned position in the history line (herein referred to as the "history pel" or "HP") was a transition of the same type, or if not, whether the pel immediately to the right or left of HP was a transition of the same type. If no such vertical correlation exists, then the current transition must be run-length encoded in accordance with the pel count that has been registered between the scanning of the immediately preceding transition and the current transition.

The encoder disclosed herein is able to make all of the determinations that relate to vertical reference coding and run-length encoding by a procedure which involves analyzing a prescribed set of picture element values as each pel is being scanned. These picture element values comprise the current pel (CP), the history pel (HP) and a third value designated HPLA (history pel look ahead), which generally is the pel to the right of HP in the history line. The spatial relationships of CP, HP and HPLA under various conditions are indicated in FIGS. 3.1-3.7, which will be discussed hereinafter in describing the specific functions of the encoder. These three items of data, along with other input information, will determine the "state" assumed by the ENC-1 unit 3, FIG. 1.

FIGS. 3.1-3.7 are a series of views depicting in a simple manner the information generated by the scanner in each of a sequence of cycles. From this graphic illustration it should be appreciated that the ENCODER does not consider scan line edges. FIG. 3.1 illustrates a 5 pel by 4 line document. The scanned pels for this document are shown as a continuous pel stream in FIG. 3.2. The first five W's represent five white pels for history initialization for the initial scan line. For the purpose of further illustration, it is assumed that the page or document has four scan lines of eight pels each. FIG. 3.3 depicts the action when the scanner is sensing the sixth pel in the third line. FIGS. 3.4-3.7 depict the actions in subsequent cycles. In each instance, the scanner-generated information is furnished to the ROM address register 42 during that cycle.

Considering FIG. 3.3, the scanner-generated input information comprises the CP (the pel currently being sensed in the third line, sixth position), HP (the pel which previously had been scanned in the second line, sixth position, and which now is emerging from the register 41 and HPLA (the pel which previously had been scanned in the second line, seventh position, and which now is emerging from the history line store 2). These 3 bits CP, HP and HPLA are applied directly to the ROM address register 42.

A similar action takes place in the next cycle depicted by FIG. 3.4 where CP now is the seventh bit in the third line, and HP and HPLA respectively are the seventh and eighth bits in the second line.

When the last pel in the current (third) scan line is reached by the scanner, FIG. 3.5, the HP emerging from store 2 now is the last pel of the second line, but the HPLA now emerging from store 2 is the first pel that was sensed in the current or third line.

Referring once more to FIGS. 5.2 and 5.3, these state diagrams depict, in flowchart form, the codes produced by ENC-1 in response to the various inputs which would be applied to ROM 43 in its different states. They also show the changes in state and/or other actions resulting from such inputs. The circular symbols in these diagrams denote the states of ROM 43. The features produced by ENC-1 and applied through the FIFO STACK 1 to ENC-2 are represented by rectangular symbols. The 4-bit symbols located on the flow lines (such as "A001", for example) denote the A condition for the counter CO bit plus 001 for the CP, HP and HPLA bits as input to the ROM address register 42 (FIG. 4). Counter actions are shown by asterisks: "*" for incrementing the count by one and "**" for the initial loading of the counter (restoring the count to 1).

Referring to FIG. 5.2, in the 2D mode the ENC-1 is initially in the start white SW state as mentioned above. If the counter is less than 1024, then the path taken will be one identified by the letter "A". The bits following the "A" are the current pel, history pel and history pel look ahead. Thus, for example, in the first case if CP, HP and HPLA are all zero and the counter is less than 1024, the state diagram would show a return back to SW. On the other hand, if for example the current pel were indicated a black or a 1 binary information, then the path that would be taken would be to indicate a run-length feature identified as RLW, which would place the ENC-1 in the start black or "SB" state.

Considering another example, if HPLA indicates a 1 while the ENC-1 is in the SW state, the flow path would indicate an increment of the counter by 1 and a change in state of the apparatus to EZW. This in effect begins an examination for a transition on the CP line. Whenever the CP indicates a 1 or a black condition and the apparatus is in either the start white SW, EZW, EPW or RLW states, then the features associated with a white or 0 pel condition are utilized by taking the code associated with that W condition and the next state of the ENC-1 will be one found in FIG. 5.3. Specifically, either SB, EZB, EPB or RLB.

A specific condition which should be noted here is when the counter equals 1024, which is shown in the flow of the state diagram by the "B" as a prefix to the CP, HP, HPLA bits. When the counter equals 1024, a carry condition is established. The appropriate code for a carry would then be selected as representing either the CROW, CROB, CRYW or CRYB. The counter is reset to a value of 1 and the state of the ENC-1 is set to either SW or SB depending on the condition of the pel examined.

In a similar manner as described above, the state diagram flow can be easily traced through all possible conditions depending on the specific three inputs to the address register 42 as well as the feedback information representing the state of the ENC-1 at that particular time. In any event, all of the possible bit arguments for both the 1D and 2D operations are fully listed in TABLE V.

TABLE V

| ENC-1 ROM Bit Assignments |
|---|
| 1D FEATURES |
| 000 NULL |
| 001 DCRO |
| 010 DCRY |
| 011 DRL |
| 2D FEATURES |
| 000 NULL |
| 001 CRO |
| 010 CRY |
| 011 RL |
| 100 EM |
| 101 EZ |
| 110 EP |
| COLOR |
| 0 W |
| 1 B |
| ACTIONS |
| 0 LD (i.e., CT = 1, LD1) |
| 1 INC (i.e., CT = CT + 1, test CO) |
| Counter CO |
| 0 CT < 1023 |
| 1 CT = 1023 |
| 1D STATES |
| 000 DRLW |
| 001 DRLB |
| 2D STATES |
| 000 SW |
| 001 SB |
| 010 EZW |
| 011 EZB |

TABLE V-continued

| ENC-1 ROM Bit Assignments |
|---|
| 100 EPW |
| 101 EPB |
| 110 RLW |
| 111 RLB |
| CO Input |
| 0 CT < 1024 |
| 1 CT = 1024 |
| 1D INPUT |
| (CP) |
| 0- - |
| 1- - |
| 2D INPUTS |
| (CP, HP, HPLA) |
| 000 |
| 001 |
| 010 |
| 011 |
| 100 |
| 101 |
| 110 |
| 111 |

ENCODER STEP 2

Referring to FIG. 6, there is shown a block diagram representation of the three principal units that comprise the ENCODER STEP 2 (ENC-2) of FIG. 1. As mentioned previously, the ENC-2 receives as input the features (FEATUREB), the run-length count (RLCTB), and the color (COLORB). These inputs are provided to the ENCODER RL STACKS which in effect are a WHITE ENCODER RL STK and a BLACK ENCODER RL STK. Each of these two stacks indicate a priority order of the first 8 run-lengths for either the white or black color.

As output of the ENCODER RL STACKS, there is provided position information of where an appropriate run-length is in either the white or black stack. In combination with the RLPOS information which is 3 bits, there is also output, if the run-length is in the stacks, a "RLDV" signal indicating that the run-length position is valid. The ENCODER OUTPUT SELECT which receives the RLPOS and RLDV information in combination with the FEATUREB makes a selection as to whether or not the run-length code or the vertical reference code should be selected or, in the alternative, to code in accordance with one of the other features. In the event that a carry feature is selected as the output of the ENCODER OUTPUT SELECT, the REPEAT DETECT would be operative. The REPEAT DETECT also looks for repetitions of the top position in the FEATURE STACKS.

Referring now to FIG. 7, there is shown a more detailed block diagram representation of the logical blocks that comprise the ENCODER RL STACKS of FIG. 6. The ENCODER RL STACKS of FIG. 7 shows two stacks, a WHITE ENCODER RL STK and a BLACK ENCODER RL STK. Both of these run-length stacks are identical in structure and are shown in more detail in FIG. 8, to be discussed hereinafter. The run-length move signal RLMV is gated in accordance with the condition of the COLORB to either the WHITE or BLACK ENCODER RL STK or to the MV input of the corresponding stack. What is input into each of these stacks simultaneously is three bits of information representing the low order bits of the counter RLCTB of FIG. 6. Depending also on the color, a selection is made at the MUX in FIG. 7 as to whether the stack position of the WHITE or the BLACK ENCODER RL STK is to be output on the RLPOS line. Furthermore, if the run-length count is less than 9, the run-length data valid signal RLDV is a "1".

As indicated previously, the RL STKS of FIG. 7 are identical in structure. Shown in this FIG. 8, is a logical representation of a typical ENCODER RL STK. As input to the RL STKs, there are the three least significant bits "RLLSB" of the run-length as taken from the run-length count RLCTB. These three bits of information are then compared through a series of eight comparators to determine which value at one out of the eight positions P1 through P8 creates a match with respect to these three low order run-length count bits. The output of the plurality of comparators is fed simultaneously to a STACK and to an ENCODE Box. The STACK is a dynamic unit that rearranges the stack positions for the run-length in accordance with the new data that is input. If the input is equivalent to the highest position in the stack, no change takes place. Otherwise, a rearrangement of the stack will be effected in accordance with one out of a possible three rearrangement schemes, discussed further on in the specification. The ENCODE box merely provides a three bit binary code output representing the position of the particular run-length count that has been input "IN". This output is labeled STKPOS.

Shown in FIG. 9, there is a logical block diagram of the STACK unit of FIG. 8. The operation of the STACK unit is such that it receives as input seven lines P2-P8, along with a move signal "MV" and dynamically rearranges the positions within the stack in accordance with a pedetermined scheme. A plurality of registers REG 1 through REG 8 are provided at the output of the stack for feeding back the values V1 through V8 to the STK SELECT block.

In FIG. 10, there is a logical block diagram representation of the STK SELECT logic of FIG. 9, which provides the dynamic redistribution of the codes within the stack. That is, it rearranges the position of the run-length code within the stack in accordance with a predetermined scheme. It should be noted by those skilled in the art that while this particular embodiment provides three different reordering schemes for the stack, other schemes could be substituted and are within the purview of this invention.

The STK SELECT circuitry is simple in nature and merely provides the appropriate enable gating signals for executing the rearrangement within the stack and feeding back the values as input to the SELECT INPUT box.

As mentioned previously, the SELECT INPUT logic can comprise one of three possible different schemes. They are:
1. MOVE UP ONE
2. MOVE UP HALF WAY
3. MOVE TO TOP Each of these particular move schemes is shown in FIGS. 11-13, respectively, in a symbolic form. Considering first the MOVE UP ONE scheme, the specific run that is input is moved in position one unit up within the stack unless it is at the first position. The position immediately above is displaced downward by one. In the MOVE UP HALF WAY scheme represented in FIG. 12, the run-length that is input moves up approximately half way to the top position within the stack and positions subsequent to and including the one it displaces ripple downward. In the MOVE TO TOP scheme represented in FIG. 13, the run-length that is input immediately moves to the top position within the stack and all run-lengths above the original position within the stack move downward. As is obvious from observation of these three schemes, the one of FIG. 13 has the highest slope in terms of adaptiveness to changes in the image data whereas the scheme of FIG. 11 has the slowest adaptiveness.

Each of the schemes represented in FIGS. 11-13 is shown in detail in its logic form for the INPUT SELECT unit of FIG. 10 in FIGS. 14-16 respectively. As can be seen, for example, by reference to FIG. 14, the run-length in V4 can move into the third or fifth position dependent on whether P4 or P5 were selected. The movement is controlled by a plurality of 12 gates that use the selected positions to effect the rearrangement of values.

The logic structures as shown in FIGS. 15 and 16 are somewhat similar to that of FIG. 14 except that the gating by a selected position in each of these cases will move the new run-length input either half way up the stack or to the first position in the stack. For example, in FIG. 16 it is clearly seen that the OR gate ($\geq 1$) will immediately pass any of the gated run-length positions that come in through the input immediately to the IN1 cable and thus to the number 1 position in the stack. Corresponding to the three schemes shown in FIGS. 14-16, ther are three different SET ENABLE logic structures shown in FIGS. 17-19 respectively, that couple with their SELECT INPUT logic to effect the movement of the run-lengths within the stack. Each of these SET ENABLE logic structures creates the appropriate signals on the EN1-EN8 lines so as to move the run-length positions dynamically within the stack.

Referring now to FIG. 20, there is shown a block diagram representation of the ENCODER OUTPUT SELECT unit of FIG. 6. This unit comprises a SELECT LOGIC structure that will select from either the ENCODER FEATURE STACKS, the RL STKS, or FEATUREB to provide the appropriate input to REPEAT DETECT. It should be noted in FIG. 20, that there is a direct connection of the RLPOS and FEATUREB cables to the multiplexor MUX. In the event that the FEATURE STACKS are not utilized, the data on one of these other cables will be output to REPEAT DETECT. This is seen by the fact that neither the POSE nor the POSR outputs of the ENCODER FEATURE STACKS would be selected by the MUX. Also, the single bit line feeding into the cable inputs to the MUX is a prefix bit for those specific cables. The composite four bits of OUT is shown in TABLE VI along with the other bit assignments for ENC-2.

TABLE VI

| ENC-2 Bit Assignments |
|---|
| Initialize RL STKs |
| 001 V1 |
| 010 V2 |
| 011 V3 |
| 100 V4 |
| 101 V5 |
| 110 V6 |
| 111 V7 |
| 000 V8 |
| RLLSB FIG. 7 (3 least signficant bits from RLCTB) |
| (IN FIGS. 7, 8 meaning of V's in RL STKs) |
| 001 RL 1 |
| 010 RL 2 |
| 011 RL 3 |

TABLE VI-continued
ENC-2 Bit Assignments

```
100 RL 4
101 RL 5
110 RL 6
111 RL 7
000 RL 8
RLPOS FIGS. 6, 7, 20, 21    (STKPOS FIGS. 7, 8)
001 RL STK - P1
010 RL STK - P2
011 RL STK - P3
100 RL STK - P4
101 RL STK - P5
110 RL STK - P6
111 RL STK - P7
000 RL STK - P8
RIN FIGS. 20-24
001 RL STK - P1
010 RL STK - P2
011 RL STK - P3
111 RLPOS out of range or not valid
EIN FIGS. 20-24
100 EM (2D only)
101 EZ (2D only)
110 EP (2D only)
111 Feature not an E.
(meaning of V's in FEATURE STKs)
001 RL STK - P1
010 RL STK - P2
011 RL STK - P3
100 EM (2D only)
101 EZ (2D only)
110 EP (2D only)
Initialize FEATURE STKs
001 V1
010 V2
011 V3
100 V4
101 V5
110 V6
PE, PR FIGS. 22-24; POSE, POSR FIGS. 20, 22
001 FEATURE STK - P1
010 FEATURE STK - P2
011 FEATURE STK - P3
100 FEATURE STK - P4 (2D only)
101 FEATURE STK - P5 (2D only)
110 FEATURE STK - P6 (2D only)
111 No valid match
OUT FIGS. 6, 20, 25; OUTA FIGS. 6, 25
0001 FEATURE STK - P1
0010 FEATURE STK - P2
0011 FEATURE STK - P3
0100 FEATURE STK - P4 (2D only)
0101 FEATURE STK - P5 (2D only)
0110 FEATURE STK - P6 (2D only)
1000 RL STK - P8
1001 DCR0 or CR0
1010 DCRY or CRY
1011 DRL or RL
1100 RL STK - P4
1101 RL STK - P5
1110 RL STK - P6
1111 RL STK - P7
```

Referring now to FIG. 21, there is shown the ENCODER SELECT LOGIC unit of FIG. 20. The ENCODER SELECT LOGIC presents by means of two multiplexors, MUX, the data to be fed to the ENCODER FEATURE STACKS which can be both a vertical reference coming in from FEATUREB and a run-length position input coming in from the RLPOS cable. In the event that one or neither of these cable inputs of EM, EZ or EP from FEATUREB or RLPOS are valid feature stack data, then they respectively will present a 3 bit binary 1 message on the EIN output or the RIN output. If the run-length position RLPOS is greater than 0 and less than 4, and if the run-length data valid RLDV input is up ("1") or if RUSE is down ("0"), then a feature move FMV signal is output to the ENCODER FEATURE STACKS to rearrange the ordering within the feature stacks. In the event that the FEATUREB input cable presents information which would equate with any of the three vertical reference codes, then the MUX will select the FEATUREB data as output code on the EIN cable. A data valid signal on the DVO line is presented for every non-null feature. Further shown in this FIG. 21 is an indication that the RD1 line is always up, to be utilized as a feedback line to the FIFO STACK 1, indicating that information should be fed into the ENCODER STEP 2 on the next cycle.

The output of the ENCODER SELECT LOGIC is fed into the ENCODER FEATURE STACKS which are shown in further detail in FIG. 22. In this figure, there is shown two ENCODER FEATURE STKs, one WHITE and one BLACK. The run-length information RIN and the vertical reference information EIN are fed simultaneously to both stacks. Only one of these stacks will be selected by a multiplexor MUX in accordance with the value of the bit appearing on the COLORB line. In addition to this selection, there is also shown a comparison between the position of the vertical reference and run-length code. If the position of the run-length code is higher up within the stack, then the line RUSE will indicate a 1 signal. Otherwise, a vertical reference code would be selected from the FEATURE STACK. The two encoder feature stacks shown in FIG. 22 each present two outputs: a PR output which gives the position in the stack of RIN and a PE output which gives the position in the stack of the EIN. It should be noted that for 1D operations only 3 positions in the FEATURE STACK would be used.

The ENCODER FEATURE STK is shown in further detail in FIG. 23. It should be noted that the structure of the ENCODER FEATURE STK is identical for both the WHITE ENCODER FEATURE STK and the BLACK ENCODER FEATURE STK shown in FIG. 22. This stack unit of FIG. 23 comprises two main units: a FEATURE STACK MATCH and the STACK itself which has previously described with regard to FIG. 9. For the purpose of simplicity, the STACK shown is identical throughout. The purpose of the ENCODER FEATURE STK is to accept the run-length and vertical reference information on the EIN and RIN lines, compare that information with the present positions within the stack and, if necessary, rearrange the stack in accordance with new information as well as providing output positions on the PR and PE cables.

The FEATURE STACK MATCH is shown in further detail in FIG. 24. This figure illustrates the comparison logic which accepts the new vertical reference or run-length and the position values of those corresponding codes in the stack prior to rearrangement. A comparison is made by two pluralities of comparators, the output of the comparators are encoded to create both a vertical reference position and a run-length position location along the PE and PR cables respectively. Also, the same information which is encoded into a 3 bit output is selected to be fed into the stack as inputs P2, P3, P4, P5 and P6.

As indicated previously, the ENC-2 contains a REPEAT DETECT unit which is shown in FIG. 6 and in greater detail in FIG. 25. The REPEAT DETECT unit operates to provide a count of the number of times that a code is to be repeated due to either multiple carries or multiple top FEATURE STACK positions. In the event that neither is present, it passes the OUT information through to the ENC-3 unit along cable OUTA. The selection of the count of the number of repeats is controlled by means of the DVO signal which is used to increment the counter or reset the counter in accordance with the data present at the OUTA cable. If the OUTA and OUT data are equal and the code pattern of OUTA is carry (1010) or FEATURE STK-P1 (0001), the counter "CTR" will be incremented by 1. If DVO is a binary zero condition, the counter is not changed. The end of a repeat situation is determined by the presence of a LD2 signal. If the OUTA is not equal to "1010" or "0001", then the CTOUT cable presents the RLCTC 10 bits. Otherwise, it selects the CT from the CTR as output CTOUT. The maximum allowed number of repetitions is 1023 so that when CT=1023 in combination with DVO, LD2 presents an end of repeat situation.

ENCODER STEP 3

Referring now to FIG. 26, there is shown the last principal encoding step to be carried out by the encoder of FIG. 1. The ENCODER STEP 3 or "ENC-3" takes the OUTA of the ENC-2 as buffered by the FIFO STACK 2 (OUTB), the five high order bits of the CTOUT, CTH, or the five low order bits of CTOUT, CTL, to create an address ADDR for the ROM of FIG. 26. This ROM provides the appropriate coded information as output to the XMTR 8 in the form of an 11 bit data structure appearing on the DATA cable.

As previously indicated, the inputs to DEC-3 are OUTB (4 bits), the five high order bits of the CTOUT CTH, and the five low order bits of the CTOUT CTL. A leading zero bit is appended to the OUTB information. A multiplexor MUX, shown in FIG. 26, selects from one of the 3 input cables and provides the selected 5 bits as input to the address register ADDR REG. Also, as input to the ADDR REG, there is a 3 bit cable indicating the STATE of the ENC-3 ROM. The composite 8 bits formed from the output of MUX and the 3 bits representing the STATE form an 8 bit address that is used as an input argument for determining the output of the ROM of ENC-3. The complete read-only memory table of the ENC-3 ROM is shown in TABLE VII for the one-dimensional operation and in TABLE VIII for the two-dimensional operation. Reference should also be made to TABLE IX that contains a listing of the bit patterns representing the STATE's of ENC-3 and the 32 possible bit patterns for either the high order bits or low order bits of the counter, represented as CTH or CTL.

TABLE VII
ROM 1D for ENC-3

| Address | | ROM Word | | |
|---|---|---|---|---|
| State | Input | Next State | Count | Output |
| NS | NULL | NS | 0 | |
| NS | FEATURE STK - P1 | HRPT | 0 | |
| NS | FEATURE STK - P2 | NS | 2 | 01 |
| NS | FEATURE STK - P3 | NS | 2 | 10 |
| NS | RL STK - P4 | NS | 5 | 11000 |
| NS | RL STK - P5 | NS | 5 | 11001 |
| NS | RL STK - P6 | NS | 6 | 110100 |
| NS | RL STK - P7 | NS | 6 | 110101 |
| NS | RL STK - P8 | NS | 7 | 1110000 |
| NS | DRL | HRL | 3 | 111 |
| NS | DCRY0 | NS | 11 | 111.11111110 |

TABLE VII-continued
ROM 1D for ENC-3

| Address | | ROM Word | | |
|---|---|---|---|---|
| State | Input | Next State | Count | Output |
| NS | DCRY | HCRY | 11 | 111.11111111 |
| HRL | 00000 | LRL | 0 | |
| HRL | 00001 | LCON | 3 | 110 |
| HRL | 0001X | LCON | 5 | 1110X |
| HRL | 001XX | LCON | 7 | 11110XX |
| HRL | 01XXX | LCON | 9 | 1.11110XXX |
| HRL | 1XXXX | LCON | 11 | 111.1110XXXX |
| LCON | XXXXX | NS | 5 | XXXXX |
| LRL | 00000 | NS | 0 | |
| LRL | 01XXX | NS | 4 | 0XXX |
| LRL | 1XXXX | NS | 6 | 10XXXX |
| HCRY | 00000 | LCRY | 0 | |
| HCRY | 00001 | LCON | 6 | 111110 |
| HCRY | 0001X | LCON | 8 | 1111110X |
| HCRY | 001XX | LCON | 10 | 11.111110XX |
| HCRY | 01XXX | HRL | 3 | 111 |
| HCRY | 1XXXX | HRL | 3 | 111 |
| LCRY | 00000 | NS | 11 | 111.11111110 |
| LCRY | 00001 | NS | 1 | 0 |
| LCRY | 0001X | NS | 3 | 10X |
| LCRY | 001XX | NS | 5 | 110XX |
| LCRY | 01XXX | NS | 7 | 1110XXX |
| LCRY | 1XXXX | NS | 9 | 1.1110XXXX |
| HRPT | 00000 | LRPT | 0 | |
| HRPT | 00001 | LCON | 9 | 1.10111110 |
| HRPT | 0001X | HRL | 6 | 110111 |
| HRPT | 001XX | HRL | 6 | 110111 |
| HRPT | 01XXX | HRL | 6 | 110111 |
| HRPT | 1XXXX | HRL | 6 | 110111 |
| LRPT | 00001 | NS | 2 | 00 |
| LRPT | 00010 | NS | 4 | 0000 |
| LRPT | 00011 | NS | 6 | 000000 |
| LRPT | 001XX | NS | 8 | 110110XX |
| LRPT | 01XXX | NS | 10 | 11.01110XXX |
| LRPT | 1XXXX | LRL | 6 | 110111 |

TABLE VIII
ROM 2D for ENC-3

| Address | | ROM Word | | |
|---|---|---|---|---|
| State | Input | Next State | Count | Output |
| NS | NULL | HS | 0 | |
| NS | FEATURE STK - P1 | HRPT | 0 | |
| NS | FEATURE STK - P2 | NS | 2 | 01 |
| NS | FEATURE STK - P3 | NS | 3 | 100 |
| NS | FEATURE STK - P4 | NS | 4 | 1010 |
| NS | FEATURE STK - P5 | NS | 5 | 10110 |
| NS | FEATURE STK - P6 | NS | 5 | 10111 |
| NS | RL STK - P4 | NS | 5 | 11000 |
| NS | RL STK - P5 | NS | 5 | 11001 |
| NS | RL STK - P6 | NS | 6 | 110100 |
| NS | RL STK - P7 | NS | 6 | 110101 |
| NS | RL STK - P8 | NS | 7 | 1110000 |
| NS | RL | HRL | 3 | 111 |
| NS | CRY0 | NS | 11 | 111.11111110 |
| NS | CRY | HCRY | 11 | 111.11111111 |
| HRL | 00000 | LRL | 0 | |
| HRL | 00001 | LCON | 3 | 110 |
| HRL | 0001X | LCON | 5 | 1110X |
| HRL | 001XX | LCON | 7 | 11110XX |
| HRL | 01XXX | LCON | 9 | 1.11110XXX |
| HRL | 1XXXX | LCON | 11 | 111.1110XXXX |
| LCON | XXXXX | NS | 5 | XXXXX |
| LRL | 00000 | NS | 0 | |
| LRL | 01XXX | NS | 4 | 0XXX |
| LRL | 1XXXX | NS | 6 | 10XXXX |
| HCRY | 00000 | LCRY | 0 | |
| HCRY | 00001 | LCON | 6 | 111110 |
| HCRY | 0001X | LCON | 8 | 1111110X |
| HCRY | 001XX | LCON | 10 | 11.111110XX |
| HCRY | 01XXX | HRL | 3 | 111 |
| HCRY | 1XXXX | HRL | 3 | 111 |
| LCRY | 00000 | NS | 11 | 111.11111110 |
| LCRY | 00001 | NS | 1 | 0 |

TABLE VIII-continued
ROM 2D for ENC-3

| Address | | ROM Word | | |
|---|---|---|---|---|
| State | Input | Next State | Count | Output |
| LCRY | 0001X | NS | 3 | 10X |
| LCRY | 001XX | NS | 5 | 110XX |
| LCRY | 01XXX | NS | 7 | 1110XXX |
| LCRY | 1XXXX | NS | 9 | 1.1110XXXX |
| HRPT | 00000 | LRPT | 0 | |
| HRPT | 00001 | LCON | 9 | 1.10111110 |
| HRPT | 0001X | HRL | 6 | 110111 |
| HRPT | 001XX | HRL | 6 | 110111 |
| HRPT | 01XXX | HRL | 6 | 110111 |
| HRPT | 1XXXX | HRL | 6 | 110111 |
| LRPT | 00001 | NS | 2 | 00 |
| LRPT | 00010 | NS | 4 | 0000 |
| LRPT | 00011 | NS | 6 | 000000 |
| LRPT | 001XX | NS | 8 | 110110XX |
| LRPT | 01XXX | NS | 10 | 11.01110XXX |
| LRPT | 1XXXX | LRL | 6 | 110111 |

TABLE IX
ENC-3 Bit Assignments

States
- 000 NS   NEW STATE
- 001 HRL   HIGH RUN-LENGTH
- 010 HCRY   HIGH CARRY REPEAT
- 011 HRPT   HIGH REPEAT OF TOP POSITION OF FEATURE STACK
- 100 LCON   LOW CONTINUE
- 101 LRL   LOW RUN-LENGTH
- 110 LCRY   LOW CARRY REPEAT
- 111 LRPT   LOW REPEAT OF TOP POSITION OF FEATURE STACK Inputs
(H- ,L-)
00000
00001
00010
00011
00100
00101
00110
00111
01000
01001
01010
01011
01100
01101
01110
01111
10000
10001
10010
10011
10100
10101
10110
10111
11000
11001
11010
11011
11100
11101
11110
11111

Inputs
(NS)
- 00000   NULL
- 00001   RPT (FEATURE STK - P1)
- 00010   FEATURE STK - P2
- 00011   FEATURE STK - P3
- 00100   FEATURE STK - P4 (2D only)
- 00101   FEATURE STK - P5 (2D only)
- 00110   FEATURE STK - P6 (2D only)
- 01000   RL STK - P8

TABLE IX-continued
ENC-3 Bit Assignments

- 01001   DCR0 or CR0
- 01010   DCRY or CRY
- 01011   DRL or RL
- 01100   RL STK - P4
- 01101   RL STK - P5
- 01110   RL STK - P6
- 01111   RL STK - P7

Count
| | |
|---|---|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |

The output of ENC-3 is comprised of an 8 bit code obtained from the ROM output plus 3 bits of FIXED DATA that form leading binary 1 signals to be combined with the 8 output bits. This combination creates an 11 bit DATA cable output. In addition, a COUNT cable (4 bits) represents the binary number that indicates how many of the 11 DATA bits are relevant. The 12 possible binary states of the "COUNT" are shown in TABLE IX.

TABLE IX indicates all possible binary patterns that are utilized for the NS (new state) input to the multiplexor MUX. It should be noted that the leading bit or high order bit of the input is forced to zero in all of the possible combinations. By using the binary bit assignments from TABLE IX, it is possible to construct the binary patterns that would be used to create the search arguments from the ROM.

Referring to TABLES VII and VIII, there is shown that for each particular input address there is a ROM word OUTPUT of 8 bits. It should be noted that where the OUTPUT contains more than 8 bits, the leading bits are separated from the remaining 8 by a decimal point. These leading binary ones are part of the FIXED DATA that is added to the 8 bits of OUTPUT of the ROM.

For the purpose of simplicity, the bit patterns shown in the tables contain X's in combination with the binary 1's and 0's. These X's represent the portions of the CTH or CTL that are utilized to create the OUTPUT. Thus, for example, in TABLE VIII, if we refer to the HRL state with an input of 1XXXX, the four X's represent the 4 bits of information that are contained in the last 4 bits of the CTH. Similarly, if reference is made to the LCRY state and the input 0001X, the X represents the least significant bit of the CTL input. In a similar manner, when referring to the output of the ROM, the X's designate the same substitution from either the CTH or the CTL.

The ENC-3 always begins in the new state "NS" with NULL for OUTB. Depending on the input information that is presented to the ADDR REG, the ROM indicates the NEXT STATE output, the binary number present on the COUNT cable and the DATA 11 bits that are presented to the XMTR transmitter. All of the possible codes that are available for the 1D case are shown in TABLE X and for the 2D case in TABLE XI. It should be noted that the two-dimensional code table of TABLE XI is similar to the one-dimensional code TABLE X with the obvious difference that the one-dimensional code tables omit three codes for FEATURE STK P4-P6 in view of the fact that there is no vertical reference coding in the one-dimensional case. Furthermore, the P3 code in the two-dimensional TABLE XI is 100 as opposed to a code 10 in the one-dimensional case. By means of this distinction, it is possible to make the one-dimensional and two-dimensional tables almost identical in structure.

In examining the code tables of TABLES X and XI, it will be seen that the repeat (RPT), run-length ≧9 (DRL or RL) and carries (DCRY or CRY) have a prefix code. This prefix is repeated for each of the specific cases in that class of code. The X's shown on the right-hand side of the codes represent the low order bits of the counter which would form that portion of the code.

TABLE X

1D Code Table for ENC-3

| | |
|---|---|
| FEATURE STK - P1 | 00 |
| FEATURE STK - P2 | 01 |
| FEATURE STK - P3 | 10 |
| RL STK - P4 | 11000 |
| RL STK - P5 | 11001 |
| RL STK - P6 | 110100 |
| RL STK - P7 | 110101 |
| RPT prefix | 11011 |
| RPT 4-7 | 110110xx |
| RPT 8-15 | 1101110xxx |
| RPT 16-31 | 11011110xxxx |
| RPT 32-63 | 110111110xxxxx |
| RPT 64-127 | 1101111110xxxxxx |
| RPT 128-255 | 11011111110xxxxxxx |
| RPT 256-511 | 110111111110xxxxxxxx |
| RPT 512-1023 | 1101111111110xxxxxxxxx |
| RL STK - P8 | 1110000 |
| DRL prefix | 111 |
| DRL 9-15 | 1110xxx |
| DRL 16-31 | 11110xxxx |
| DRL 32-63 | 111110xxxxx |
| DRL 64-127 | 1111110xxxxxx |
| DRL 128-255 | 11111110xxxxxxx |
| DRL 256-511 | 111111110xxxxxxxx |
| DRL 512-1023 | 1111111110xxxxxxxxx |
| DCRY0 (DRL 1024) | 11111111110 |
| DCRY prefix | 11111111111 |
| DCRY 1 | 111111111110 |
| DCRY 2-3 | 1111111111110x |
| DCRY 4-7 | 11111111111110xx |
| DCRY 8-15 | 111111111111110 |
| DCRY 16-31 | 1111111111111110xxxx |
| DCRY 32-63 | 11111111111111110xxxxx |
| DCRY 64-127 | 111111111111111110xxxxxx |
| DCRY 128-255 | 1111111111111111110xxxxxxx |
| DCRY 256-511 | 11111111111111111110xxxxxxxx |
| DRCY 512-1023 | 111111111111111111110xxxxxxxxx |

TABLE XI

2D Code Table for ENC-3

| | |
|---|---|
| FEATURE STK - P1 | 00 |
| FEATURE STK - P2 | 01 |
| FEATURE STK - P3 | 100 |
| FEATURE STK - P4 | 1010 |
| FEATURE STK - P5 | 10110 |
| FEATURE STK - P6 | 10111 |
| RL STK - P4 | 11000 |
| RL STK - P5 | 11001 |
| RL STK - P6 | 110100 |
| RL STK - P7 | 110101 |
| RPT prefix | 11011 |
| RPT 4-7 | 110110xx |
| RPT 8-15 | 1101110xxx |
| RPT 16-31 | 11011110xxxx |
| RPT 32-63 | 110111110xxxxx |
| RPT 64-127 | 1101111110xxxxxx |
| RPT 128-255 | 11011111110xxxxxxx |
| RPT 256-511 | 110111111110xxxxxxxx |
| RPT 512-1023 | 1101111111110xxxxxxxxx |
| RL STK - P8 | 1110000 |
| RL prefix | 111 |
| RL 9-15 | 1110xxx |
| RL 16-31 | 11110xxxx |
| RL 32-63 | 111110xxxxx |
| RL 64-127 | 1111110xxxxxx |
| RL 128-255 | 11111110xxxxxxx |
| RL 256-511 | 111111110xxxxxxxx |
| RL 512-1023 | 1111111110xxxxxxxxx |
| CRY0 (RL 1024) | 11111111110 |
| CRY prefix | 11111111111 |
| CRY 1 | 111111111110 |
| CRY 2-3 | 1111111111110x |
| CRY 4-7 | 11111111111110xx |
| CRY 8-15 | 111111111111110xxx |
| CRY 16-31 | 1111111111111110xxxx |
| CRY 32-63 | 11111111111111110xxxxx |
| CRY 64-127 | 111111111111111110xxxxxx |
| CRY 128-255 | 1111111111111111110xxxxxxx |
| CRY 256-511 | 11111111111111111110xxxxxxxx |
| CRY 512-1023 | 111111111111111111110xxxxxxxxx |

EXAMPLES OF STACK DYNAMICS

Now having described the complete encoder, reference will be made to Example 4 which will illustrate the dynamics of the run-length and feature stacks for a particular exemplary line of pels in 1D operation. As seen in Example 4, the current line contains a changing pattern of white and black pels. As discussed previously, the 0 pel indicates a white color and the 1 pel indicates a black color. The run-length numbers indicate the number of pels that are of a constant color prior to a transition.

In this example, the values of the COLOR, IN, RLPOS, and RPOS are indicated in table form. Initially, the positions in the run-length stack are ordered so that a run of 1 is in the first position and a run of 2 is in the second position and so on until a run of 8 which is in the eighth position of the stack. Thus, up to the first transition which indicates a run-length of 2 white, the RL position and the RPOS position indicate P2. The code for P2 would also be output. Subsequent to the creation of the P2 code, there is seen a repetition of the code or pel pattern which would be represented by a repeat code of 15 and finally, a detection of a run-length of 3 white which would be found to be in position number 3. Then, the appropriate code for position 3 would be output as the message. The "bits" line of Example 4 indicates the actual bit patterns that the MSG represents for the codes identified by the encoder. The decimal points between segments of the bit pattern represent the logical breakpoints for the codes shown on the line above and are not actually transmitted. The MSG would be composed of a continual serial bit pattern of 1's and 0's.

Example 4 was particularly selected to illustrate the repeated pel pattern of "00101" over 4 run-lengths. The repeats occurring in both color stacks create a sequence of FEATURE STK-P1 outputs.

EXAMPLE 4

| Current line | 0 | 0 |   | 1 | 0 |   | 1 0 0 |   | 1 | 0 |   | 1 0 0 |   | 1 | 0 |   | 1 0 0 |   | 1 | 0 |   | 1 0 0 |   | 0 1 |
|---|---|---|---|---|---|---|---|---|---|---|---|---|---|---|---|---|---|---|---|---|---|---|---|---|
| Color |   | W |   | B | W |   | B | W | B | W |   | B | W | B | W |   | B | W | B | W |   | B | W |   |
| Run Length |   | 2 |   | 1 | 1 |   | 2 | 1 | 1 | 1 |   | 2 | 1 | 1 | 1 |   | 2 | 1 | 1 | 1 |   | 2 | 1 | 3 |

| COLOR | W | B | W | B | W | B | W | B | W | B | W | B | W | B | W |
|---|---|---|---|---|---|---|---|---|---|---|---|---|---|---|---|
| IN | 2 | 1 | 1 | 1 | 2 | 1 | 1 | 1 | 2 | 1 | 1 | 1 | 2 | 1 | 1 | 1 | 3 |
| RLPOS | P2 | P1 | P2 | P1 | P2 | P1 | P2 | P1 | P2 | P1 | P2 | P1 | P2 | P1 | P2 | P1 | P3 |
| RPOS | P2 | P1 | P1 | P1 | P1 | P1 | P1 | P1 | P1 | P1 | P1 | P1 | P1 | P1 | P1 | P1 | P3 |
| Codes | P2 | RPT | 15 | P3 |
| Bits | 01.11011.10111.10 |

White RL STK (Move Up One)

| P1 - 1 | 2 | 2 | 1 | 1 | 2 | 2 | 1 | 1 | 2 | 2 | 1 | 1 | 2 | 2 | 1 | 1 | 1 |
|---|---|---|---|---|---|---|---|---|---|---|---|---|---|---|---|---|---|
| P2 - 2 | 1 | 1 | 2 | 2 | 1 | 1 | 2 | 2 | 1 | 1 | 2 | 2 | 1 | 1 | 2 | 2 | 3 |
| P3 - 3 | 3 | 3 | 3 | 3 | 3 | 3 | 3 | 3 | 3 | 3 | 3 | 3 | 3 | 3 | 3 | 3 | 2 |
| P4 - 4 | 4 | 4 | 4 | 4 | 4 | 4 | 4 | 4 | 4 | 4 | 4 | 4 | 4 | 4 | 4 | 4 | 4 |
| P5 - 5 | 5 | 5 | 5 | 5 | 5 | 5 | 5 | 5 | 5 | 5 | 5 | 5 | 5 | 5 | 5 | 5 | 5 |
| P6 - 6 | 6 | 6 | 6 | 6 | 6 | 6 | 6 | 6 | 6 | 6 | 6 | 6 | 6 | 6 | 6 | 6 | 6 |
| P7 - 7 | 7 | 7 | 7 | 7 | 7 | 7 | 7 | 7 | 7 | 7 | 7 | 7 | 7 | 7 | 7 | 7 | 7 |
| P8 - 8 | 8 | 8 | 8 | 8 | 8 | 8 | 8 | 8 | 8 | 8 | 8 | 8 | 8 | 8 | 8 | 8 | 8 |

BLACK RL STK (Move Up One)

| P1 - 1 | 1 | 1 | 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|---|---|
| P2 - 2 | 2 | 2 | 2 | 2 | 2 | 2 | 2 | 2 | 2 | 2 | 2 | 2 | 2 | 2 | 2 | 2 | 2 |
| P3 - 3 | 3 | 3 | 3 | 3 | 3 | 3 | 3 | 3 | 3 | 3 | 3 | 3 | 3 | 3 | 3 | 3 | 3 |
| P4 - 4 | 4 | 4 | 4 | 4 | 4 | 4 | 4 | 4 | 4 | 4 | 4 | 4 | 4 | 4 | 4 | 4 | 4 |
| P5 - 5 | 5 | 5 | 5 | 5 | 5 | 5 | 5 | 5 | 5 | 5 | 5 | 5 | 5 | 5 | 5 | 5 | 5 |
| P6 - 6 | 6 | 6 | 6 | 6 | 6 | 6 | 6 | 6 | 6 | 6 | 6 | 6 | 6 | 6 | 6 | 6 | 6 |
| P7 - 7 | 7 | 7 | 7 | 7 | 7 | 7 | 7 | 7 | 7 | 7 | 7 | 7 | 7 | 7 | 7 | 7 | 7 |
| P8 - 8 | 8 | 8 | 8 | 8 | 8 | 8 | 8 | 8 | 8 | 8 | 8 | 8 | 8 | 8 | 8 | 8 | 8 |

WHITE FEATURE STK (Move Up One)

| P1 - 1 | 2 | 2 | 2 | 2 | 2 | 2 | 2 | 2 | 2 | 2 | 2 | 2 | 2 | 2 | 2 | 2 |
|---|---|---|---|---|---|---|---|---|---|---|---|---|---|---|---|---|
| P2 - 2 | 1 | 1 | 1 | 1 | 1 | 1 | 1 | 1 | 1 | 1 | 1 | 1 | 1 | 1 | 1 | 3 |
| P3 - 3 | 3 | 3 | 3 | 3 | 3 | 3 | 3 | 3 | 3 | 3 | 3 | 3 | 3 | 3 | 3 | 1 |
| P4 - 4 | 4 | 4 | 4 | 4 | 4 | 4 | 4 | 4 | 4 | 4 | 4 | 4 | 4 | 4 | 4 | 4 |
| P5 - 5 | 5 | 5 | 5 | 5 | 5 | 5 | 5 | 5 | 5 | 5 | 5 | 5 | 5 | 5 | 5 | 5 |
| P6 - 6 | 6 | 6 | 6 | 6 | 6 | 6 | 6 | 6 | 6 | 6 | 6 | 6 | 6 | 6 | 6 | 6 |

BLACK FEATURE STK (Move Up One)

| P1 - 1 | 1 | 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|---|
| P2 - 2 | 2 | 2 | 2 | 2 | 2 | 2 | 2 | 2 | 2 | 2 | 2 | 2 | 2 | 2 | 2 | 2 |
| P3 - 3 | 3 | 3 | 3 | 3 | 3 | 3 | 3 | 3 | 3 | 3 | 3 | 3 | 3 | 3 | 3 | 3 |
| P4 - 4 | 4 | 4 | 4 | 4 | 4 | 4 | 4 | 4 | 4 | 4 | 4 | 4 | 4 | 4 | 4 | 4 |
| P5 - 5 | 5 | 5 | 5 | 5 | 5 | 5 | 5 | 5 | 5 | 5 | 5 | 5 | 5 | 5 | 5 | 5 |
| P6 - 6 | 6 | 6 | 6 | 6 | 6 | 6 | 6 | 6 | 6 | 6 | 6 | 6 | 6 | 6 | 6 | 6 |

Reference should now be made to Example 5 which is an illustration of the dynamics of the stacks for the "Move To Top" of stack scheme discussed previously. For the purpose of this example, it is assumed that the stack only has three positions. Furthermore, the stack begins with an initialized condition that letter A is at the top of the stack, letter B is at the second position in the stack and letter C is in the third position of the stack. Furthermore, an input of characters is then introduced for the purpose of comparing against the stack positions and rearrangement of the stack in accordance with the Move To Top Stack scheme. It is seen that the first input is the letter A which is already at the top of the stack, therefore, no change occurs. This can be seen by reference to the three segments in the Example 5 which are a breakout of all of the information that is contained in the composite directly above. The next input is letter B. Again, we see that the positions in the stack at the time of the second input are A, followed by B, followed by C. However, in view of the fact that the letter B is in the second position, it will be moved to the top of the stack prior to examination of the third input. This is illustrated by the underlining in the Move To Top of Stack portion of the example which gives an indication of where the match is made. The letter B now moves to the top of the stack prior to looking at the third input. The third input happens to be an A which causes a rearrangement of the stack by placing A back at the top position. The decimal points scattered throughout the example are used to highlight the movement of the letters in each of the three breakout sections. By reference to the three breakout sections, it is possible to perceive quickly the movement or dynamics of the stack in accordance with the input shown in the example.

EXAMPLE 5

| Input: |
|---|
| A B A B A B A B B B B C C C C C C B C B C B C B A A A |
| Move To Top Stack |
| 1- A A B A B A B A B B B B C C C C C C B C B C B C B A A |
| 2- B B A B A B A B A A A A A B B B B B B C B C B C B C B B |
| 3- C C C C C C C C C C C A A A A A A A A A A A A A A C C |
| Move To Top Stack |
| 1- A A . A . A . A . . . . . . . . . . . . . . . . . . A A |
| 2- . . A . A . A . A A A A . . . . . . . . . . . . . . . . |

-continued

| | | | | | | | | | | | | | | | | | | | | | | | | | |
|---|---|---|---|---|---|---|---|---|---|---|---|---|---|---|---|---|---|---|---|---|---|---|---|---|---|
| 3- | . | . | . | . | . | . | . | . | . | . | . | . | A | A | A | A | A | A | A | A | A | A | A | A | . | . |
| 1- | . | . | B | . | B | . | B | . | B | B | B | B | . | . | . | . | . | . | B | . | B | . | B | . | B | . | . |
| 2- | B | B | . | B | . | B | . | B | . | . | . | . | . | B | B | B | B | B | B | B | . | B | . | B | . | B | . | B | B |
| 3- | . | . | . | . | . | . | . | . | . | . | . | . | . | . | . | . | . | . | . | . | . | . | . | . | . | . |
| 1- | . | . | . | . | . | . | . | . | . | . | . | . | C | C | C | C | C | C | C | . | C | . | C | . | C | . | . |
| 2- | . | . | . | . | . | . | . | . | . | . | . | . | . | . | . | . | . | . | . | C | . | C | . | C | . | C | . | . |
| 3- | C | C | C | C | C | C | C | C | C | C | C | C | . | . | . | . | . | . | . | . | . | . | . | . | . | . | C | C |

Reference should now be made to Example 6 which is an illustration of the dynamics of a stack for the three alternative schemes discussed previously. That is, the Move Up One, the Move Up Half Way and the Move To Top. The decimal points in the example tables represent no change. Only those positions within the stack that are changed for the particular inputs shown are illustrated. As shown in Example 6, the Move To Top scheme is the most rapidly adaptive of the three and the codes that would be transmitted for the particular inputs would probably be the shortest since the positions more frequently are near the top of the stack. This is clearly indicated by reference to the first seven inputs where it is seen that the number 5 reaches the top of the stack immediately in the Move To Top scheme as opposed to taking 4 steps in the Move Up One scheme.

The last two examples, 5 and 6, have shown only one stack to illustrate the stack dynamics whereas in the disclosed system four stacks are present in both the ENCODER and DECODER.

EXAMPLE 6

```
Input:
        1  5  5  5  7  5  5  8  7  7  7  5  1  3  1  3     5
STACK - Move Up One
P1 -    1  .  .  .  .  5  .  .  .  .  .  .  .  1  .  .     5
P2 -    2  .  .  5  .  1  .  .  .  .  .  .  5  .  .  .     1
P3 -    3  .  5  2  .  .  .  .  .  7  .  .  .  .  3  .     .
P4 -    4  .  5  3  .  .  .  .  .  7  2  .  .  3  .  7     .
P5 -    5  .  4  .  .  .  .  .  7  3  .  .  .  2  .  .     .
P6 -    6  .  .  .  7  .  .  .  4  .  .  .  .  .  .  .     .
P7 -    7  .  .  .  .  6  .  .  8  .  .  .  .  .  .  .     .
P8 -    8  .  .  .  .  .  .  .  6  .  .  .  .  .  .  .     .
STACK - Move Up Half Way
P1 -    1  .  .  .  5  .  .  .  .  .  .  7  5  1  .  .     .
P2 -    2  .  .  5  1  .  .  .  .  7  5  7  5  .  .  3     5
P3 -    3  .  5  2  .  .  .  .  .  7  1  .  .  7  3  .  5  3
P4 -    4  .  3  .  .  7  .  .  8  2  .  .  .  7  .  .  .
P5 -    5  .  4  .  .  3  .  .  7  8  .  .  .  2  .  .  .
P6 -    6  .  .  .  4  .  .  .  3  .  .  .  .  8  .  .  .
P7 -    7  .  .  .  .  6  .  .  4  .  .  .  .  .  .  .  .
P8 -    8  .  .  .  .  .  .  .  6  .  .  .  .  .  .  .  .
STACK - Move To Top
P1 -    1  .  5  .  .  7  5  .  8  7  .  .  5  1  3  1  3  5
P2 -    2  .  1  .  .  5  7  .  5  8  .  .  7  5  1  3  1  3
P3 -    3  .  2  .  .  1  .  .  7  5  .  .  8  7  5  .  .  1
P4 -    4  .  3  .  .  2  .  .  1  .  .  .  8  7  .  .  .
P5 -    5  .  4  .  .  3  .  .  2  .  .  .  .  8  .  .  .
P6 -    6  .  .  .  4  .  .  3  .  .  .  .  2  .  .  .
P7 -    7  .  .  .  .  6  .  .  4  .  .  .  .  .  .  .  .
P8 -    8  .  .  .  .  .  .  .  6  .  .  .  .  .  .  .  .
```

DECODER STEP 1

FIG. 27 shows a logical block diagram representation of the DECODER STEP 1, "DEC-1", represented as unit 21 in FIG. 2. The DEC-1 as well as DEC-2 and DEC-3 are inverse logical structures of the blocks found in ENC-1, ENC-2 and ENC-3, in reverse order. That is, for example, DEC-1 is the logical inverse of ENC-3. The DEC-1 receives the compressed images MSG as input. The message MSG which describes a compressed image that has been coded by the encoder is read serially 1 bit at a time and loaded into the address register ADDR REG of FIG. 27.

As described previously, the apparatus that comprises both the encoder and decoder is finite state machines. Accordingly, the decoder goes through a sequence of states until a complete code word is recognized and thus decoded. If the code word designates a code for CTH, the read-only memory ROM for the DEC-1 provides, in addition to the 5 bits of information "CT" the LD CTH line to indicate that it is stored in register REG. For all other non-zero outputs, the OUTPUTA and COUNTA are presented as input to the next principal step of the decoder, DEC-2. The address presented as a 9 bit argument coming out of the ADDR REG represents the state of DEC-1 in combination with the next bit of information MSG. A full description of the ROM is given in TABLE XII for the one-dimensional case and in TABLE XIII for the two-dimensional case. These tables contain the symbolic representation of all of the possible states and outputs of DEC-1. Since the 1D ROM is quite similar to the 2D ROM, TABLE XIII merely lists the differences between the ROMs in these two cases.

TABLE XII

ROM 1D for DEC-1

| Address | | ROM Word | | | |
|---|---|---|---|---|---|
| State | MSG | Next State | Output | CT | Action |
| S | 0 | S0 | | | |
| S | 1 | S1 | | | |
| S0 | 0 | S | F STK-P1 | | |
| S0 | 1 | S | F STK-P2 | | |
| S1 | 0 | S | F STK-P3 | | |
| S1 | 1 | S11 | | | |
| S11 | 0 | S110 | | | |
| S11 | 1 | RL | | 0 | LD CTH |
| S110 | 0 | S1100 | | | |
| S110 | 1 | S1101 | | | |
| S1100 | 0 | S | RL STK-P4 | | |
| S1100 | 1 | S | RL STK-P5 | | |
| S1101 | 0 | S11010 | | | |
| S1101 | 1 | RPT | | 0 | LD CTH |
| S11010 | 0 | S | RL STK-P6 | | |
| S11010 | 1 | S | RL STK-P7 | | |
| RL | 0 | RL0 | | | |
| RL | 1 | RL1 | | | |
| RL0 | 0 | RL00 | | | |
| RL0 | 1 | LRL011 | | | |
| RL1 | 0 | LRL1 | | | |
| RL1 | 1 | LR11 | | | |
| RL00 | 0 | RL000 | | | |
| RL00 | 1 | LRL0101 | | | |
| RL11 | 0 | LRL | | 1 | LD CTH |
| RL11 | 1 | RL111 | | | |
| RL000 | 0 | S | RL STK-P8 | | |
| RL000 | 1 | S | RL | 9 | RESET |
| RL111 | 0 | HRL0001 | | | |
| RL111 | 1 | RL1111 | | | |
| RL1111 | 0 | HRL001 | | | |
| RL1111 | 1 | RL11111 | | | |
| RL11111 | 0 | HRL01 | | | |
| RL11111 | 1 | RL111111 | | | |
| RL111111 | 0 | HRL1 | | | |
| RL111111 | 1 | RL1111111 | | 31 | LD CTH |
| RL1111111 | 0 | S | CR0 | 31 | RESET |
| RL1111111 | 1 | CRY | | 0 | LD CTH |
| CRY | 0 | S | CRY | 1 | RESET |
| CRY | 1 | CRY1 | | | |
| CRY1 | 0 | LCRY0001 | | | |
| CRY1 | 1 | CRY11 | | | |
| CRY11 | 0 | LCRY001 | | | |
| CRY11 | 1 | CRY111 | | | |
| CRY111 | 0 | LCRY01 | | | |
| CRY111 | 1 | CRY1111 | | | |
| CRY1111 | 0 | LCRY1 | | | |
| CRY1111 | 1 | CRY11111 | | | |
| CRY11111 | 0 | LCRY | | 1 | LD CTH |
| CRY11111 | 1 | CRY111111 | | | |
| CRY111111 | 0 | HCRY0001 | | | |
| CRY111111 | 1 | CRY1111111 | | | |
| CRY1111111 | 0 | HCRY001 | | | |
| CRY1111111 | 1 | CRY11111111 | | | |
| CRY11111111 | 0 | HCRY01 | | | |
| CRY11111111 | 1 | CRY111111111 | | | |
| CRY111111111 | 0 | HCRY1 | | | |
| CRY111111111 | 1 | ILLEGAL | | | |
| RPT | 0 | LRPT001 | | | |
| RPT | 1 | RPT1 | | | |
| RPT1 | 0 | LRPT01 | | | |
| RPT1 | 1 | RPT11 | | | |
| RPT11 | 0 | LRPT1 | | | |
| RPT11 | 1 | RPT111 | | | |
| RPT111 | 0 | LRPT | | 1 | LD CTH |
| RPT111 | 1 | RPT1111 | | | |
| RPT1111 | 0 | HRPT0001 | | | |
| RPT1111 | 1 | RPT11111 | | | |
| RPT11111 | 0 | HRPT001 | | | |
| RPT11111 | 1 | RPT111111 | | | |
| RPT111111 | 0 | HRPT01 | | | |
| RPT111111 | 1 | RPT1111111 | | | |
| RPT1111111 | 0 | HRPT1 | | | |
| RPT1111111 | 1 | ILLEGAL | | | |
| HRL1 | 0 | HRL10 | | | |
| HRL1 | 1 | HRL11 | | | |
| HRL01 | 0 | HRL010 | | | |

TABLE XII-continued

ROM 1D for DEC-1

| Address | | ROM Word | | | |
|---|---|---|---|---|---|
| State | MSG | Next State | Output | CT | Action |
| HRL01 | 1 | HRL011 | | | |
| HRL10 | 0 | HRL100 | | | |
| HRL10 | 1 | HRL101 | | | |
| HRL11 | 0 | HRL110 | | | |
| HRL11 | 1 | HRL111 | | | |
| HRL001 | 0 | HRL0010 | | | |
| HRL001 | 1 | HRL0011 | | | |
| HRL010 | 0 | HRL0100 | | | |
| HRL010 | 1 | HRL0101 | | | |
| HRL011 | 0 | HRL0110 | | | |
| HRL011 | 1 | HRL0111 | | | |
| HRL100 | 0 | HRL1000 | | | |
| HRL100 | 1 | HRL1001 | | | |
| HRL101 | 0 | HRL1010 | | | |
| HRL101 | 1 | HRL1011 | | | |
| HRL110 | 0 | HRL1100 | | | |
| HRL110 | 1 | HRL1101 | | | |
| HRL111 | 0 | HRL1110 | | | |
| HRL111 | 1 | HRL1111 | | | |
| HRL0001 | 0 | LRL | | 2 | LD CTH |
| HRL0001 | 1 | LRL | | 3 | LD CTH |
| HRL0010 | 0 | LRL | | 4 | LD CTH |
| HRL0010 | 1 | LRL | | 5 | LD CTH |
| HRL0011 | 0 | LRL | | 6 | LD CTH |
| HRL0011 | 1 | LRL | | 7 | LD CTH |
| HRL0100 | 0 | LRL | | 8 | LD CTH |
| HRL0100 | 1 | LRL | | 9 | LD CTH |
| HRL0101 | 0 | LRL | | 10 | LD CTH |
| HRL0101 | 1 | LRL | | 11 | LD CTH |
| HRL0110 | 0 | LRL | | 12 | LD CTH |
| HRL0110 | 1 | LRL | | 13 | LD CTH |
| HRL0111 | 0 | LRL | | 14 | LD CTH |
| HRL0111 | 1 | LRL | | 15 | LD CTH |
| HRL1000 | 0 | LRL | | 16 | LD CTH |
| HRL1000 | 1 | LRL | | 17 | LD CTH |
| HRL1001 | 0 | LRL | | 18 | LD CTH |
| HRL1001 | 1 | LRL | | 19 | LD CTH |
| HRL1010 | 0 | LRL | | 20 | LD CTH |
| HRL1010 | 1 | LRL | | 21 | LD CTH |
| HRL1011 | 0 | LRL | | 22 | LD CTH |
| HRL1011 | 1 | LRL | | 23 | LD CTH |
| HRL1100 | 0 | LRL | | 24 | LD CTH |
| HRL1100 | 1 | LRL | | 25 | LD CTH |
| HRL1101 | 0 | LRL | | 26 | LD CTH |
| HRL1101 | 1 | LRL | | 27 | LD CTH |
| HRL1110 | 0 | LRL | | 28 | LD CTH |
| HRL1110 | 1 | LRL | | 29 | LD CTH |
| HRL1111 | 0 | LRL | | 30 | LD CTH |
| HRL1111 | 1 | LRL | | 31 | LD CTH |
| HCRY1 | 0 | HCRY10 | | | |
| HCRY1 | 1 | HCRY11 | | | |
| HCRY01 | 0 | HCRY010 | | | |
| HCRY01 | 1 | HCRY011 | | | |
| HCRY10 | 0 | HCRY100 | | | |
| HCRY10 | 1 | HCRY101 | | | |
| HCRY11 | 0 | HCRY110 | | | |
| HCRY11 | 1 | HCRY111 | | | |
| HCRY001 | 0 | HCRY0010 | | | |
| HCRY001 | 1 | HCRY0011 | | | |
| HCRY010 | 0 | HCRY0100 | | | |
| HCRY010 | 1 | HCRY0101 | | | |
| HCRY011 | 0 | HCRY0110 | | | |
| HCRY011 | 1 | HCRY0111 | | | |
| HCRY100 | 0 | HCRY1000 | | | |
| HCRY100 | 1 | HCRY1001 | | | |
| HCRY101 | 0 | HCRY1010 | | | |
| HCRY101 | 1 | HCRY1011 | | | |
| HCRY110 | 0 | HCRY1100 | | | |
| HCRY110 | 1 | HCRY1101 | | | |
| HCRY111 | 0 | HCRY1110 | | | |
| HCRY111 | 1 | HCRY1111 | | | |
| HCRY0001 | 0 | LCRY | | 2 | LD CTH |
| HCRY0001 | 1 | LCRY | | 3 | LD CTH |
| HCRY0010 | 0 | LCRY | | 4 | LD CTH |
| HCRY0010 | 1 | LCRY | | 5 | LD CTH |
| HCRY0011 | 0 | LCRY | | 6 | LD CTH |
| HCRY0011 | 1 | LCRY | | 7 | LD CTH |

TABLE XII-continued

ROM 1D for DEC-1

| Address | | ROM Word | | | |
|---|---|---|---|---|---|
| State | MSG | Next State | Output | CT | Action |
| HCRY0100 | 0 | LCRY | | 8 | LD CTH |
| HCRY0100 | 1 | LCRY | | 9 | LD CTH |
| HCRY0101 | 0 | LCRY | | 10 | LD CTH |
| HCRY0101 | 1 | LCRY | | 11 | LD CTH |
| HCRY0110 | 0 | LCRY | | 12 | LD CTH |
| HCRY0110 | 1 | LCRY | | 13 | LD CTH |
| HCRY0111 | 0 | LCRY | | 14 | LD CTH |
| HCRY0111 | 1 | LCRY | | 15 | LD CTH |
| HCRY1000 | 0 | LCRY | | 16 | LD CTH |
| HCRY1000 | 1 | LCRY | | 17 | LD CTH |
| HCRY1001 | 0 | LCRY | | 18 | LD CTH |
| HCRY1001 | 1 | LCRY | | 19 | LD CTH |
| HCRY1010 | 0 | LCRY | | 20 | LD CTH |
| HCRY1010 | 1 | LCRY | | 21 | LD CTH |
| HCRY1011 | 0 | LCRY | | 22 | LD CTH |
| HCRY1011 | 1 | LCRY | | 23 | LD CTH |
| HCRY1100 | 0 | LCRY | | 24 | LD CTH |
| HCRY1100 | 1 | LCRY | | 25 | LD CTH |
| HCRY1101 | 0 | LCRY | | 26 | LD CTH |
| HCRY1101 | 1 | LCRY | | 27 | LD CTH |
| HCRY1110 | 0 | LCRY | | 28 | LD CTH |
| HCRY1110 | 1 | LCRY | | 29 | LD CTH |
| HCRY1111 | 0 | LCRY | | 30 | LD CTH |
| HCRY1111 | 1 | LCRY | | 31 | LD CTH |
| HRPT1 | 0 | HRPT10 | | | |
| HRPT1 | 1 | HRPT11 | | | |
| HRPT01 | 0 | HRPT010 | | | |
| HRPT01 | 1 | HRPT011 | | | |
| HRPT10 | 0 | HRPT100 | | | |
| HRPT10 | 1 | HRPT101 | | | |
| HRPT11 | 0 | HRPT110 | | | |
| HRPT11 | 1 | HRPT111 | | | |
| HRPT001 | 0 | HRPT0010 | | | |
| HRPT001 | 1 | HRPT0011 | | | |
| HRPT010 | 0 | HRPT0100 | | | |
| HRPT010 | 1 | HRPT0101 | | | |
| HRPT011 | 0 | HRPT0110 | | | |
| HRPT011 | 1 | HRPT0111 | | | |
| HRPT100 | 0 | HRPT1000 | | | |
| HRPT100 | 1 | HRPT1001 | | | |
| HRPT101 | 0 | HRPT1010 | | | |
| HRPT101 | 1 | HRPT1011 | | | |
| HRPT110 | 0 | HRPT1100 | | | |
| HRPT110 | 1 | HRPT1101 | | | |
| HRPT111 | 0 | HRPT1110 | | | |
| HRPT111 | 1 | HRPT1111 | | | |
| HRPT0001 | 0 | LRPT | | 2 | LD CTH |
| HRPT0001 | 1 | LRPT | | 3 | LD CTH |
| HRPT0010 | 0 | LRPT | | 4 | LD CTH |
| HRPT0010 | 1 | LRPT | | 5 | LD CTH |
| HRPT0011 | 0 | LRPT | | 6 | LD CTH |
| HRPT0011 | 1 | LRPT | | 7 | LD CTH |
| HRPT0100 | 0 | LRPT | | 8 | LD CTH |
| HRPT0100 | 1 | LRPT | | 9 | LD CTH |
| HRPT0101 | 0 | LRPT | | 10 | LD CTH |
| HRPT0101 | 1 | LRPT | | 11 | LD CTH |
| HRPT0110 | 0 | LRPT | | 12 | LD CTH |
| HRPT0110 | 1 | LRPT | | 13 | LD CTH |
| HRPT0111 | 0 | LRPT | | 14 | LD CTH |
| HRPT0111 | 1 | LRPT | | 15 | LD CTH |
| HRPT1000 | 0 | LRPT | | 16 | LD CTH |
| HRPT1000 | 1 | LRPT | | 17 | LD CTH |
| HRPT1001 | 0 | LRPT | | 18 | LD CTH |
| HRPT1001 | 1 | LRPT | | 19 | LD CTH |
| HRPT1010 | 0 | LRPT | | 20 | LD CTH |
| HRPT1010 | 1 | LRPT | | 21 | LD CTH |
| HRPT1011 | 0 | LRPT | | 22 | LD CTH |
| HRPT1011 | 1 | LRPT | | 23 | LD CTH |
| HRPT1100 | 0 | LRPT | | 24 | LD CTH |
| HRPT1100 | 1 | LRPT | | 25 | LD CTH |
| HRPT1101 | 0 | LRPT | | 26 | LD CTH |
| HRPT1101 | 1 | LRPT | | 27 | LD CTH |
| HRPT1110 | 0 | LRPT | | 28 | LD CTH |
| HRPT1110 | 1 | LRPT | | 29 | LD CTH |
| HRPT1111 | 0 | LRPT | | 30 | LD CTH |
| HRPT1111 | 1 | LRPT | | 31 | LD CTH |
| LRL | 0 | LRL0 | | | |

TABLE XII-continued

ROM 1D for DEC-1

| Address | | ROM Word | | | |
|---|---|---|---|---|---|
| State | MSG | Next State | Output | CT | Action |
| LRL | 1 | LRL1 | | | |
| LRL0 | 0 | LRL00 | | | |
| LRL0 | 1 | LRL01 | | | |
| LRL1 | 0 | LRL10 | | | |
| LRL1 | 1 | LRL11 | | | |
| LRL00 | 0 | LRL000 | | | |
| LRL00 | 1 | LRL001 | | | |
| LRL01 | 0 | LRL010 | | | |
| LRL01 | 1 | LRL011 | | | |
| LRL10 | 0 | LRL100 | | | |
| LRL10 | 1 | LRL101 | | | |
| LRL11 | 0 | LRL110 | | | |
| LRL11 | 1 | LRL111 | | | |
| LRL000 | 0 | LRL0000 | | | |
| LRL000 | 1 | LRL0001 | | | |
| LRL001 | 0 | LRL0010 | | | |
| LRL001 | 1 | LRL0011 | | | |
| LRL010 | 0 | LRL0100 | | | |
| LRL010 | 1 | LRL0101 | | | |
| LRL011 | 0 | LRL0110 | | | |
| LRL011 | 1 | LRL0111 | | | |
| LRL100 | 0 | LRL1000 | | | |
| LRL100 | 1 | LRL1001 | | | |
| LRL110 | 0 | LRL1010 | | | |
| LRL110 | 1 | LRL1011 | | | |
| LRL110 | 0 | LRL1100 | | | |
| LRL110 | 0 | LRL1101 | | | |
| LRL111 | 0 | LRL1110 | | | |
| LRL111 | 1 | LRL1111 | | | |
| LRL0000 | 0 | S | RL | 0 | RESET |
| LRL0000 | 1 | S | RL | 1 | RESET |
| LRL0001 | 0 | S | RL | 2 | RESET |
| LRL0001 | 1 | S | RL | 3 | RESET |
| LRL0010 | 0 | S | RL | 4 | RESET |
| LRL0010 | 1 | S | RL | 5 | RESET |
| LRL0011 | 0 | S | RL | 6 | RESET |
| LRL0011 | 1 | S | RL | 7 | RESET |
| LRL0100 | 0 | S | RL | 8 | RESET |
| LRL0100 | 1 | S | RL | 9 | RESET |
| LRL0101 | 0 | S | RL | 10 | RESET |
| LRL0101 | 1 | S | RL | 11 | RESET |
| LRL0110 | 0 | S | RL | 12 | RESET |
| LRL0110 | 1 | S | RL | 13 | RESET |
| LRL0111 | 0 | S | RL | 14 | RESET |
| LRL0111 | 1 | S | RL | 15 | RESET |
| LRL1000 | 0 | S | RL | 16 | RESET |
| LRL1000 | 1 | S | RL | 17 | RESET |
| LRL1001 | 0 | S | RL | 18 | RESET |
| LRL1001 | 1 | S | RL | 19 | RESET |
| LRL1010 | 0 | S | RL | 20 | RESET |
| LRL1010 | 1 | S | RL | 21 | RESET |
| LRL1011 | 0 | S | RL | 22 | RESET |
| LRL1011 | 1 | S | RL | 23 | RESET |
| LRL1100 | 0 | S | RL | 24 | RESET |
| LRL1100 | 1 | S | RL | 25 | RESET |
| LRL1101 | 0 | S | RL | 26 | RESET |
| LRL1101 | 1 | S | RL | 27 | RESET |
| LRL1110 | 0 | S | RL | 28 | RESET |
| LRL1110 | 1 | S | RL | 29 | RESET |
| LRL1111 | 0 | S | RL | 30 | RESET |
| LRL1111 | 1 | S | RL | 31 | RESET |
| LCRY | 0 | LCRY0 | | | |
| LCRY | 1 | LCRY1 | | | |
| LCRY0 | 0 | LCRY00 | | | |
| LCRY0 | 1 | LCRY01 | | | |
| LCRY1 | 0 | LCRY10 | | | |
| LCRY1 | 1 | LCRY11 | | | |
| LCRY00 | 0 | LCRY000 | | | |
| LCRY00 | 1 | LCRY001 | | | |
| LCRY01 | 0 | LCRY010 | | | |
| LCRY01 | 1 | LCRY011 | | | |
| LCRY10 | 0 | LCRY100 | | | |
| LCRY10 | 1 | LCRY101 | | | |
| LCRY11 | 0 | LCRY110 | | | |
| LCRY11 | 1 | LCRY111 | | | |
| LCRY000 | 1 | LCRY0000 | | | |
| LCRY000 | 1 | LCRY0001 | | | |

TABLE XII-continued

ROM ID for DEC-1

| Address | | ROM Word | | | |
|---|---|---|---|---|---|
| State | MSG | Next State | Output | CT | Action |
| LCRY001 | 0 | LCRY0010 | | | |
| LCRY001 | 1 | LCRY0011 | | | |
| LCRY010 | 0 | LCRY0100 | | | |
| LCRY010 | 1 | LCRY0101 | | | |
| LCRY011 | 0 | LCRY0110 | | | |
| LCRY011 | 1 | LCRY0111 | | | |
| LCRY100 | 0 | LCRY1000 | | | |
| LCRY100 | 1 | LCRY1001 | | | |
| LCRY101 | 0 | LCRY1010 | | | |
| LCRY101 | 1 | LCRY1011 | | | |
| LCRY110 | 0 | LCRY1100 | | | |
| LCRY110 | 1 | LCRY1101 | | | |
| LCRY111 | 0 | LCRY1110 | | | |
| LCRY111 | 1 | LCRY1111 | | | |
| LCRY0000 | 0 | S | CRY | 0 | RESET |
| LCRY0000 | 1 | S | CRY | 1 | RESET |
| LCRY0001 | 0 | S | CRY | 2 | RESET |
| LCRY0001 | 1 | S | CRY | 3 | RESET |
| LCRY0010 | 0 | S | CRY | 4 | RESET |
| LCRY0010 | 1 | S | CRY | 5 | RESET |
| LCRY0011 | 0 | S | CRY | 6 | RESET |
| LCRY0011 | 1 | S | CRY | 7 | RESET |
| LCRY0100 | 0 | S | CRY | 8 | RESET |
| LCRY0100 | 1 | S | CRY | 9 | RESET |
| LCRY0101 | 0 | S | CRY | 10 | RESET |
| LCRY0101 | 1 | S | CRY | 11 | RESET |
| LCRY0110 | 0 | S | CRY | 12 | RESET |
| LCRY0110 | 1 | S | CRY | 13 | RESET |
| LCRY0111 | 0 | S | CRY | 14 | RESET |
| LCRY0111 | 1 | S | CRY | 15 | RESET |
| LCRY1000 | 0 | S | CRY | 16 | RESET |
| LCRY1000 | 1 | S | CRY | 17 | RESET |
| LCRY1001 | 0 | S | CRY | 18 | RESET |
| LCRY1001 | 1 | S | CRY | 19 | RESET |
| LCRY1010 | 0 | S | CRY | 20 | RESET |
| LCRY1010 | 1 | S | CRY | 21 | RESET |
| LCRY1011 | 0 | S | CRY | 22 | RESET |
| LCRY1011 | 1 | S | CRY | 23 | RESET |
| LCRY1100 | 0 | S | CRY | 24 | RESET |
| LCRY1100 | 1 | S | CRY | 25 | RESET |
| LCRY1101 | 0 | S | CRY | 26 | RESET |
| LCRY1101 | 1 | S | CRY | 27 | RESET |
| LCRY1110 | 0 | S | CRY | 28 | RESET |
| LCRY1110 | 1 | S | CRY | 29 | RESET |
| LCRY1111 | 0 | S | CRY | 30 | RESET |
| LCRY1111 | 1 | S | CRY | 31 | RESET |
| LRPT | 0 | LRPT0 | | | |
| LRPT | 1 | LRPT1 | | | |
| LRPT0 | 0 | LRPT00 | | | |
| LRPT0 | 1 | LRPT01 | | | |
| LRPT1 | 0 | LRPT10 | | | |
| LRPT1 | 1 | LRPT11 | | | |
| LRPT00 | 0 | LRPT000 | | | |
| LRPT00 | 1 | LRPT001 | | | |
| LRPT01 | 0 | LRPT010 | | | |
| LRPT01 | 1 | LRPT011 | | | |
| LRPT10 | 0 | LRPT100 | | | |
| LRPT10 | 1 | LRPT101 | | | |
| LRPT11 | 0 | LRPT110 | | | |
| LRPT11 | 1 | LRPT111 | | | |
| LRPT000 | 0 | LRPT0000 | | | |
| LRPT000 | 1 | LRPT0001 | | | |
| LRPT001 | 0 | LRPT0010 | | | |
| LRPT001 | 1 | LRPT0011 | | | |
| LRPT010 | 0 | LRPT0100 | | | |
| LRPT010 | 1 | LRPT0101 | | | |
| LRPT011 | 0 | LRPT0110 | | | |
| LRPT011 | 1 | LRPT0111 | | | |
| LRPT100 | 0 | LRPT1000 | | | |
| LRPT100 | 1 | LRPT1001 | | | |
| LRPT101 | 0 | LRPT1010 | | | |
| LRPT101 | 1 | LRPT1011 | | | |
| LRPT110 | 0 | LRPT1100 | | | |
| LRPT110 | 1 | LRPT1101 | | | |
| LRPT111 | 0 | LRPT1110 | | | |
| LRPT111 | 1 | LRPT1111 | | | |
| LRPT0000 | 0 | S | RPT | 0 | RESET |

TABLE XII-continued

ROM 1D for DEC-1

| Address | | ROM Word | | | |
|---|---|---|---|---|---|
| State | MSG | Next State | Output | CT | Action |
| LRPT0000 | 1 | S | RPT | 1 | RESET |
| LRPT0001 | 0 | S | RPT | 2 | RESET |
| LRPT0001 | 1 | S | RPT | 3 | RESET |
| LRPT0010 | 0 | S | RPT | 4 | RESET |
| LRPT0010 | 1 | S | RPT | 5 | RESET |
| LRPT0011 | 0 | S | RPT | 6 | RESET |
| LRPT0011 | 1 | S | RPT | 7 | RESET |
| LRPT0100 | 0 | S | RPT | 8 | RESET |
| LRPT0100 | 1 | S | RPT | 9 | RESET |
| LRPT0101 | 0 | S | RPT | 10 | RESET |
| LRPT0101 | 1 | S | RPT | 11 | RESET |
| LRPT0110 | 0 | S | RPT | 12 | RESET |
| LRPT0110 | 1 | S | RPT | 13 | RESET |
| LRPT0111 | 0 | S | RPT | 14 | RESET |
| LRPT0111 | 1 | S | RPT | 15 | RESET |
| LRPT1000 | 0 | S | RPT | 16 | RESET |
| LRPT1000 | 1 | S | RPT | 17 | RESET |
| LRPT1001 | 0 | S | RPT | 18 | RESET |
| LRPT1001 | 1 | S | RPT | 19 | RESET |
| LRPT1010 | 0 | S | RPT | 20 | RESET |
| LRPT1010 | 1 | S | RPT | 21 | RESET |
| LRPT1011 | 0 | S | RPT | 22 | RESET |
| LRPT1011 | 1 | S | RPT | 23 | RESET |
| LRPT1100 | 0 | S | RPT | 24 | RESET |
| LRPT1100 | 1 | S | RPT | 25 | RESET |
| LRPT1101 | 0 | S | RPT | 26 | RESET |
| LRPT1101 | 1 | S | RPT | 27 | RESET |
| LRPT1110 | 0 | S | RPT | 28 | RESET |
| LRPT1110 | 1 | S | RPT | 29 | RESET |
| LRPT1111 | 0 | S | RPT | 30 | RESET |
| LRPT1111 | 1 | S | RPT | 31 | RESET |
| ILLEGAL | 0 | ILLEGAL | | | |
| ILLEGAL | 1 | ILLEGAL | | | |

TABLE XIII

ROM 2D for DEC-1

| Address | | ROM Word | | | |
|---|---|---|---|---|---|
| State | MSG | Next State | Output | CT | Action |
| Change: | | | | | |
| S1 | 0 | S | F STK-P3 | | |
| To: | | | | | |
| S1 | 0 | S10 | | | |
| Add: | | | | | |
| S10 | 0 | S | F STK-P3 | | |
| S10 | 1 | S101 | | | |
| S101 | 0 | S | F STK-P4 | | |
| S101 | 1 | S1011 | | | |
| S1011 | 0 | S | F STK-P5 | | |
| S1011 | 1 | S | F STK-P6 | | |

As an example as to how these tables are to be utilized, in TABLE XII, for each given input of STATE and MSG bit, there is found the 8 bits of the NEXT STATE as well as the OUTPUT, count CT, and whether there is an output on the load count high LD CTH or RESET which are the two ACTIONs.

The bit patterns for the different STATES are shown in TABLE XIV.

TABLE XIV

DEC-1 Bit Assignments

| | States |
|---|---|
| 00000000 | S |
| 00000001 | S0 |
| 00000010 | S1 |
| 00000011 | S10 |
| 00000100 | S11 |
| 00000101 | S101 |
| 00000110 | S110 |
| 00000111 | S1011 |
| 00001000 | S1100 |
| 00001001 | S1101 |
| 00001010 | S11010 |
| 00001011 | RL |
| 00001100 | RL0 |
| 00001101 | RL1 |
| 00001110 | RL00 |
| 00001111 | RL11 |
| 00010000 | RL000 |
| 00010001 | RL111 |
| 00010010 | RL1111 |
| 00010011 | RL11111 |
| 00010100 | RL111111 |
| 00010101 | RL1111111 |
| 00010110 | CRY |
| 00010111 | CRY1 |
| 00011000 | CRY11 |
| 00011001 | CRY111 |
| 00011010 | CRY1111 |
| 00011011 | CRY11111 |
| 00011100 | CRY111111 |
| 00011101 | CRY1111111 |
| 00011110 | CRY11111111 |
| 00011111 | CRY111111111 |
| 00100000 | RPT |
| 00100001 | RPT1 |
| 00100010 | RPT11 |
| 00100011 | RPT111 |
| 00100100 | RPT1111 |
| 00100101 | RPT11111 |
| 00100110 | RPT111111 |
| 00100111 | RPT1111111 |
| 00101000 | HRL1 |
| 00101001 | HRL01 |
| 00101010 | HRL10 |
| 00101011 | HRL11 |
| 00101100 | HRL001 |
| 00101101 | HRL010 |

TABLE XIV-continued
DEC-1 Bit Assignments

| | |
|---|---|
| 00101110 | HRL011 |
| 00101111 | HRL100 |
| 00110000 | HRL101 |
| 00110001 | HRL110 |
| 00110010 | HRL111 |
| 00110011 | HRL0001 |
| 00110100 | HRL0010 |
| 00110101 | HRL0011 |
| 00110110 | HRL0100 |
| 00110111 | HRL0101 |
| 00111000 | HRL0110 |
| 00111001 | HRL0111 |
| 00111010 | HRL1000 |
| 00111011 | HRL1001 |
| 00111100 | HRL1010 |
| 00111101 | HRL1011 |
| 00111110 | HRL1100 |
| 00111111 | HRL1101 |
| 01000000 | HRL1110 |
| 01000001 | HRL1111 |
| 01000010 | HCRY1 |
| 01000011 | HCRY01 |
| 01000100 | HCRY10 |
| 01000101 | HCRY11 |
| 01000110 | HCRY001 |
| 01000111 | HCRY010 |
| 01001000 | HCRY011 |
| 01001001 | HCRY100 |
| 01001010 | HCRY101 |
| 01001011 | HCRY110 |
| 01001100 | HCRY111 |
| 01001101 | HCRY0001 |
| 01001110 | HCRY0010 |
| 01001111 | HCRY0011 |
| 01010000 | HCRY0100 |
| 01010001 | HCRY0101 |
| 01010010 | HCRY0110 |
| 01010011 | HCRY0111 |
| 01010100 | HCRY1000 |
| 01010101 | HCRY1001 |
| 01010110 | HCRY1010 |
| 01010111 | HCRY1011 |
| 01011000 | HCRY1100 |
| 01011001 | HCRY1101 |
| 01011010 | HCRY1110 |
| 01011011 | HCRY1111 |
| 01011100 | HRPT1 |
| 01011101 | HRPT01 |
| 01011110 | HRPT10 |
| 01011111 | HRPT11 |
| 01100000 | HRPT001 |
| 01100001 | HRPT010 |
| 01100010 | HRPT011 |
| 01100011 | HRPT100 |
| 01100100 | HRPT101 |
| 01100101 | HRPT110 |
| 01100110 | HRPT111 |
| 01100111 | HRPT0001 |
| 01101000 | HRPT0010 |
| 01101001 | HRPT0011 |
| 01101010 | HRPT0100 |
| 01101011 | HRPT0101 |
| 01101100 | HRPT0110 |
| 01101101 | HRPT0111 |
| 01101110 | HRPT1000 |
| 01101111 | HRPT1001 |
| 01110000 | HRPT1010 |
| 01110001 | HRPT1011 |
| 01110010 | HRPT1100 |
| 01110011 | HRPT1101 |
| 01110100 | HRPT1110 |
| 01110101 | HRPT1111 |
| 01110110 | LRL |
| 01110111 | LRL0 |
| 01111000 | LRL1 |
| 01111001 | LRL00 |
| 01111010 | LRL01 |
| 01111011 | LRL10 |
| 01111100 | LRL11 |
| 01111101 | LRL000 |
| 01111110 | LRL001 |
| 01111111 | LRL010 |
| 10000000 | LRL011 |
| 10000001 | LRL100 |
| 10000010 | LRL101 |
| 10000011 | LRL110 |
| 10000100 | LRL111 |
| 10000101 | LRL0000 |
| 10000110 | LRL0001 |
| 10000111 | LRL0010 |
| 10001000 | LRL0011 |
| 10001001 | LRL0100 |
| 10001010 | LRL0101 |
| 10001011 | LRL0110 |
| 10001100 | LRL0111 |
| 10001101 | LRL1000 |
| 10001110 | LRL1001 |
| 10001111 | LRL1010 |
| 10010000 | LRL1011 |
| 10010001 | LRL1100 |
| 10010010 | LRL1101 |
| 10010011 | LRL1110 |
| 10010100 | LRL1111 |
| 10010101 | LCRY |
| 10010110 | LCRY0 |
| 10010111 | LCRY1 |
| 10011000 | LCRY00 |
| 10011001 | LCRY01 |
| 10011010 | LCRY10 |
| 10011011 | LCRY11 |
| 10011100 | LCRY000 |
| 10011101 | LCRY001 |
| 10011110 | LCRY010 |
| 10011111 | LCRY011 |
| 10100000 | LCRY100 |
| 10100001 | LCRY101 |
| 10100010 | LCRY110 |
| 10100011 | LCRY111 |
| 10100100 | LCRY0000 |
| 10100101 | LCRY0001 |
| 10100110 | LCRY0010 |
| 10100111 | LCRY0011 |
| 10101000 | LCRY0100 |
| 10101001 | LCRY0101 |
| 10101010 | LCRY0110 |
| 10101011 | LCRY0111 |
| 10101100 | LCRY1000 |
| 10101101 | LCRY1001 |
| 10101110 | LCRY1010 |
| 10101111 | LCRY1011 |
| 10110000 | LCRY1100 |
| 10110001 | LCRY1101 |
| 10110010 | LCRY1110 |
| 10110011 | LCRY1111 |
| 10110100 | LRPT |
| 10110101 | LRPT0 |
| 10110110 | LRPT1 |
| 10110111 | LRPT00 |
| 10111000 | LRPT01 |
| 10111001 | LRPT10 |
| 10111010 | LRPT11 |
| 10111011 | LRPT000 |
| 10111100 | LRPT001 |
| 10111101 | LRPT010 |
| 10111110 | LRPT011 |
| 10111111 | LRPT100 |
| 11000000 | LRPT101 |
| 11000001 | LRPT110 |
| 11000010 | LRPT111 |
| 11000011 | LRPT0000 |
| 11000100 | LRPT0001 |
| 11000101 | LRPT0010 |
| 11000110 | LRPT0011 |
| 11000111 | LRPT0100 |
| 11001000 | LRPT0101 |
| 11001001 | LRPT0110 |
| 11001010 | LRPT0111 |
| 11001011 | LRPT1000 |
| 11001100 | LRPT1001 |
| 11001101 | LRPT1010 |
| 11001110 | LRPT1011 |
| 11001111 | LRPT1100 |

TABLE XIV-continued

| DEC-1 Bit Assignments | |
|---|---|
| 11010000 | LRPT1101 |
| 11010001 | LRPT1110 |
| 11010010 | LRPT1111 |
| 11111111 | ILLEGAL |

In view of the fact that the message MSG is received serially one bit at a time from the transmission line, it is necessary for the DEC-1 to compile a complete code word before providing output to the next stage. Thus, when referring to TABLE XII, it is seen that there are numerous states at the input which create no data on the ROM word output. Typically, the STATE of the machine plus the MSG bit create the next state which in combination with the next MSG bit creates a subsequent STATE. This process repeats itself until such time as the combination of the NEXT STATE with the MSG bit corresponds to a specific code pattern to be output by the ROM. When no OUTPUT is present, the ROM merely feeds back to the ADDR REG for processing the next MSG bit. The bit assignments for the ACTION, CT and OUTPUT are shown in TABLE XV.

TABLE XV

| DEC-1 | |
|---|---|
| Actions | |
| 00 | |
| 01 | LD CTH |
| 10 | RESET |
| | CT |
| 00000 | 0 |
| 00001 | 1 |
| 00010 | 2 |
| 00011 | 3 |
| 00100 | 4 |
| 00101 | 5 |
| 00110 | 6 |
| 00111 | 7 |
| 01000 | 8 |
| 01001 | 9 |
| 01010 | 10 |
| 01011 | 11 |
| 01100 | 12 |
| 01101 | 13 |
| 01110 | 14 |
| 01111 | 15 |
| 10000 | 16 |
| 10001 | 17 |
| 10010 | 18 |
| 10011 | 19 |
| 10100 | 20 |
| 10101 | 21 |
| 10110 | 22 |
| 10111 | 23 |
| 11000 | 24 |
| 11001 | 25 |
| 11010 | 26 |
| 11011 | 27 |
| 11100 | 28 |
| 11101 | 29 |
| 11110 | 30 |
| 11111 | 31 |
| | OUTPUT |
| 0001 | CRO |
| 0010 | CRY |
| 0011 | RL |
| 0100 | RL STK-P4 |
| 0101 | RL STK-P5 |
| 0110 | RL STK-P6 |
| 0111 | RL STK-P7 |
| 1000 | RL STK-P8 |
| 1001 | F STK-P1 |
| 1010 | F STK-P2 |
| 1011 | F STK-P3 |

TABLE XV-continued

| DEC-1 | | |
|---|---|---|
| 1100 | F STK-P4 | (2D only) |
| 1101 | F STK-P5 | " |
| 1110 | F STK-P6 | " |

Similarly to the encoder, the decoder as shown in FIG. 2 utilizes FIFO STACK 3 and FIFO STACK 4, for buffering the data that is transferred between each decoder step.

DECODER STEP 2

The DECODER STEP 2 "DEC-2" shown as unit 23 in FIG. 2 is shown in further detail in FIG. 28. As input to the DEC-2, there is found a 10 bit cable COUNTB and a 4 bit cable OUTPUTB. Either the CTR value of the encoder REPEAT DETECT from FIG. 25 or the RLCTB is represented on the COUNTB cable. The feature or stack position information is represented on the OUTPUTB cable. The EXPAND REPEAT box which receives this input determines if either a carry or repeat is present and the CTB is greater than one. In that case, it inhibits the RD3 signal. if there is not a NULL condition (OUTPUTB="0000"), then LD4 loads FIFO STACK 4.

As shown in FIG. 29, if OUTPUTB is not "0000" (null), then the appropriate logic gate will present a signal on the LD4 line along with the appropriate color information, on line COLORC. The RD3 line serves the purpose of inhibiting a reading of the data from FIFO STACK 3 to begin a new cycle, until every multiple REPEAT or CARRY has been fully processed. This is accomplished by logically creating the inverse of the presence of a CARRY or REPEAT and the CTB being greater than one.

The REG which stores and outputs the color information on the COLORC line is enabled to allow a color reversal every cycle except for null inputs ("0000") or for the cycle following a CARRY ("0010").

The REG which receives information confirming the presence of a CARRY is enabled for every cycle in which OUTPUTB is not a null.

Since it is known that the color information changes for all conditions except following a CARRY or for a null, the color information is not incorporated into the DEC-1 ROM. This color information is generated in the EXPAND REPEAT unit.

The DECODER FEATURE STACKS unit of FIG. 28 is shown in greater detail in FIG. 30. This unit comprises two stacks, one for features associated with white information, WHITE DECODER STK, and the other stack associated with features of black information, BLACK DECODER STK. Depending on the values of the signal on the COLORC line and the OUTPUTB cable, the multiplexer MUX will select the output of either the WHITE DECODER STK, and BLACK DECODER STK or the OUTPUTB. The selected four bits are presented as FOUT. The bit assignments for all of the cables shown in FIG. 30 are listed in TABLE XVI.

TABLE XVI

| DEC-2 ROM Bit Assignments | |
|---|---|
| OUTPUTB (FIG. 30) | |
| 0001 | CRO |
| 0010 | CRY |
| 0011 | RL |

TABLE XVI-continued

DEC-2 ROM Bit Assignments

| | | |
|---|---|---|
| 0100 | RL STK-P4 | |
| 0101 | RL STK-P5 | |
| 0110 | RL STK-P6 | |
| 0111 | RL STK-P7 | |
| 1000 | RL STK-P8 | |
| 1001 | F STK-P1 | |
| 1010 | F STK-P2 | |
| 1011 | F STK-P3 | |
| 1100 | F STK-P4 | (2D only) |
| 1101 | F STK-P5 | " |
| 1110 | F STK-P6 | " |
| FLSB (FIG. 30) | | |
| 001 | F STK-P1 | |
| 010 | F STK-P2 | |
| 011 | F STK-P3 | |
| 100 | F STK-P4 | |
| 101 | F STK-P5 | |
| 110 | F STK-P6 | |
| FOUT (FIG. 30, 33) | | |
| 0001 | CRO | |
| 0010 | CRY | |
| 0011 | RL | |
| 0100 | RL STK-P4 | |
| 0101 | RL STK-P5 | |
| 0110 | RL STK-P6 | |
| 0111 | RL STK-P7 | |
| 1000 | RL STK-P8 | |
| 1001 | RL STK-P1 | |
| 1010 | RL STK-P2 | |
| 1011 | RL STK-P3 | |
| 1100 | EM | (2D only) |
| 1101 | EZ | " |
| 1110 | EP | " |
| FEATUREC (FIG. 33) | | |
| 001 | CRO | |
| 010 | CRY | |
| 011 | RL | |
| 100 | EM | (2D only) |
| 101 | EZ | " |
| 110 | EP | " |

Both the white and black decoder stacks are identical in structure and one such DECODER STK is shown in greater detail in FIG. 31. The position POS of the feature (3 bits) is decoded into the appropriate one out of the P1-P8 lines in order to communicate the actual position of the feature within the stack. If the feature position is the first or top position P1, no action is taken within the stack, otherwise at the appropriate time the stack will dynamically rearrange the order in accordance with a predetermined scheme identical to the one used by the ENCODER. The value at the stack position is presented on outputs V1 through V8, one of which will be selected by the multiplexor MUX in accordance with the POS binary code to provide a 3 bit output "VOUT".

The VOUT information that is output from the DECODER STK is given a leading binary 1 bit as shown in FIG. 30 prior to being input into the MUX of the DECODER FEATURE STACKS. The MUX will select the modified VOUT output of either the WHITE or BLACK DECODER STKS or the OUTPUTB information and present it on the FOUT cable as output. The FOUT (4 bits) in combination with the COUNTC (10 bits) and the COLORC information are input into the RUN SELECT unit shown in FIG. 28, which is described in greater detail in FIG. 32. The RUN SELECT unit operates to decode run-length positions that are in the DECODER RL STACKS. The MUX shown in FIG. 32 will select either the run-length found at the selected position RLSB in the DECODER RL STACKS or the four least significant bits from COUNTC.

It should be noted that the bottom position in the DECODER RL STACKS is designated as a "000" code. As seen in FIG. 32, when the run-length appears at the bottom position of the stack, the three least significant bits RLSB will be equal at the AND gate with the "000". Then, a leading one binary bit is affixed to the "RLSB" which will be selected as the output by MUX under the control of the "RMV" signal. The 4 bits which represent the COUNTB's least significant bits are selected by the MUX when the RMV signal is down. The run-length count output "RLCTD" will comprise a combination of the six most significant bits of the COUNTB with either the least significant bits of the same data or the value at the position from the DECODER RL STACKS.

Referring now to FIG. 33, there is shown a detailed block diagram representation of the DECODER RL STACKS. These stacks comprise two separate units, one for white and one for black run-lengths. Found in each of these decoder stacks are the positions of the run-lengths from 1 through 8 arranged in a priority scheme that places the most frequently appearing runs at the top of the stack (DECODER STK shown in FIG. 31). It is the object of these decoder stacks to provide the stack position value of the run in accordance with the COLORC and FOUT (if the run is between 1 and 8, i.e., $3<FOUT<12$) data. If the run was in the stack, then the MUX selects for FEATUREC the rail RL or DRL feature bit assignment of 011 to replace the FOUT features for the RL STK-P1-8. The 3 least significant bits LSB of FOUT are sufficient to uniquely represent all of the remaining features. See TABLE XVI.

DECODER STEP 3

Now having finished the DEC-1 and DEC-2 decoding steps, FEATURED (3 bits), RLCTE (10 bits), and COLORD (1 bit) are output from the buffer FIFO STACK 4 and fed into the DECODER STEP 3 "DEC-3", unit 25 in FIG. 2. This unit is shown in greater detail in FIG. 34. As indicated previously, both the ENCODER and DECODER are primarily finite state machines. The state diagram for DEC-3 is fully shown in FIG. 36. DEC-3 takes features, colors and run count outputs from DEC-2 for the purpose of decoding the color of the pels that form the decompressed image. The output of the DEC-3 unit is a bit stream of pels that can be utilized to drive a printer or display unit (not shown) so as to recreate the image that was compressed by the ENCODER.

The STATE diagram shown in FIG. 36 represents the logical flow of states for DEC-3 as implemented by the read-only memory ROM, shown in FIG. 34. As indicated in FIG. 36, the broken circles denote a STATE which is set from the information represented by the three bits of FEATURED. The solid circle represents the STATE of the machine as set by the three bits of feedback that represents the NEXT STATE as output from the ROM and input into the MUX of FIG. 34. The rectangular boxes in the state diagram of FIG. 36 represent the output, which in this case is a pel that can have either a black or white (1 or 0) condition. The question mark denotes the condition under which the NEXT STATE of the machine is determined from the next FIFO STACK 4 FEATURED. Also indicated in FIG. 36 in the ACTION of decrementing the counter CTR in FIG. 34 by 1 represented by an asterisk.

For example, assuming that the DEC-3 is first or initially set to a carry "CRY" feature (010 coming in as FEATURED), a pel would be output and the next state of the DEC-3 would be a run-length RL state. The mapping of the ROM in FIG. 34 is fully shown in TABLE XVII. This table lists the address inputs to the ROM and the corresponding output from the ROM which takes the form of the NEXT STATE, the OUTPUT, and possibly either a NEW FEATURE "NF" or decrement "DEC" ACTION. A complete listing of all of the binary bit assignments for each of the terms shown in Table XVII is presented in TABLE XVIII.

TABLE XVII

DEC-3 ROM

| Address | | | ROM Word | |
|---|---|---|---|---|
| State | Input CT | TR | Next State | Output | Actions |
| NULL | — | — | | | NF |
| CRO | — | — | RL | PEL | |
| CRY | — | — | RL | PEL | |
| RL | 0 | — | | PEL | NF |
| RL | 1 | — | RL | PEL | DEC |
| EM | — | 0 | EM | PEL | |
| EM | — | 1 | | PEL | NF |
| EZ | — | 0 | EZ | PEL | |
| EZ | — | 1 | | PEL | NF |
| EP | — | 0 | EP | PEL | |
| EP | — | 1 | EPX | PEL | |
| EPX | — | — | | PEL | NF |

TABLE XVIII

| ENC-3 Bit Assignments | |
|---|---|
| FEATURED | |
| 000 | NULL |
| 001 | CRO |
| 010 | CRY |
| 011 | RL |
| 100 | EM |
| 101 | EZ |
| 110 | EP |
| STATES | |
| 000 | NULL |
| 001 | CRO |
| 010 | CRY |
| 011 | RL |
| 100 | EM |
| 101 | EZ |
| 110 | EP |
| 111 | EPX |
| INPUTS | |
| CT | |
| 0 | CT < 1 OR CT = 1 |
| 1 | CT > 1 |
| TR | |
| (HT,HTLA) | |
| 00 | |
| 01 | |
| 10 | |
| 11 | |
| OUTPUTS | |
| 0 | |
| 1 | PEL |
| ACTIONS | |
| 00 | |
| 01 | DEC (CT = CT − 1) |
| 10 | NF (New Feature) |

Referring back to FIG. 34, it should be noted that the HISTORY LINE unit comprises a delay structure more fully shown in FIG. 35. This DECODER HISTORY LINE STORE of FIG. 35 creates history transition look ahead "HTLA" and history transition "HT" information that can be input into the ROM of FIG. 34. These two bits of information indicate the transition on the line above the pel which are required when the feature indicates a vertical reference code condition. This is clearly shown in TABLE XVIII, where the TR inputs are represented during the EM, EZ and EP states. The PEL line indicates by the presence of a "1" that there is valid color information on the DO line.

It should be noted by those skilled in the art that the description of the system herein is primarily for a 2D operation, since this is the more complete case. Clearly, if the system were to be described in terms of only a 1D operation, substantial sections of logic structure could be eliminated from the disclosed embodiment. For example, all logic associated with the HISTORY LINE in both the ENCODER and DECODER could be eliminated for 1D operation. In addition, since all features associated with vertical references are unnecessary in the 1D operation, the number of STATES is reduced thus requiring smaller ROM tables and FEATURE STACK units.

While the invention has been described herein in the form of a special purpose machine or system, it should be recognized by those skilled in the data processing art that special conditions could favor alternative embodiments. For example, the inventive concepts could be implemented by a computer program that is executed on a general purpose computer, or by a specially designed microprocessor. One area where this alternative might be desirable is in data storage applications.

It should further be recognized that while the invention described herein has particular advantage in the field of facsimile image data transmission, the principles are equally applicable to the fields of character recognition, character compression, or any other form of coding.

Having thus described my invention, what I claim as new and desire to secure by Letters Patent is:

1. In a data compression apparatus wherein an image is scanned line-by-line to sense the characteristics thereof and the positions at which such characteristics are located, the combination of:

first encoding means for producing digital representations of the sensed characteristics and their respective relationships to other characteristics;

at least one stack each having a plurality of addressable storage positions therein for storing a subset of said digital representations as they are produced by said first encoding means;

means for determining the location in at least one of said stacks, of a digital representation corresponding to a currently sensed characteristic;

second encoding means responsive to said location determining means for generating a coded representation of said stack location, which is provided to a utilization means;

control means functioning in response to each determination made by said location determining means for rearranging said digital representations in at least one of said stacks in accordance with a predetermined scheme.

2. The apparatus as defined in claim 1 wherein said at least one stack comprises:

a first color stack and a second color stack.

3. The apparatus as defined in claim 2 further comprising:

means for examining said characteristics and determining which of said first and second color stacks are to be rearranged and which locations are to be utilized by said second encoding means.

4. The apparatus as defined in claim 3 wherein said second encoding means further comprises:
pattern recognition means for examining said digital representations from said first encoding means and the coded representation from said second encoding means, and identifying repeating patterns.

5. The apparatus as defined in claim 4 wherein said at least one stack comprises:
in addition to said first and second color stacks a first and second color feature stacks.

6. The apparatus as defined in claim 5 wherein said first and second color feature stacks contain locations from said first and second color stacks, respectively.

7. The apparatus as defined in claim 6 wherein said predetermined scheme for rearranging locations is move up one.

8. The apparatus as defined in claim 1 wherein the relationships identified are multi-dimensional and at least one of these dimensions relates to at least one previously scanned line.

9. The apparatus as defined in claim 1 wherein said predetermined scheme for rearranging locations is move up one.

10. The apparatus as defined in claim 1 wherein said predetermined scheme for rearranging locations is move up half way.

11. The apparatus as defined in claim 1 wherein said predetermined scheme for rearranging locations is move to top.

* * * * *